United States Patent
Frasier et al.

(10) Patent No.: US 7,418,993 B2
(45) Date of Patent: Sep. 2, 2008

(54) METHOD AND APPARATUS FOR PRODUCTION OF A CAST COMPONENT

(75) Inventors: Donald J. Frasier, Greenwood, IN (US); M. Eric Schlienger, Napa, CA (US); Guy Allen Brady, Carmel, IN (US); Matthew T. Kush, Greenwood, IN (US); Patrick A. Vessely, Westfield, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 508 days.

(21) Appl. No.: 10/633,439

(22) Filed: Aug. 1, 2003

(65) Prior Publication Data

US 2004/0231822 A1 Nov. 25, 2004

Related U.S. Application Data

(60) Division of application No. 10/462,168, filed on Jun. 16, 2003, now abandoned, which is a continuation of application No. 09/444,155, filed on Nov. 20, 1999, now abandoned, and a continuation-in-part of application No. 09/322,863, filed on May 28, 1999, now abandoned.

(60) Provisional application No. 60/109,298, filed on Nov. 20, 1998.

(51) Int. Cl.
*B22D 41/00* (2006.01)

(52) U.S. Cl. ...................................... 164/335; 164/258

(58) Field of Classification Search ................. 164/66.1, 164/65, 120, 122, 136, 258, 335
See application file for complete search history.

(56) References Cited

U.S. PATENT DOCUMENTS

| | | | |
|---|---|---|---|
| 833,150 A * | 10/1906 | Attenhoper | 137/590.5 |
| 1,956,524 A | 4/1934 | Byram | |
| 1,983,580 A | 12/1934 | Nock, Jr. | |
| 2,985,929 A | 5/1961 | Carter | |
| 3,099,053 A | 7/1963 | Eliot | |
| 3,530,927 A | 9/1970 | Lejeune | |
| 3,532,154 A | 10/1970 | Balevski et al. | |
| 3,532,155 A | 10/1970 | Kane et al. | |
| 3,608,621 A | 9/1971 | Bollig et al. | |
| 3,763,926 A | 10/1973 | Tschinkel et al. | |
| 3,788,382 A | 1/1974 | Daniel et al. | |
| 3,841,384 A | 10/1974 | Tingquist et al. | |
| 3,861,457 A | 1/1975 | Py | |

(Continued)

FOREIGN PATENT DOCUMENTS

EP 0100272 7/1983

OTHER PUBLICATIONS

Horton, Robert A., "Investment Casting", PCC Airfoils, Inc., pp. 253-269.

(Continued)

*Primary Examiner*—Kevin P Kerns
(74) *Attorney, Agent, or Firm*—Krieg DeVault LLP; Matthew D. Fair, Esq.

(57) ABSTRACT

A system for producing cast components from molten metal. One form of the present invention includes a system for the precision pouring of molten metal within a casting mold. The precision pouring system is driven by a pressure differential.

31 Claims, 49 Drawing Sheets

U.S. PATENT DOCUMENTS

| | | |
|---|---|---|
| 3,888,300 A | 6/1975 | Guichard et al. |
| 4,061,176 A | 12/1977 | Carbonnel |
| 4,066,117 A | 1/1978 | Clark et al. |
| 4,114,675 A | 9/1978 | Buhrer |
| 4,121,651 A | 10/1978 | Zeppellini |
| 4,179,045 A | 12/1979 | Colombani |
| 4,200,138 A | 4/1980 | Hildebrandt |
| 4,385,751 A | 5/1983 | Saether et al. |
| 4,469,161 A | 9/1984 | Higginbotham et al. |
| 4,479,594 A | 10/1984 | Altland |
| 4,590,988 A | 5/1986 | Fukuoka et al. |
| 4,615,376 A | 10/1986 | Mori et al. |
| 4,668,288 A | 5/1987 | Ouchi et al. |
| 4,714,104 A | 12/1987 | Ouchi et al. |
| 4,813,470 A | 3/1989 | Chiang |
| 4,909,422 A | 3/1990 | Muller |
| 5,048,591 A | 9/1991 | Oti et al. |
| 5,062,468 A | 11/1991 | Monte et al. |
| 5,062,469 A | 11/1991 | Monte et al. |
| 5,111,870 A | 5/1992 | Cook |
| 5,190,674 A | 3/1993 | Monks |
| 5,244,031 A | 9/1993 | Cook et al. |
| 5,291,937 A | 3/1994 | Corderman et al. |
| 5,295,530 A | 3/1994 | O'Connor |
| 5,309,976 A | 5/1994 | Prichard et al. |
| 5,335,711 A | 8/1994 | Paine |
| 5,346,184 A | 9/1994 | Ghosh |
| 5,404,930 A | 4/1995 | Stanton et al. |
| 5,484,008 A | 1/1996 | Thompson |
| 5,509,458 A | 4/1996 | Onuma et al. |
| 5,515,906 A | 5/1996 | Thomson et al. |
| 5,551,502 A | 9/1996 | Matsubayashi et al. |
| 5,592,984 A | 1/1997 | Schmiedeknecht et al. |
| 5,607,007 A | 3/1997 | Chandley |
| 5,744,050 A | 4/1998 | Shaw |
| 5,860,468 A | 1/1999 | Cook |
| 5,894,880 A | 4/1999 | Hohenbichler |
| 5,913,358 A | 6/1999 | Chadwick |
| 5,988,257 A | 11/1999 | Hugo |
| 6,103,182 A | 8/2000 | Campbell |

OTHER PUBLICATIONS

Article entitled, "Heat is Power," Frank Colucci.

* cited by examiner

METHOD AND APPARATUS FOR PRODUCTION OF A CAST COMPONENT

CROSS REFERENCE TO RELATED APPLICATIONS

The present application is a divisional of U.S. patent application Ser. No. 10/462,168 filed Jun. 16, 2003 now abandoned which is a continuation of U.S. patent application Ser. No. 09/444,155 filed Nov. 20, 1999 now abandoned. U.S. patent application Ser. No. 09/444,155 claims, the benefit of a United States provisional application having a Ser. No. 60/109,298 that was filed on Nov. 20, 1998. Application Ser. No. 09/444,155 is a continuation-in-part of Ser. No. 09/322,863 that was filed on May 28, 1999 now abandoned. Each of the above listed applications is incorporated herein by reference.

BACKGROUND OF THE INVENTION

The present invention relates generally to a method and apparatus for the production of a cast component. More particularly, in one embodiment of the present invention, a single cast single crystal structure is formed by the directional solidification of a superalloy within a precision casting mold containing a starter seed. Although the invention was developed for casting gas turbine engine components, certain applications may be outside of this field.

The performance of a gas turbine engine generally increases with an increase in the operating temperature of a high temperature working fluid flowing from a combustion chamber. One factor recognized by gas turbine engine designers as limiting the allowable temperature of the working fluid is the capability of the engine components to not degrade when exposed to the high temperature working fluid. The airfoils, such as blades and vanes, within the engine are among the components exposed to significant thermal and kinetic loading during engine operation.

One cooling technique often utilized in a gas turbine engine component is an internal network of apertures and passageways. A flow of cooling media is passed through the internal passageways of the component, and exhausted onto the exterior surface of the component. The passage of the cooling media through the internal passageways provides for heat transfer from the component to the cooling media.

A process and apparatus are disclosed in U.S. Pat. No. 5,295,530, which is incorporated herein by reference, by which the production of a high temperature thin wall cast structure is described. The '530 patent describes a process of pouring a molten metal into a ceramic casting mold which is carried on a water-cooled chill plate within a vacuum furnace. The injection pressure of the molten metal can be varied over time so that the walls of the casting mold do not substantially distort during the process. Thereafter, the molten metal within the casting mold is directionally solidified.

Although the prior techniques can produce thin walled cast components with internal passageways and apertures, there remains a need for an improved method and apparatus for casting a component. The present invention satisfies this and other needs in a novel and unobvious way.

SUMMARY OF THE INVENTION

One form of the present invention contemplates an apparatus, comprising: a metallic seed applicable to grow at least one crystal by directional solidification of a molten metal, the starter seed has a portion for receiving the molten metal thereon and at least one internal passageway adapted for the passage of a heat transfer media.

Another form of the present invention contemplates a metallic seed crystal for the use in solidification of a molten metal to an article. The seed crystal, comprising: a metallic member having a melt end and a base end with a melt portion and a non-melt portion therebetween, the base end defines a first surface adapted to contact a heat sink to transfer heat from the member; and, the melt portion formed at the melt end and adapted for receiving molten metal thereagainst, the melt portion has an unmelted state with a cross sectional area less than the area of the first surface and a melted state wherein the melt portion has a cross sectional area substantially equal to the first surface so as not to restrict heat transfer to the base end.

Another form of the present invention contemplates an apparatus for exchanging heat with a metallic starter seed during the directional solidification of a molten metal. The apparatus, comprising: at least one member for mechanically gripping the metallic starter seed and maintaining a heat transfer path with the starter seed as the metal material solidifies; and a heat transfer sink connected with the at least one member for removing heat therefrom.

Yet another form of the present invention contemplates an apparatus, comprising: a crucible having a discharge; a vacuum furnace having the crucible positioned therein for melting metal material within the crucible; a metallic starter seed; a casting mold having an opening adapted to receive the starter seed and an internal cavity for receiving the molten metal material discharged from the discharge, the starter seed is positioned within the opening and contactable by the molten metal material received in the internal cavity; and, a heater coupled with the starter seed to selectively add energy to the starter seed during a first period, and wherein the starter seed is joined to the metal poured in the cavity and heat is withdrawn through the starter seed during the directional solidification of the metal material within the cavity.

Yet another form of the present invention contemplates an apparatus for pouring a molten metal. The apparatus, comprising: a crucible having a bottom wall member with an aperture formed therethrough; an upstanding first tube positioned within the crucible and having a first end located around the aperture and coupled to the bottom wall member and another second end that is closed, the first tube having at least one entrance for allowing the passage of molten metal from the crucible to the first tube; an upstanding second tube located within the first tube and having one end coupled to the bottom wall member and in fluid communication with the aperture and another end defining an inlet from the tube, the second tube has a first cavity adapted for receiving a volume of molten metal therein; and a passageway extending along the second tube for the passage of the molten metal from the at least one entrance to the inlet.

Yet another form of the present invention contemplates, a method for pouring molten metal into a casting mold within a furnace. The method, comprising: providing a crucible with a discharge aperture and a pour assembly located within the crucible, the pour assembly including an upstanding outer tube positioned around an upstanding inner tube, the inner tube is in fluid communication with the discharge aperture; melting a metal material within the crucible to a liquid state; flowing the liquid state metal from the crucible into a cavity defined between the outer tube and the inner tube; overfilling the cavity so that liquid state metal flows into and fills the inner tube; stopping the filling of the inner tube; and discharging the liquid state metal from the inner tube.

Yet another form of the present invention contemplates an apparatus for pouring a molten metal. The apparatus, comprising: a mechanical housing with a bottom wall member and an interior volume adapted to hold a molten metal; and a molten metal delivery member having a first molten metal inlet end adapted to receive molten metal from below the surface of the molten metal within the interior volume and a second molten metal outlet end with a passageway therebetween, at least a portion of the delivery member positioned within the mechanical housing, the passageway has a first passageway portion and a second passageway portion and a inflection portion wherein the direction of molten metal flow changes, in a first discharge mode a first direction of molten metal flow within the first passageway portion is from the molten metal inlet to the inflection portion and from the inflection portion through the second passageway portion in a second direction to said outlet.

Yet another form of the present invention contemplates a casting mold, comprising: a free form fabricated ceramic shell, the ceramic shell having a thin first outer wall defining a cavity therein that is adapted for receiving a molten metal; a container having a second outer wall with an inner surface, wherein the shell is positioned within the container and spaced from the inner surface; and at least one support member substantially filling the space between the first outer wall and the inner surface and reinforcing said shell.

Yet another form of the present invention contemplates a a method, comprising: providing a mold having an internal cavity adapted for the receipt of molten metal therein, the cavity has a top portion, bottom portion and side portion, insulating the ceramic shell to minimize heat transfer through said side portion; placing the mold within an environmental control chamber; filling the cavity with molten metal to form a casting defined by the cavity; and directionally solidifying the molten metal within the mold by withdrawing energy from one end of the casting.

Yet another form of the present invention contemplates a method, comprising: providing a casting mold having a plurality of layers of a material bonded together to define a cavity for receiving a molten metal material therein and an exit in communication with the cavity; orienting the casting mold at an inclination; rotating the casting mold to free any material located within the cavity and not bonded to one of the plurality of layers of material; and passing the material located within the cavity out of the cavity and through the exit.

Yet another form of the present invention contemplates a method, comprising: building a integral ceramic casting mold shell by a free form fabrication technique, the casting mold shell has an internal cavity adapted to receive a molten metal; reinforcing the ceramic casting mold shell; positioning a metallic starter seed within the ceramic casting mold shell, the metallic starter seed is positioned to receive molten metal therein; filling the internal cavity with molten metal; and withdrawing heat through the metallic starter seed to directionally solidify the molten metal within the internal cavity.

One object of the present invention is to provide a unique system for production of a cast component.

Related objects and advantages of the present invention will be apparent from the following description.

DESCRIPTION OF THE PREFERRED EMBODIMENTS

Figure 1:
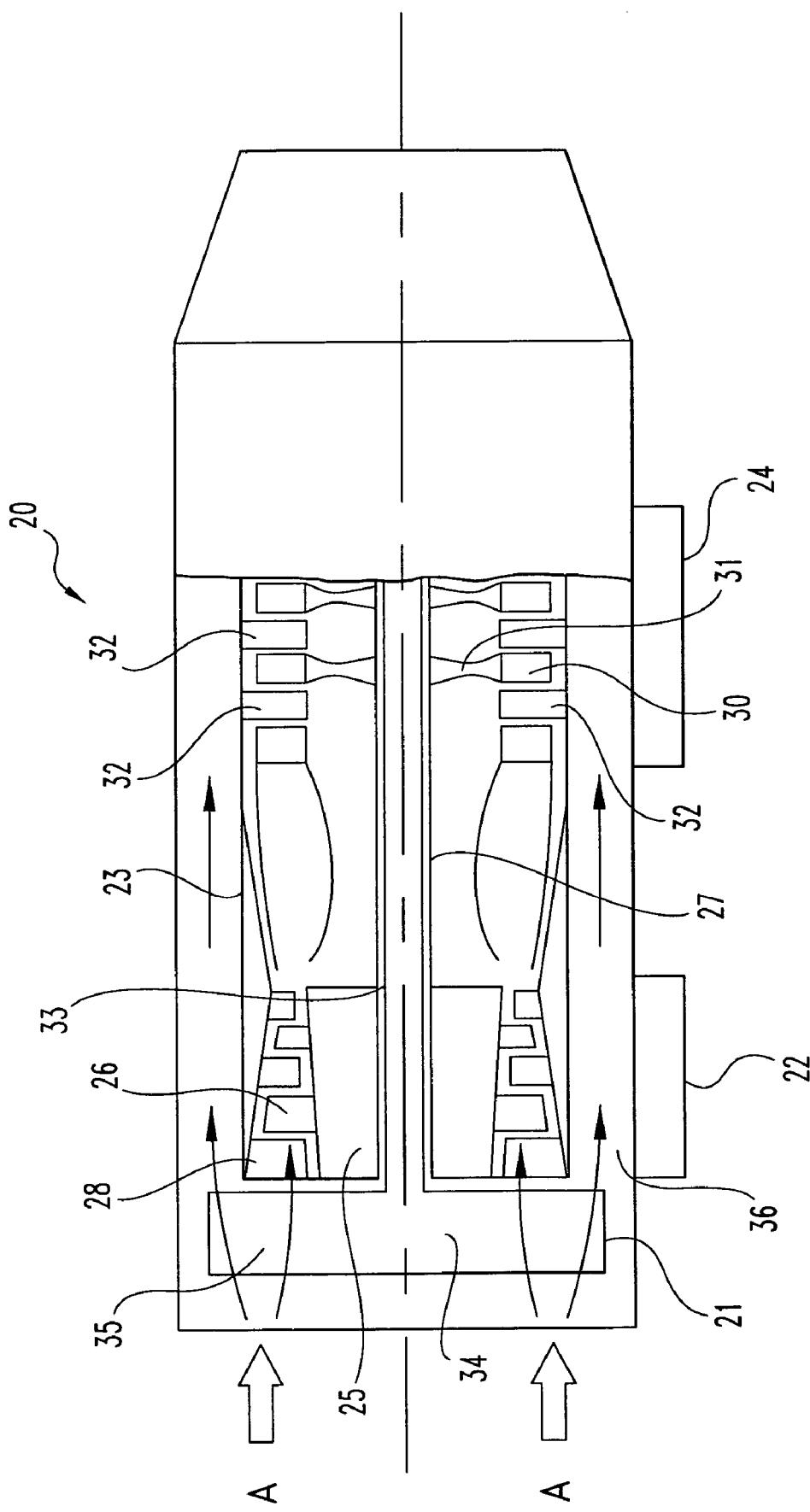
FIG. 1 is an illustrative view of a gas turbine engine.
Figure 2:
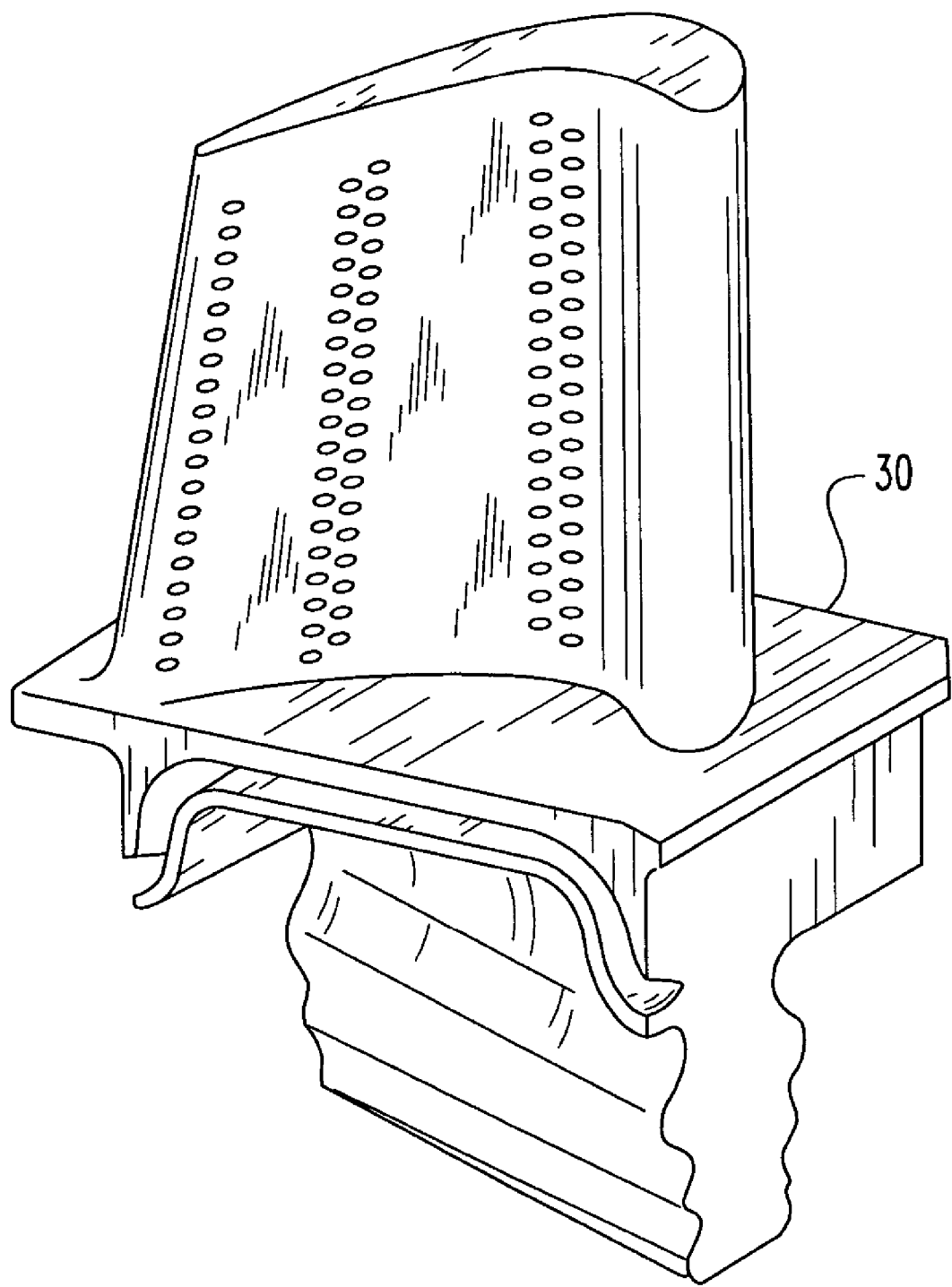
FIG. 2 is a perspective view of a gas turbine engine blade within the FIG. 1 gas turbine engine.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring to FIG. 1, there is illustrated a gas turbine engine 20 which includes a fan section 21, a compressor section 22, a combustor section 23, and a turbine section 24 that are integrated together to produce an aircraft flight propulsion engine. This type of gas turbine engine is generally referred to as a turbo-fan. One alternate form of a gas turbine engine includes a compressor, a combustor, and a turbine that have been integrated together to produce an aircraft flight propulsion engine without the fan section. The term aircraft is generic and includes helicopters, airplanes, missiles, unmanned space devices and any other substantially similar devices. It is important to realize that there are a multitude of ways in which the gas turbine engine components can be linked together. Additional compressors and turbines could be added with intercoolers connecting between the compressors and reheat combustion chambers could be added between the turbines.

A gas turbine engine is equally suited to be used for an industrial application. Historically, there has been widespread application of industrial gas turbine engines, such as pumping sets for gas and oil transmission lines, electricity generation, and naval propulsion.

The compressor section 22 includes a rotor 25 having a plurality of compressor blades 26 coupled thereto. The rotor 25 is affixed to a shaft 27 that is rotatable within the gas turbine engine 20. A plurality of compressor vanes 28 are positioned within the compressor section 22 to direct the fluid flow relative to blades 26. Turbine section 24 includes a plurality of turbine blades 30 that are coupled to a rotor disk 31. The rotor disk 31 is affixed to the shaft 27, which is rotatable within the gas turbine engine 20. Energy extracted in the turbine section 24 from the hot gas exiting the combustor section 23 is transmitted through shaft 27 to drive the compressor section 22. Further, a plurality of turbine vanes 32 are positioned within the turbine section 24 to direct the hot gaseous flow stream exiting the combustor section 23.

The turbine section 24 provides power to a fan shaft 33, which drives the fan section 21. The fan section 21 includes a fan 34 having a plurality of fan blades 35. Air enters the gas turbine engine 20 in the direction of arrows A and passes through the fan section 21 into the compressor section 22 and a bypass duct 36. The term airfoil will be utilized herein to refer to fan blades, fan vanes, compressor blades, turbine blades, compressor vanes, and turbine vanes unless specifically stated otherwise in the text. Further details related to the principles and components of a conventional gas turbine engine will not be described herein as they are believed known to one of ordinary skill in the art.

Figure 3:
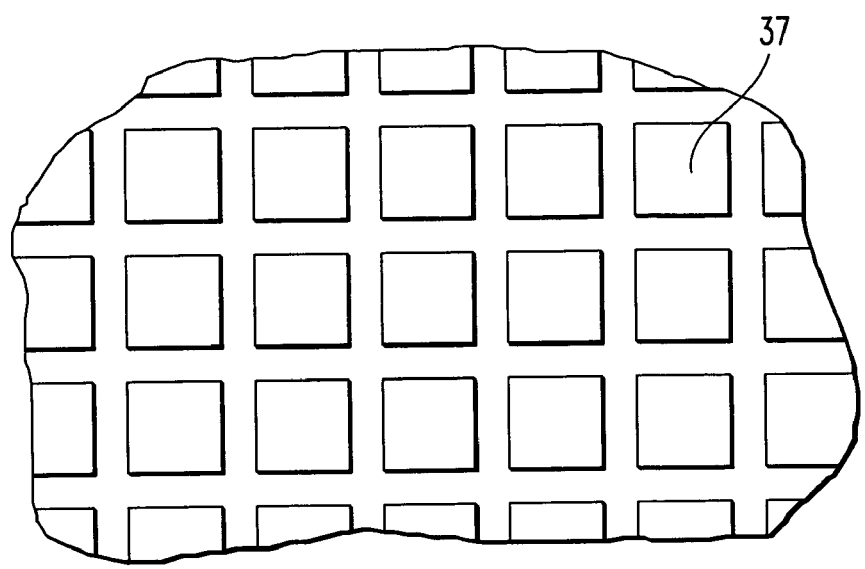
FIG. 3 is a plan view of one embodiment of an internal cooling passageway comprising a portion of the FIG. 2 gas turbine engine blade.

With reference to FIGS. 2-7, there are illustrated examples of cast components that could be produced from a casting mold system of the present system. The present disclosure is not intended to be limited to the examples set forth in FIGS. 2-7, unless specifically set forth herein. More specifically, with reference to FIG. 2, there is illustrated a gas turbine engine blade 30. In one embodiment, the gas turbine engine blade 30 defines a single cast article having an internal flow path for the passage of cooling media. The internal cooling path includes a passageway with a plurality of heat transfer pedestals 37. In one embodiment, the plurality of pedestals 37 are integrally formed between a pair of spaced walls. The pedestals are representative of the types of details that can be produced with the casting mold systems of the present invention. It is understood herein that the shape, size, and distribution of the cooling pedestals are a function of heat transfer parameters and design specific parameters. The FIG. 3 illustration is utilized herein merely to represent that pedestals having the following dimensions are more particularly contemplated, and the dimensional sizes of one embodiment of the channels and pedestals are set forth in Table 1. However, it is understood that other pedestal and channel sizes and geometry's are contemplated herein.

TABLE 1

| Length | Width | Height |
| --- | --- | --- |
| | PEDESTAL | |
| 0.020-.050" | 0.020-.050" | 0.012-.020" |
| | CHANNEL | |
| N/A | 0.012-.020" | 0.012-.020" |

Figure 4:
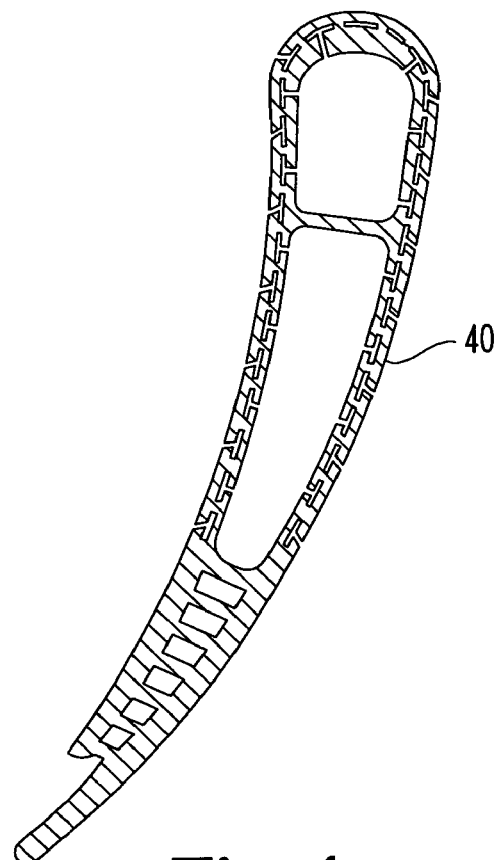
FIG. 4 is a cross section of one embodiment of a cast airfoil having a thin outer wall.
Figure 5:
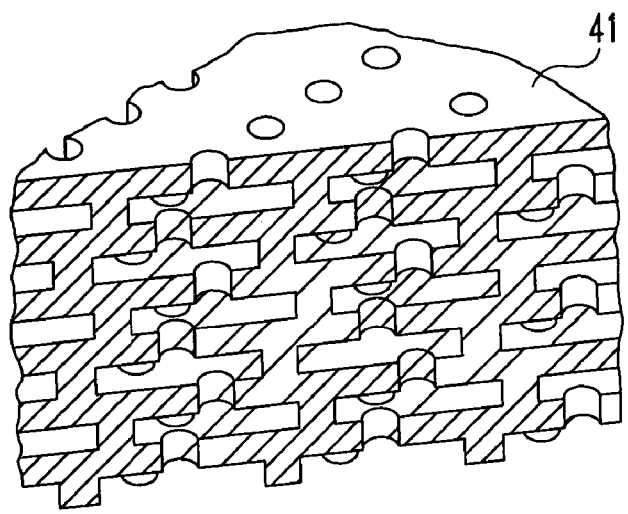
FIG. 5 is an illustration of one embodiment of a cast multi-wall structure.
Figure 6:
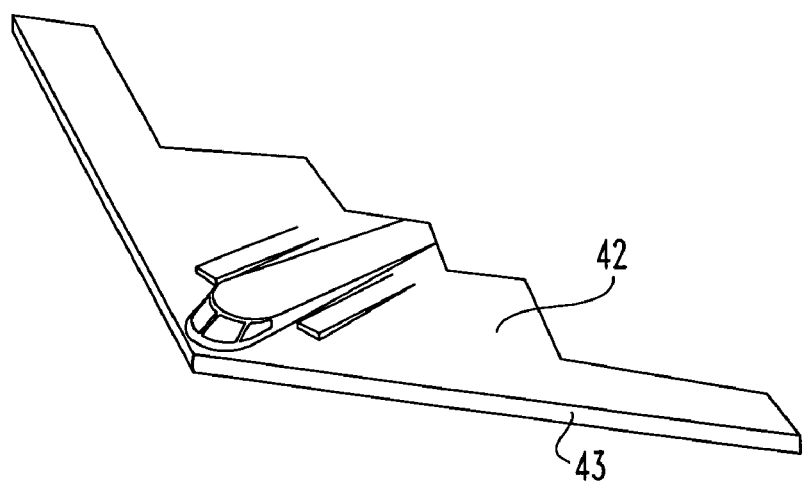
FIG. 6 is an illustration of one embodiment of an atmospheric air/spacecraft having a leading edge made with a process according to one aspect of the present invention.
Figure 7:
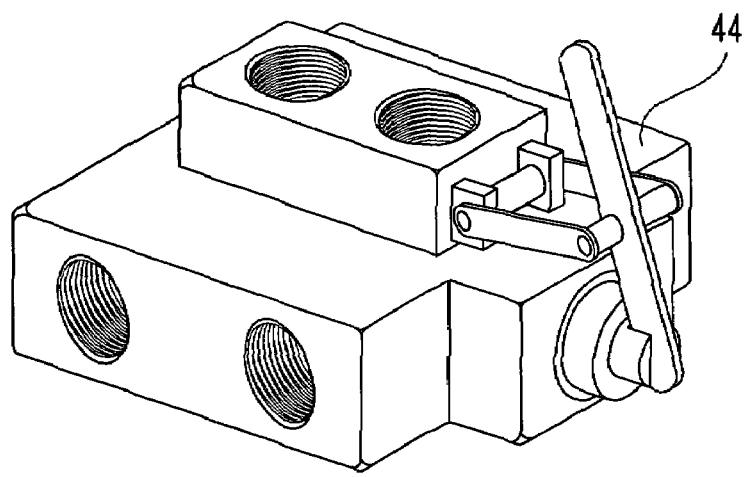
FIG. 7 is an illustration of one embodiment of a cast valve body.

Referring to FIGS. 4 and 5, there is illustrated a sectional view of one embodiment of a single piece multi-wall gas turbine engine component producible by the present system. Further, FIG. 6 illustrates the leading edge 43 of a spacecraft 42, which is producible with the system of the present invention. While in FIG. 7 there is illustrated a hydraulic valve body 44 with internal fluid flow circuitry that depicts another example of the types of cast products that could be produced with the present system. The products illustrated herein are not intended to be limiting and other cast products are contemplated for production by the present system including, but not limited to art, jewelry, dental prosthesis, general prosthesis, custom hardware, golf club heads, propellers, electronic packaging, tubes, valves and other items that have been traditionally investment cast for precision tolerance and/or detail.

The methods and apparatuses of the present invention may be utilized to produce single piece single cast components or multi piece cast components having microstructures that are commonly categorized as equiaxed, directionally solidified or single crystal. The preferred casting mold system of the present invention is suitable for producing virtually any type of cast metallic product, however in a more preferred embodiment it is particularly useful for producing thin walled single crystal structures. The cast structures may have many different shapes, sizes, configurations, and can be formed of a variety of metallic materials. For example, the system of the present invention allows the casting of multi-wall structures with at least one wall having a thickness less than about 0.03 inches. Further, in a preferred embodiment there can be formed very thin passageways within the cast structure/component and in a more preferred embodiment the very thin passageways having a width of about 0.005 inches to about 0.015 inches. However, casting having passageways and wall thickness of other widths and/or sizes and/or thickness are contemplated herein.

Gas turbine engine components are preferably formed of a superalloy composition material. There are various types of superalloy compositions, such as but not limited to nickel based or cobalt based compositions, and the manufacture of such compositions are generally known to those skilled in the art. Most superalloy compositions of interest are complicated mixtures of nickel, chromium, aluminum and other select elements.

Figure 8:
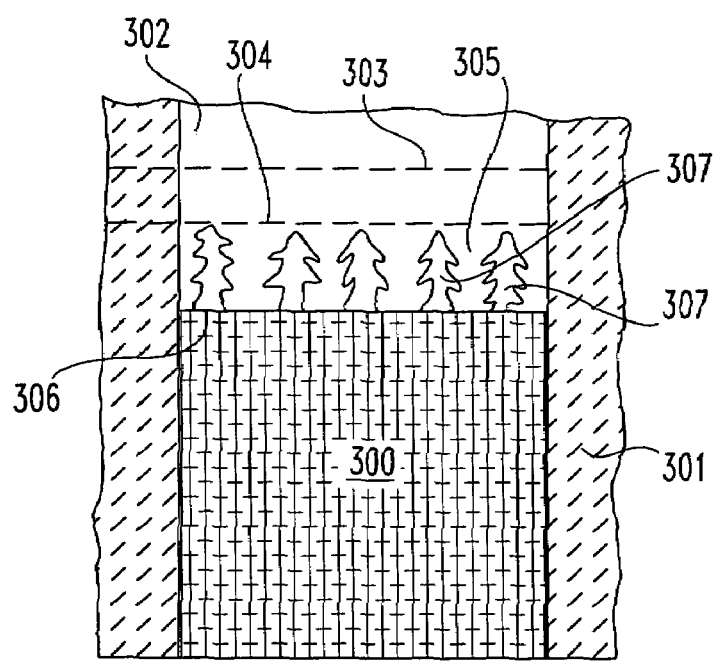
FIG. 8 is an illustration of the growth of dendrites from a starter seed.

With reference to FIG. 8, there is illustrated the controlled solidification of molten metal from a starter seed 300. The controlled solidification of the molten metal is preferably used to produce products having a columnar grain or a single crystal microstructure. More specifically, the controlled solidification of the molten metal is accomplished by the directional solidification of the molten metal. Directional solidification involves moving a solidification interface progressively through a casting mold 301 filled with molten metal. In many circumstances, the metallic starter seed 300 is used to impart strictly oriented crystallographic structure to the crystal being grown. The metallic starter seed 300 is placed within the casting mold 301 and the introduction of the molten metal 302 into the mold 301 causes the starter seed to melt back from an original surface 303 to a surface defined as the liquidus interface 304. In one form of the present invention, the melt back of the starter seed forms a puddle of liquid molten metal from the starter seed. In one embodiment the depth of the puddle is about 0.050 inches, however other puddle depths are contemplated herein. A solidification zone 305 is positioned between the liquidus interface 304 and a solidus interface 306. As the thermal gradient moves vertically through the molten metal 302 in the mold 301, the material solidifies through the growth of dendrites 307 and the solidification of the matrix material. In a single crystal process the molten material solidifies epitaxially from the unmelted portion of the seed 302.

Figure 9:
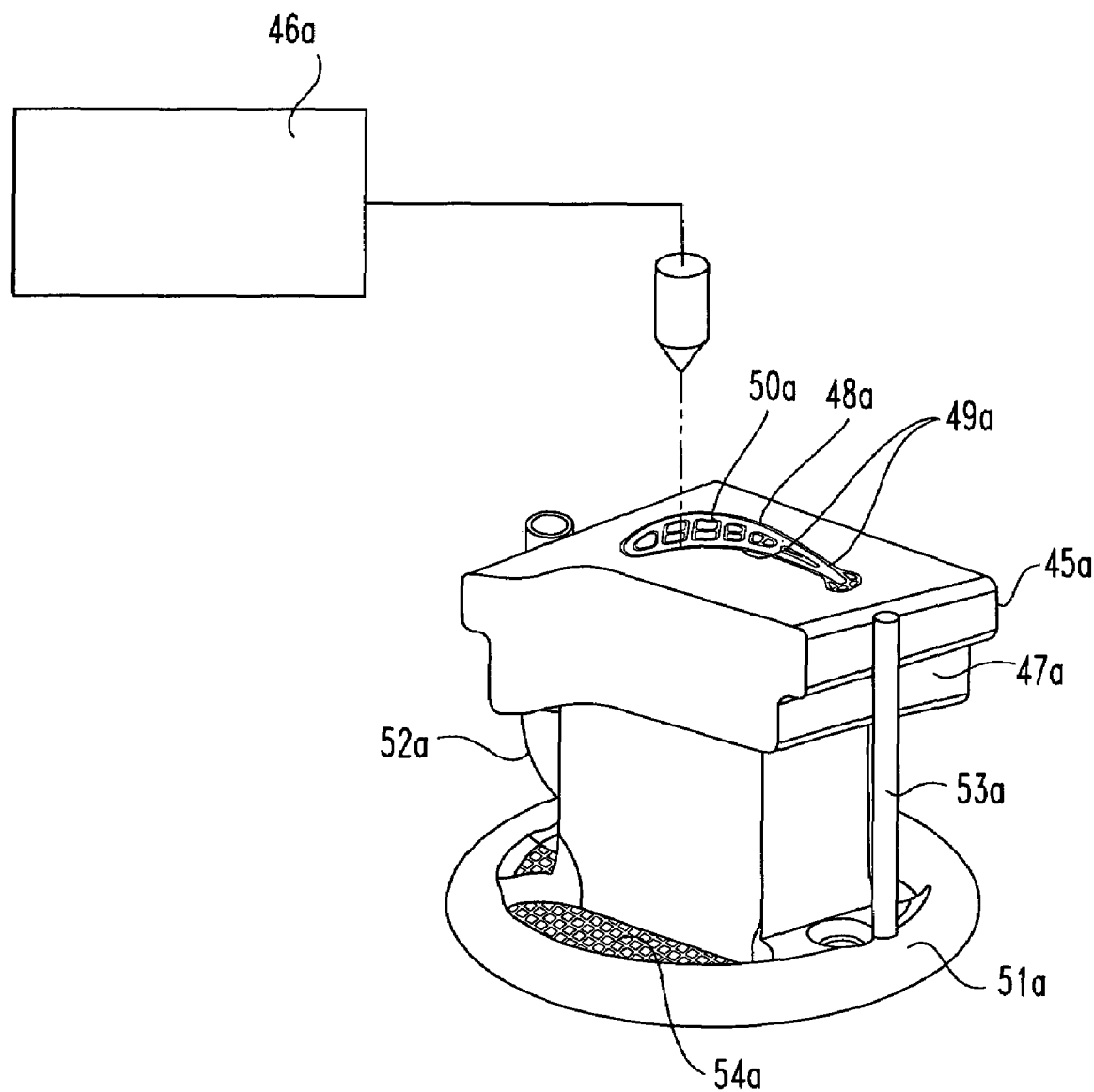
FIG. 9 is an illustrative view of a portion of a casting mold according to one embodiment of the present invention.

With reference to FIG. 9, there is illustrated an integral mold 45a for receiving molten metal therein. In one embodiment the mold 45a is formed by a free form fabrication technique generally known as three-dimensional printing. In three-dimension printing systems a ceramic material is deposited in layers to form a direct ceramic casting mold. The density of the layers can be varied by the number of dots per inch of material deposited. Information related to three-dimensional printing techniques is disclosed in U.S. Pat. Nos. 5,340,650, 5,387,380, and 5,204,055. A commercially available system for three-dimensional printing is available from Soligen Technologies, Inc. of North Ridge, Calif.

Integral mold 45a is formed by the layerwise printing and binding of ceramic material, with each layer being bonded to an adjacent layer to form a ceramic shell for receiving molten metal therein. An apparatus 46a deposits the layers of material and binder to form the integral mold 45a based upon a design file. It is preferred that the design file be generated from a computer aided design of the component. Preferably, mold 45a is a thin walled shell having a main body 47a with an internal cavity for receiving molten metal to define a component upon solidification. A portion of the internal metal receiving cavity is depicted at 48a. The integral mold 45a includes a plurality of thin walls 48a, internal mold cores 50a, and the internal metal receiving cavity. In one embodiment, the thin wall 49a has a thickness in the range of about 0.005 inches to about 1.50 inches, and more preferably the thin wall has a thickness of less than about 0.040 inches, and most preferably is about 0.020 inches. Integrally formed with the main body 47a are a bottom support member 51a, a fill tube 52a, a support member 53a, and a wall member 54a. In a preferred embodiment, the wall member 54a is defined by a web structure. Other integral mold styles are contemplated herein and the present invention is not intended to be limited to the specific mold configuration and or material of FIG. 9.

Figure 10:
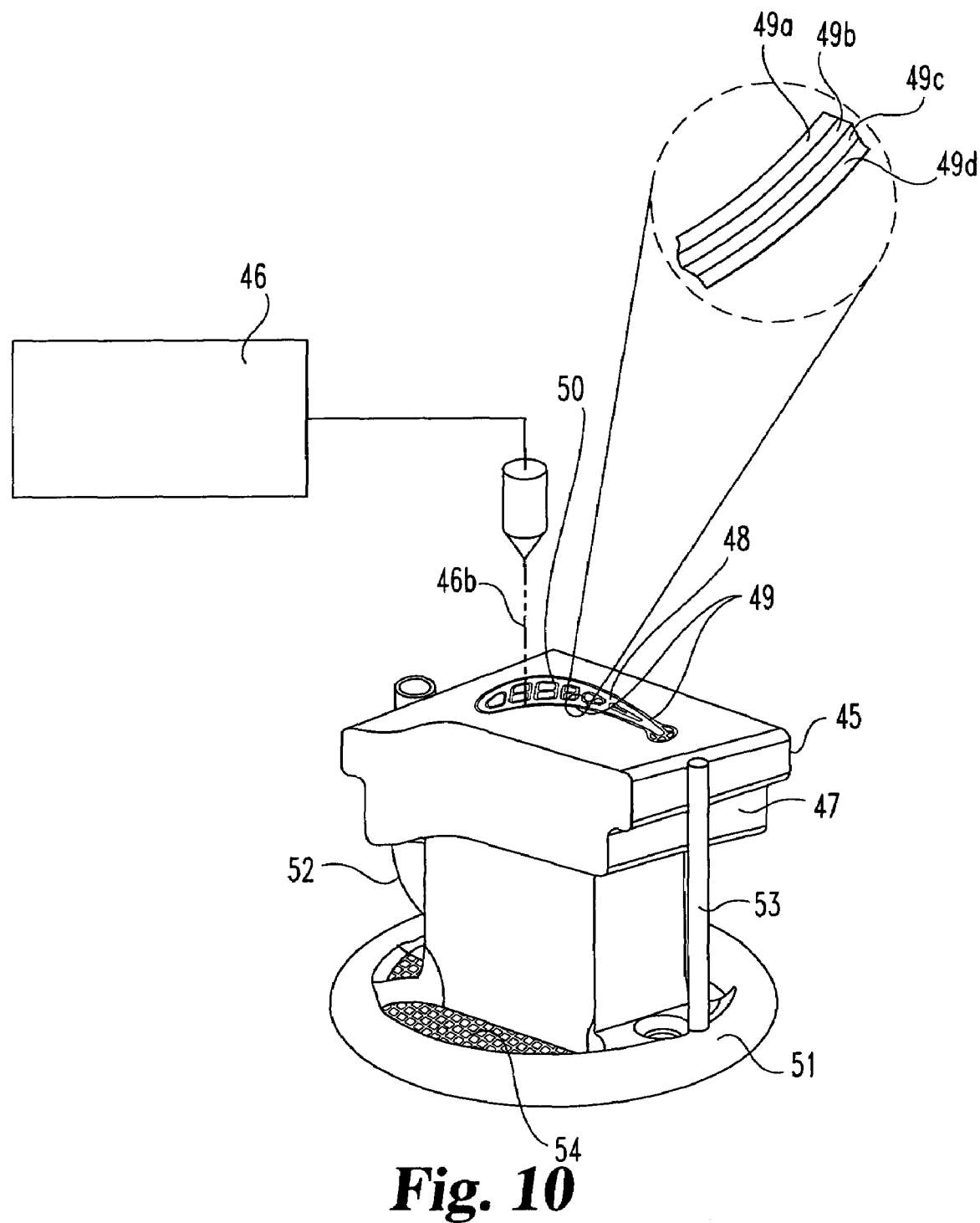
FIG. 10 is an illustrative view of a portion of a casting mold according to another embodiment of the present invention.
Figure 11:
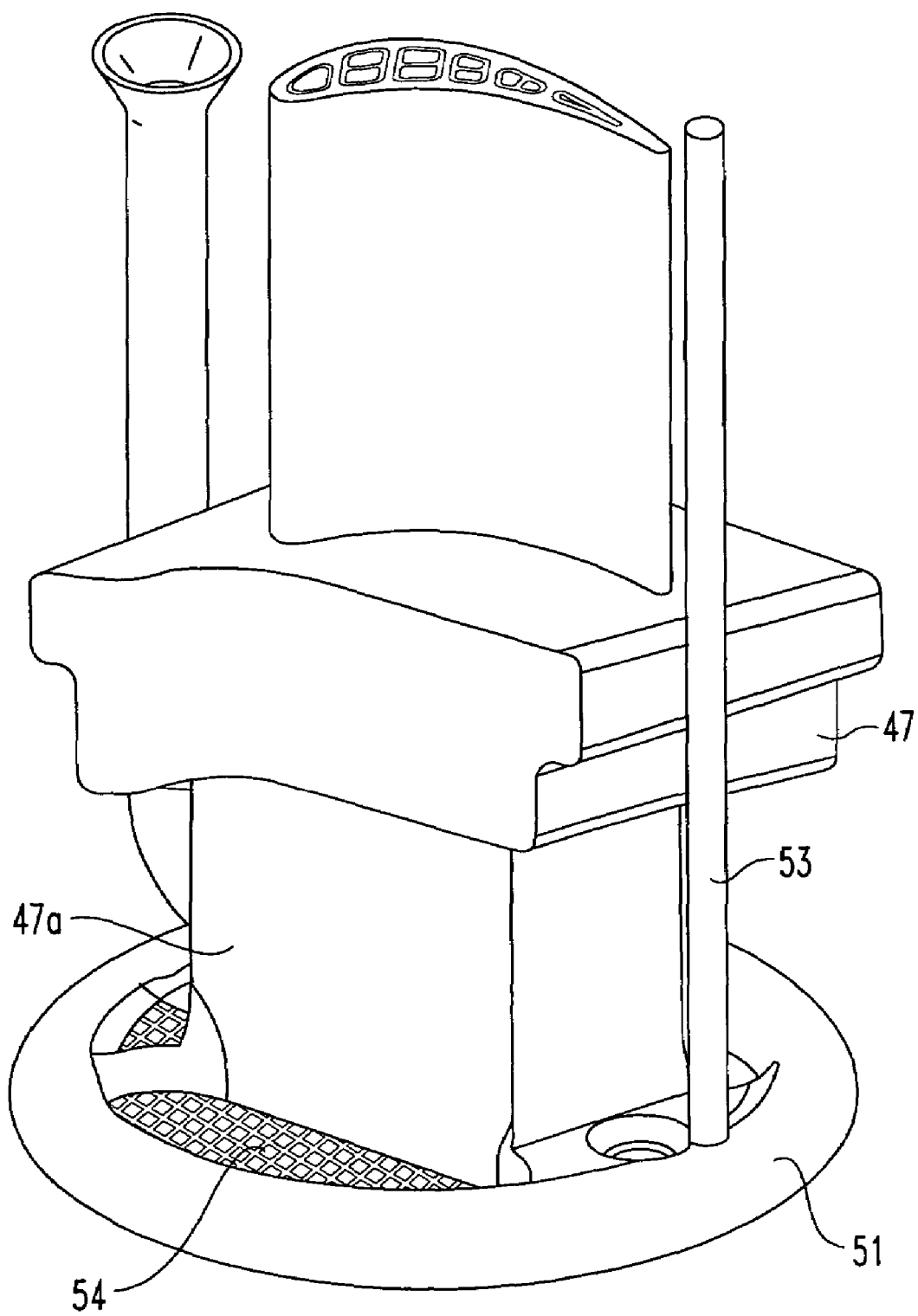
FIG. 11 is an illustrative view of the casting mold of FIG. 10 upon the substantial completion of the build cycle.

With reference to FIGS. 10 and 11, there is illustrated one embodiment of a casting mold system 45 for receiving molten metal therein. The casting mold system 45 has a shell mold and cores produced integrally from a photocurable ceramic resin, however the present invention is not limited to integral casting molds. More particularly, in another embodiment a non-integral casting mold system has a separable core(s) and shell mold formed from the photocurable ceramic resin; the components are subsequently mechanically coupled to form a casting mold system. The mold 45 is formed by a free form fabrication technique generally known as selective laser activation (SLA). Selective laser activation is based upon a stereolithography process that utilizes liquid resins that solidify when exposed to an energy dose. In the present invention a photocurable ceramic filled resin has at least one monomer that is polymerized by the energy dose to form a polymer binder holding the ceramic particles together. The energy dose can be delivered by any of a plurality of energy sources known to those skilled in the art. Preferably, the energy dose is defined by electromagnetic radiation, and more preferably the energy dose is an ultraviolet light emitted from a laser source having a wavelength of about 260 to 380 nanometers, and most preferably is about 350 nanometers. However, light of other wavelengths is contemplated herein. Commercially available machines for selective laser activation are available from 3D systems of Valencia, Calif. Further information related to selective laser activation and stereolithography is disclosed in U.S. Pat. Nos. 5,256,340, 5,556,590, 5,571,471, 5,609,812 and 5,610,824, which are incorporated herein by reference.

Integral mold 45 is formed by photopolymerization of the ceramic filled resin into layers of ceramic particles that are held together by a polymer binder. However, the present invention is not limited to a ceramic filled resin and one alternate embodiment includes a metallic filled resin. Further, the utilization of other fillers are contemplated herein. In one embodiment a wall member layer is defined by a plurality of adjoining portions of ceramic material that are indicated schematically as lines 49a, 49b, 49c, and 49d. It is understood herein that the number of adjoining lines in a layer and the number of layers in the figure is purely representative and is not intended to be limiting herein. Preferably, an individual layer of the wall member is formed of between one and about five lines drawn by the energy beam in the ceramic resin. More preferably, an individual layer of the wall member is formed of two lines drawn by the energy beam in the ceramic resin. However, the present invention contemplates individual layers having other numbers of individual lines in a layer.

While the wall member layers have been illustrated as being formed of lines it is understood that in alternate embodiment the wall member is formed of layers of spaced dots, and/or linked dots. The lines as defined above for 49a, 49b, 49c and 49d could also be formed by a series of dots. The series of dots are spaced relative to one another to define a layer, and a plurality of layers is arranged to define a wall member. In one embodiment the wall member has a grid structure of spaced dots that can contain the molten metal poured into a casting mold. Further, in another embodiment the grid structure can contain the molten metal poured into the casting mold while allowing the venting of gases from the internal cavity in the mold through the wall member.

The width of the individual line(s) forming the layers is determined by the width of the energy beam, and more preferably a laser defines the energy beam. In one embodiment the width of energy beam is preferably in the range of about 0.005 inches to about 0.025 inches and more preferably is about 0.008 inches. However, an energy beams having a width of about 0.001 inches is contemplated herein for producing very fine detail in the casting mold system. Further, the ability to vary the width/size of the energy beam on command is also contemplated herein. More specifically, in one embodiment the size of the energy beam is variable within a specific layer and/or between layers within the component. In one commercially available stereolothography apparatus (SLA 250 from 3D Systems) the laser source is a He/Cd laser with 30 m watts of power at the surface of the ceramic resin. However, other stereolithography devices having different laser sources are contemplated herein.

Figure 12:
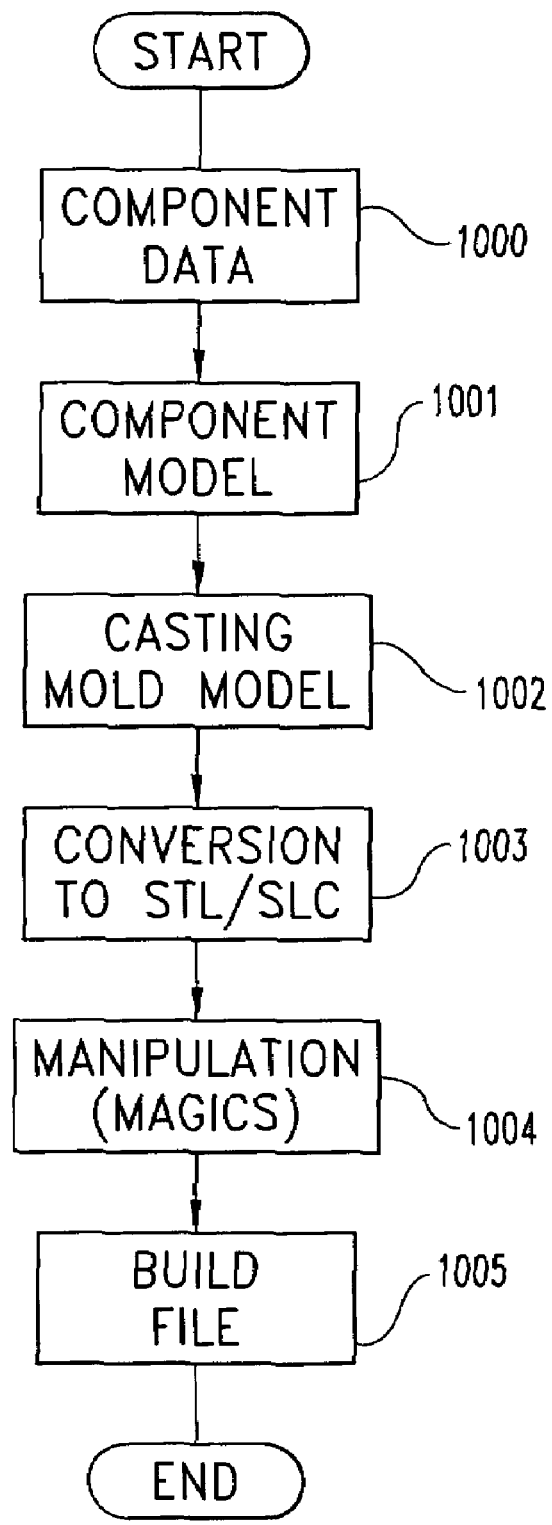
FIG. 12 is a flow chart of one embodiment of a method for creating a build file for a casting mold system.

The generation of the casting mold system 45 is controlled by a data file that defines the three dimensional shape of the casting mold system. With reference to FIG. 12, there is illustrated one embodiment of a system for creating the build file 1005 that determines how the casting mold system is created. In act 1000 data defining parameters of the component (example a gas turbine blade) is collected and processed to define a specification for the component design. The data from act 1000 is utilized in act 1001 to construct a component model using a computer modeling system, and in one embodiment the computer modeling system is defined by a ComputerVision (CV) product. However, other modeling systems are contemplated herein. The computer aided design model from act 1001 is processed in a mold modeling act 1002 to create a model of the casting mold system. In one preferred embodiment the model of the casting mold system is created by a Unigraphics system in act 1002. A conversion act 1003 is utilized to convert the mold model, produced in act 1002, of the casting mold system to a specific file format, such as STL or SLC. Next the file from act 1003 is processed in act 1004 to create discrete two dimensional slices appropriate for drawing the layers of the casting mold system and any required supports. In act 1005 the build file is completed which will drive the energy source in the stereolithography apparatus and produce the casting mold system.

In a preferred embodiment a scanning laser beam 46b is directed by a computer reading the data file and giving instructions to draw cross-sections of the three-dimensional shape on the quantity of ceramic filled resin to so as locally polymerize the monomer within the ceramic filled mixture. The irradiation of the monomer mixture with the laser forms a solid polymer gel. The integral mold 45 is preferably a thin shell having a main body 47 with an internal cavity for receiving molten metal therein for solidification to a product. A portion of the internal metal receiving cavity is depicted at 48. The integral mold 45 includes thin walls 49, internal mold cores 50, and an internal metal receiving cavity. In one preferred form the thin wall 49 has a thickness less than about 0.060 inches, and more preferably has a thickness in the range of about 0.015 inches to about 0.060 inches, and most preferably has a thickness of about 0.020 inches. However, casting molds having other wall thickness are contemplated herein. In one preferred casting mold there is formed with the main body 47, a bottom support member 51, a fill tube 52, a support member 53, and a wall member 54. In the one preferred embodiment, the wall member 54 is defined by a web structure. The illustrated casting mold of FIG. 10, is purely representative of the types of casting molds that can be fabricated with the present invention. More particularly, other casting mold configurations are contemplated herein and the present invention is not intended to be limited to the specific mold shown in FIGS. 10 and 11.

Figure 13:
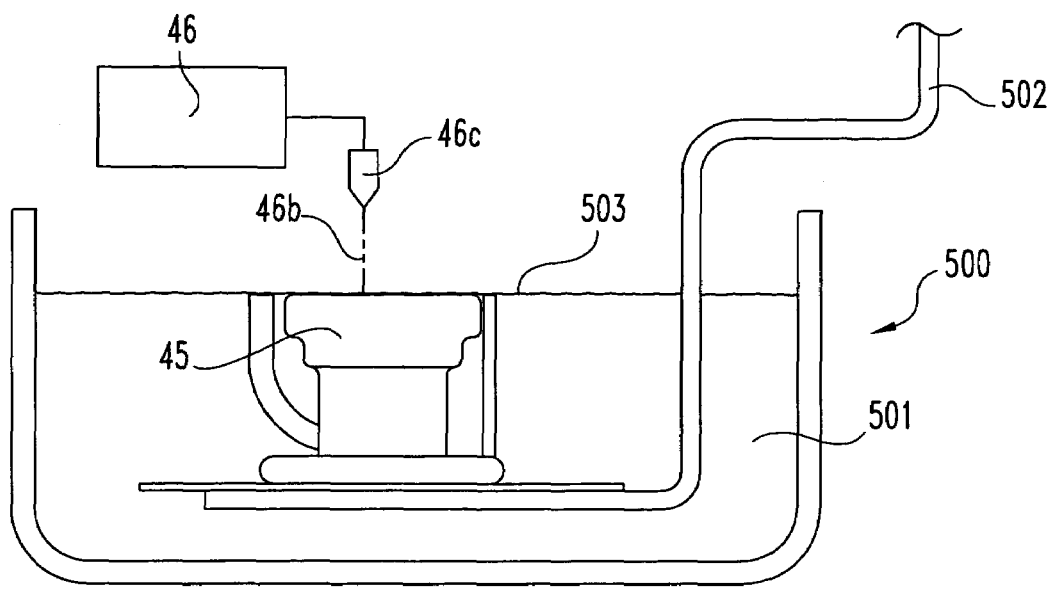
FIG. 13 is an illustrative view of the casting mold of FIG. 10 being fabricated by a stereolithography process.

With reference to FIG. 13, there is illustrated the casting mold system 45 being fabricated within a stereolithography apparatus 500. The stereolithography apparatus 500 is believed generally known by one of ordinary skill in the art and has been shown greatly simplified to facilitate explanation of the method of making the casting mold system. A fluid containment reservoir 501, elevation-changing member 502, and the laser 46c comprise a portion of the stereolithography apparatus 500. The reservoir 501 is filled with a quantity of the photocurable ceramic filled resin from which the mold system 45 is fabricated.

In a preferred form of the present invention the elevation-changing member 502 defines an elevator moveable to immerse the previously cured layers of the casting mold system 45 in the ceramic filled resin to a predetermined depth. The ceramic filled resin recoating the uppermost cured layer with a layer of uncured ceramic filled resin. In a more preferred embodiment the elevator is a computer controlled device that incrementally lowers the fabricated casting mold in the bath of ceramic filled resin in coordination with the rest of the process. In one embodiment, the nominal thickness of the uncured resin coating is about 0.004 inches to about 0.010 inches, and more preferably is about 0.004 inches. However, other layer thickness are contemplated herein. Further, the thickness of the individual layer can be made to vary between layers, or held to a substantially similar thickness between layers. It is preferred that the system have provisions to insure a substantially uniform recoat thickness for those resins with a rather low viscosity. The utilization of the following techniques are contemplated to level the resin: a time delay to allow the resin to self level; and/or ultrasonic processing to assist the resin in leveling; and/or a mechanically assisted process to assist the resin in leveling. The laser beam 46b is driven by the data in the three-dimensional data file to draw cross-sections of the casting mold on the photocurable ceramic filled resin. The drawing and recoating acts are continued until the green ceramic part has been completed.

Figure 14:
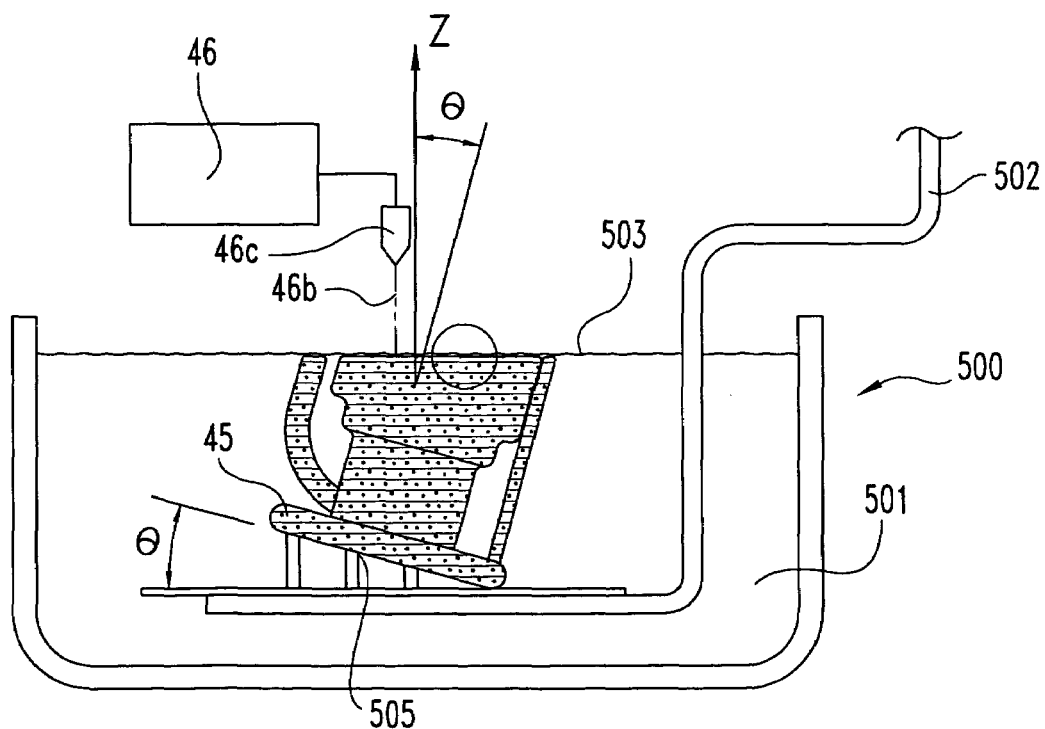
FIG. 14 is an illustrative view of the casting mold of FIG. 10 with the boundaries defining the layers of the layered build structure amplified.

With reference to FIG. 14, there is illustrated a casting mold system 45 being fabricated in the stereolithography apparatus 500 at a build orientation angle θ. The build orientation angle θ is selected so that the tangent of the angle for a given planar or near planar surface (or the collection of solid surfaces) to be built is maximized. The build orientation angle θ is measured from an axis Z extending substantially perpendicular to the surface 503 of the ceramic resin filled reservoir. One form of the present invention orients the cross sections to minimize the drawing of relatively large uninterrupted planar surfaces on the ceramic filled resin. The cross sections are defined and drawn substantially perpendicular to the axis Z and substantially parallel with the surface 503 of the resin. A build platform 505 is constructed within the reservoir 501 at the angle θ to orient the fabrication of the casting mold system 45 at the build orientation angle θ. In the preferred embodiment the build orientation angle θ is an acute angle, and more preferably is an acute angle within a range of about 10 degrees to about 45 degrees, and most preferably is about 45 degrees.

In simple two dimensional shapes the build orientation is relatively easy to define; for example a hollow cylinder would be preferably built by fabricating a plurality of rings on each other. A hollow rectangular tube would be preferably built by fabricating a plurality of rectangular sections on each other to avoid having to build a relatively large unsupported ceiling. A complex shape, like a cored casting mold system for a gas turbine engine blade, requires an analysis of all the ceramic surfaces to calculate an optimum build orientation.

Figure 15:
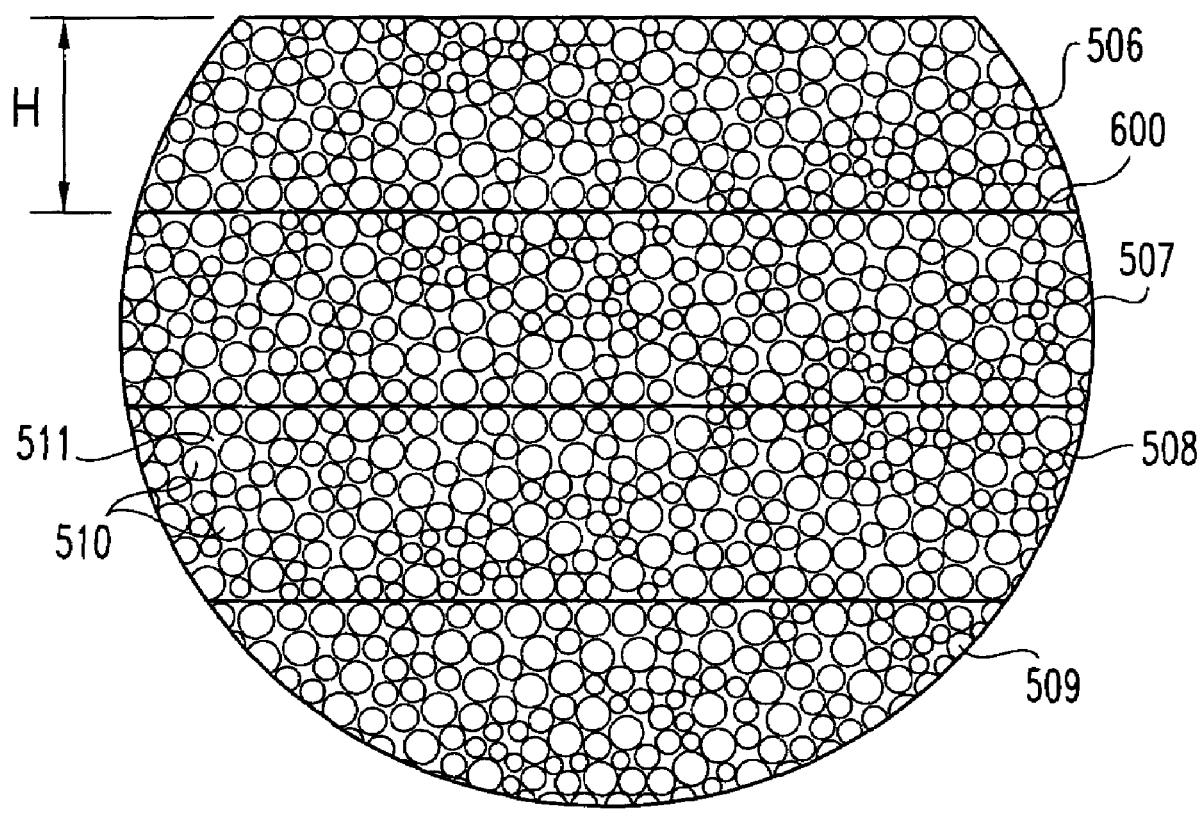
FIG. 15 is an enlarged illustrative view of a portion of the layered build structure of FIG. 14.

With reference to FIG. 15, there is illustrated an enlarged view of a plurality of cured layers 506, 507, 508 and 509 defining a portion of the casting mold system 45. The cured layers in a preferred alumina filled resin have a thickness within a range of about 0.002 inches to about 0.008 inches, and more preferably have a thickness of about 0.004 inches. The cured layers in a preferred silica filled resin have a thickness within a range of about 0.002 inches to about 0.020 inches, and more preferably have a thickness of about 0.006 inches. However, other cured thickness are contemplated herein. Further, the individual cured layers can be of the same or different thickness. However, it is preferred that each of the individual curved layer have a substantially uniform thickness.

The particle size for the individual ceramic particles 510 are preferably less than about 20 microns, and more preferably are within a range of about 0.1 microns to about 3.0 microns. The control of the particle size allows for the fabrication of finer detail and substantially smooth surfaces in comparison to other known techniques for making ceramic casting mold systems.

The casting mold system is a layered built structure and FIGS. 14 and 15 have been exaggerated to emphasize the individual cured layers. The individual layers are formed of a plurality of ceramic particles 510 and a polymer binder 511 that holds the particles within an individual layer together. In one embodiment the polymer binder 511 extends between the adjacent layers to couple the cured layers together. Each of a pair of adjacent cured layers, such as layers 506 and 507 have a respective cross-sectional area abutting at a layer line 600. In a preferred embodiment there is joining between the complimentary surfaces of the adjacent layers in the range of about 10% to about 100% of each of the respective surfaces. More preferably, in one embodiment of the silica filled resin there is joining between the complimentary surfaces of the adjacent layers at about 10 percent of the respective surfaces; and in one embodiment of the alumina filled resin there is joining between the complimentary surfaces of the adjacent layers at about 50 percent of the respective surfaces. However, in some alternate embodiments, the adjacent cured layers are not joined together by the polymer binder. The layers are held one against the other by mechanical and/or secondary chemical reactions.

The thickness of the layers depends upon the thickness of the recoated uncured layer and the depth of penetration of the laser beam. More specifically the cure depth is indicated as the cured layer thickness plus an overcure depth. In one embodiment the overcure depth is about 50% of the cured thickness layer directly beneath the layer being cured. In one embodiment a substantial overcure is required in the alumina filled resin to minimize the subsequent green delamination or layer separation. However, embodiments of the present invention utilize an overcure cure depth within a range of about 10% to about 150% of the cured layer. However, the present invention is not limited to the above cure depths and other cure depths are contemplated herein.

The ceramic filled resin includes a sinterable ceramic material, a photocurable monomer, a photoinitiator and a dispersant. The ceramic filled resin is particularly adapted for use in stereolithography to produce a green ceramic mold that resists cracking when sintered. The filled resin is prepared by admixing the components to provide a filled resin having viscosity of less than about 4,000 cPs, more preferable between about 90 cPs and about 3,000 cPs and most preferably between about 100 to about 1000 cPs. The resulting filled resin has a solids loading of about 40% to about 60% volume solids in the resin. Further, in one embodiment the filled resin has a density of between about 1.0 to about 4.0 g/ml, more preferable between about 1.5 and 2.5 g/ml.

The sinterable ceramic material for use in this invention can be selected from a wide variety of ceramic materials. Specific examples include alumina, yttria, magnesia, silicon nitride, silica and mixtures thereof. The sinterable ceramic material is included in the filled resin at about 50 volume percent (vol. %) based upon the total volume of the filled resin. Expressed in other terms, the filled resin includes about 50 to about 85 weight percent (wt %) of the sinterable ceramic material, most preferably about 65 to about 80 wt % based upon the total weight of the filled resin.

In one example silica is selected as the sinterable ceramic material. Silica can be provided as a dry powder having an average particle size suitable for sintering to provide a cured mold in accordance with this invention. Preferably the powdered silica is selected to have an average particle size of about 0.5 microns to about 20.0 microns and, more preferably about 1.0 micron to 20.0 microns, and most preferably about 1.0 micron to about 5.0 microns. Preferably, the amount of silica is between about 50.0 wt % and about 72.0 wt % based upon the total weight of the filled resin.

The monomer is selected from any suitable monomer that can be induced to polymerize when irradiated in the presence of a photoinitiator. Examples of monomers include acrylate esters and substituted acrylate esters. A combination of two or more monomers may be used. Preferably at least one of the monomers is a multifunctional monomer. By multifunctional monomer it is understood that the monomer includes more than two functional moieties capable of forming bonds with a growing polymer chain. Specific examples of monomers that can be used with this invention include 1,6-hexanediol diacrylate (HDDA) and 2-phenoxyethyl acrylate (POEA). The photocurable monomers are present in an amount between about 10 to about 40 wt %, more preferably about 10 to about 35 wt %, and most preferably about 20-35 wt % based upon the total weight of the filled resin.

The dispersant is provided in an amount suitable to maintain a uniform colloidal suspension of the silica in the filled resin. The dispersant can be selected from a wide variety of known surfactants. Preferred dispersants include ammonium salts, more preferably tetraalkyl ammonium salts. The tetraalkyl groups can include a variety of substituents. Specific examples of dispersants for use in this invention include, but are not limited to: polyoxypropylene diethyl-2-hydroxyethyl ammonium acetate, and ammonium chloride. Preferably, the amount of dispersant is between about 1.0 wt % and about 10 wt % based upon the total weight of the ceramic within the filled resin.

The initiator can be selected from a number of photoinitiators known to those skilled in the art. The photoinitiator is selected to be suitable to induce polymerization of the desired monomer when irradiated. Typically the selection of a photoinitiator will be dictated by the wavelength of radiation used to induce polymerization. Preferred photoinitiators include benzophenone, trimethyl benzophenone, 1-hydroxycyclohexyl phenyl ketone, isopropylthioxanthone, 2-methyl-1-[4 (methylthio)phenyl]-2-morpholinoprophanone and mixtures thereof. The photoinitiator is added in an amount sufficient to rapidly polymerize the monomers when the filled resin is irradiated with radiation of appropriate wavelength. Preferably the amount of photoinitiator is between about 0.05 and about 5 wt % based upon the total weight of the monomer within the filled resin.

In an alternate form of the ceramic filled resin a quantity of a nonreactive diluent is substituted for a quantity of the monomer. Preferably, the amount of substituted nonreactive diluent is equal to between about 5% and about 20% (by weight or volume) of the monomer in the resin. An illustration of a given ceramic resin composition requires 100 grams of a monomer that in the alternate form will replace about 5-20 wt % of the monomer with a nonreactive diluent (i.e. 95-80 grams of monomer +5-20 grams of nonreactive diluent). The nonreactive diluent includes but is not limited to a dibasic ester or a decahydronaphthalene. Examples of dibasic esters include dimethyl succinate, dimethyl glutarate, and dimethyl adipate, which are available in a pure form or a mixture.

The filled resin is prepared by first combining the monomer, the dispersant and the sinterable ceramic to form a homogeneous mixture. Although the order of addition is not critical to this invention typically, the monomer and the dispersant are combined first and then the sinterable ceramic is added. Preferably the sinterable ceramic material is added to the monomer/dispersant combination in increments of about 5 to about 20 vol. %. Between each incremental addition of the ceramic material, the resulting mixture is thoroughly mixed by any suitable method, for example, ball milling for about 5 to about 120 minutes. When all of the sinterable ceramic material has been added, the resulting mixture is mixed for an additional amount of time up to 10 hours or more. The photoinitiator is added and blended into the mixture just prior to irradiation of the resin, preferably not more than about 2 hour prior to irradiation.

A preferred silica filled resin comprises about 67.1 wt % silica, about 31 wt % monomer, about 1.37 wt % dispersant, and about 0.619 wt % photoinitiator. The wt % are based upon the total weight of the silica filled resin. A preferred alumina filled resin comprises about 78.2% alumina, about 20.1 wt % monomer, about 1.56 wt % dispersant, and about 0.101 wt % photoinitiator.

With reference to Table II there is set forth a preferred silica filled resin and a preferred alumina filled resin.

TABLE II

|  | wt/g | vol cc | wt % | vol % |
| --- | --- | --- | --- | --- |
| Alumina | 1980 | 500 | 78.2 | 48.0 |
| Monomer | 510 | 500 | 20.1 | 48.0 |
| Dispersant | 39.6 | 38.8 | 1.56 | 3.73 |
| Photoinitiator | 2.55 | 2.32 | 0.101 | 0.223 |
| Total | 2532 | 1041 | 100% | 100% |
| Silica | 2210 | 1000 | 67.1 | 48.5 |
| Monomer | 1020 | 1000 | 31.0 | 48.5 |
| Dispersant | 44.2 | 43.33 | 1.37 | 2.14 |
| Photoinitiator | 5.10 | 4.636 | 0.619 | 0.899 |
| Total | 3279 | 2048 | 100% | 100% |

In an alternate embodiment, the ceramic filled resin is defined as a duplex curing resin. The duplex curing resin utilizes two types of initiators to cause the polymerization of the monomer. In a preferred form there is one photoinitiator for UV light curing, and another initiator for thermal curing. One example of an initiator for thermal curing is benzoyl peroxide or AIBN. AIBN comprises 2-2'-azo-bis-isobutyrylnitrile. However, the initiator for thermal curing can be selected from a number of other initiators known to those skilled in the art.

Figure 16:
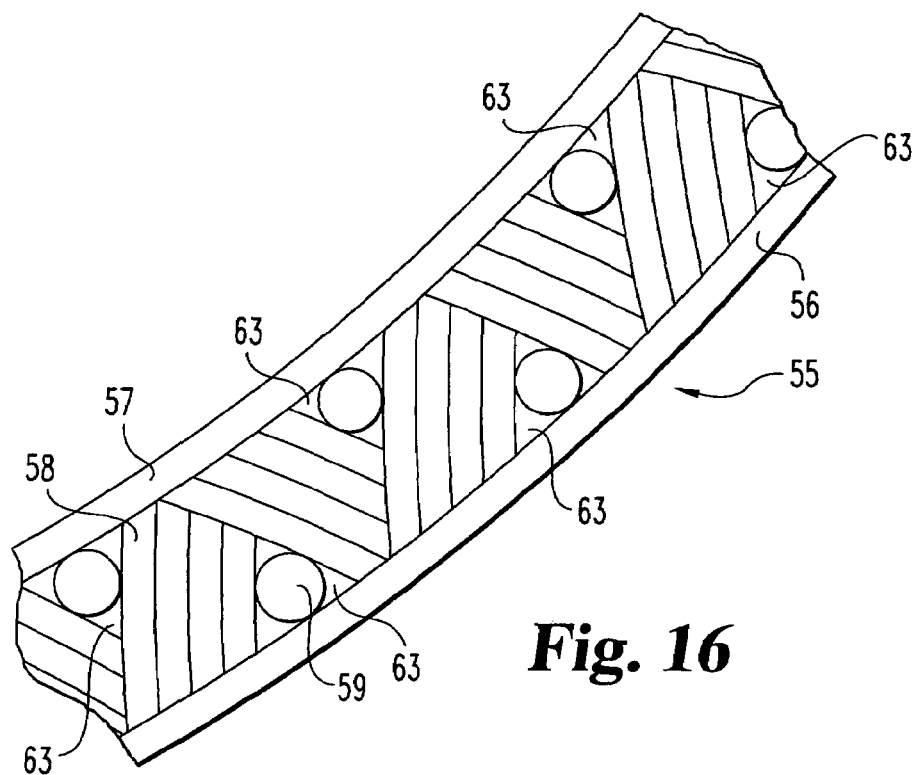
FIG. 16 is an illustrative view of an alternate embodiment of a wall structure comprising a portion of the FIG. 10 casting mold.

With reference to FIG. 16, there is illustrated an alternate embodiment 55 of the thin wall structure 49. The composite wall structure 55 comprises a pair of spaced thin outer walls 56 and 57 with a plurality of internal wall members 58 connecting therebetween. A plurality of cavities 63 is formed in the wall structure 55 and in one embodiment includes an internal core structure 59. In a preferred embodiment, the internal core structures 59 are hollow and integrally connected to the walls that define the cavity 63.

Figure 17:
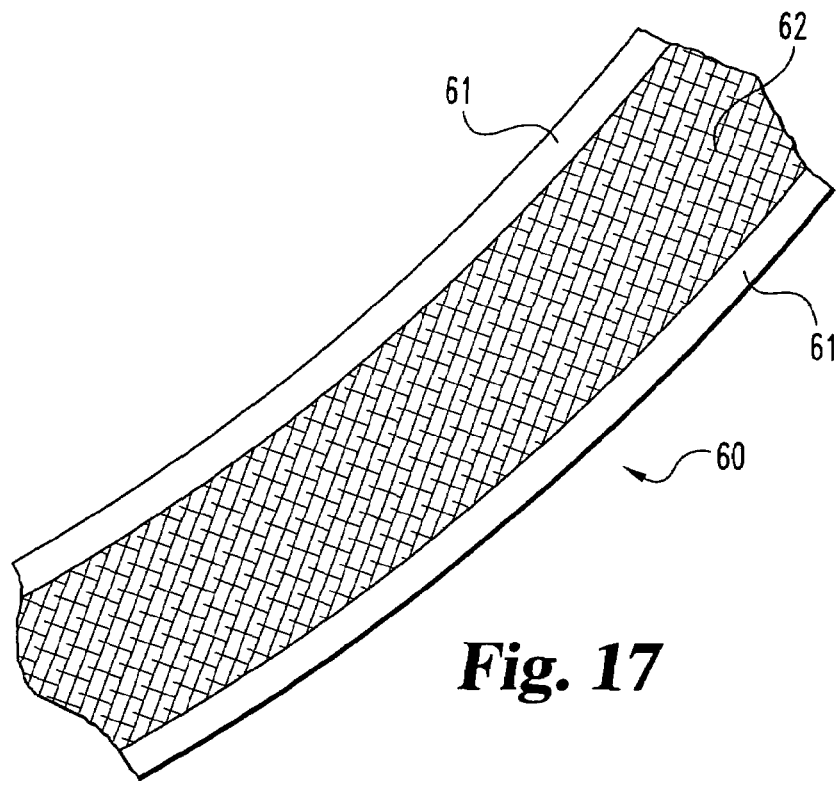
FIG. 17 is an illustrative view of an alternate embodiment of a wall structure comprising a portion of the FIG. 10 casting mold.

With reference to FIG. 17, there is illustrated a third embodiment 60 of the thin wall structure 49 of the integral mold 45. Wall structure 60 includes a pair of spaced thin outer walls 61 formed with and coupled to a porous inner member 62. The density of the inner member 62 is preferably less than the density of the outer walls 61. Wall structure 60, 55, and 49 can be used together or separately as required by the design. It is understood herein that wall structures 49, 55, and 60 are purely illustrative of wall structures of the present invention and are not intended to be limiting in regards to other designs for composite wall structures.

Figure 19:
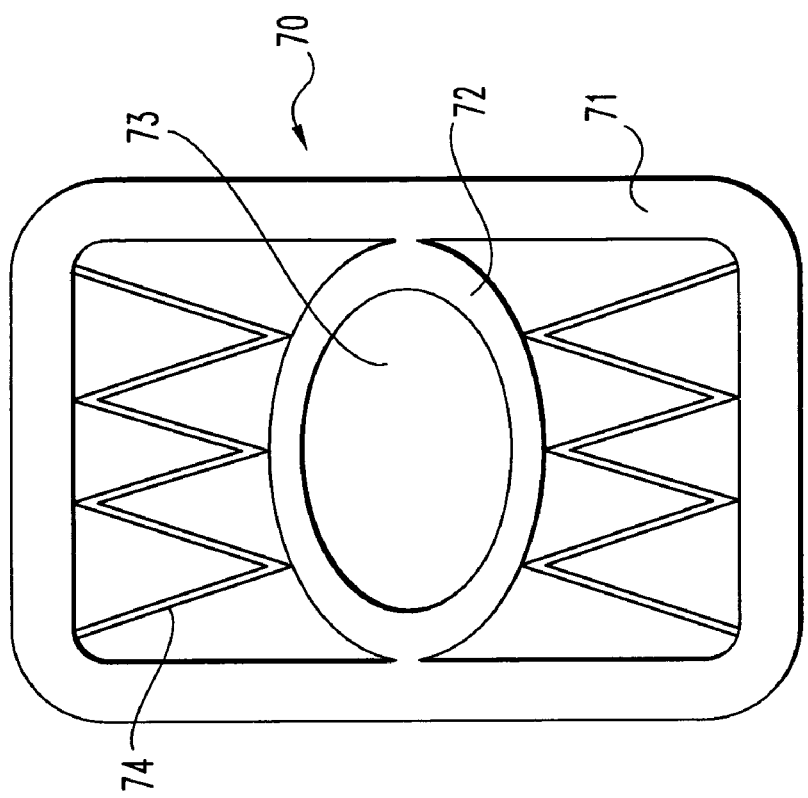
FIG. 19 is an illustrative view of an alternative embodiment of a core comprising a portion of the FIG. 10 casting mold.
Figure 18:
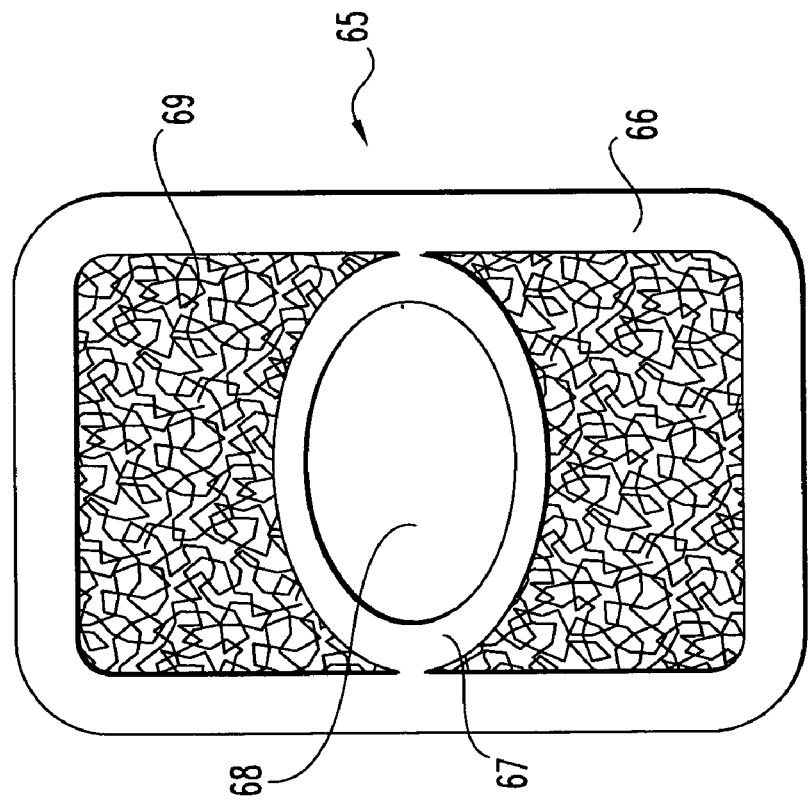
FIG. 18 is an illustrative view of an alternative embodiment of a core comprising a portion of the FIG. 10 casting mold.

Referring to FIGS. 18 and 19, there are illustrated alternate forms 65 and 70 respectively of a portion of the mold core 50. Mold core 65 has an integral thin wall structure 66 with an internal hollow core structure 67 formed therewith. Formed between the outer wall structure 66 and the internal hollow core structure 67 is a porous structure 69. Mold core 70 includes a thin wall 71 with an internal hollow core 72 formed therewith. A plurality of reinforcing ribs 74 are formed between the outer wall 71 and the internal hollowcore 72. The configurations of the mold cores 50, 65, and 70 are not intended to be limiting herein and other designs of mold cores are contemplated herein.

Figure 20:
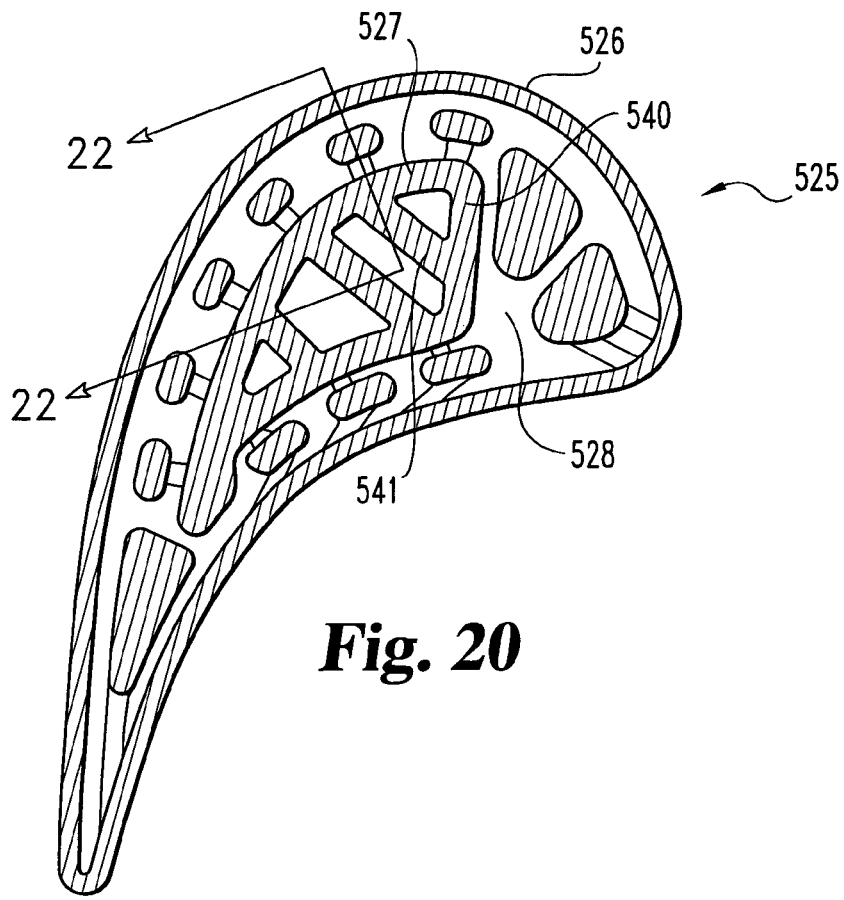
FIG. 20 is an illustrative sectional view of an alternative embodiment of a casting mold of the present invention.
Figure 21:
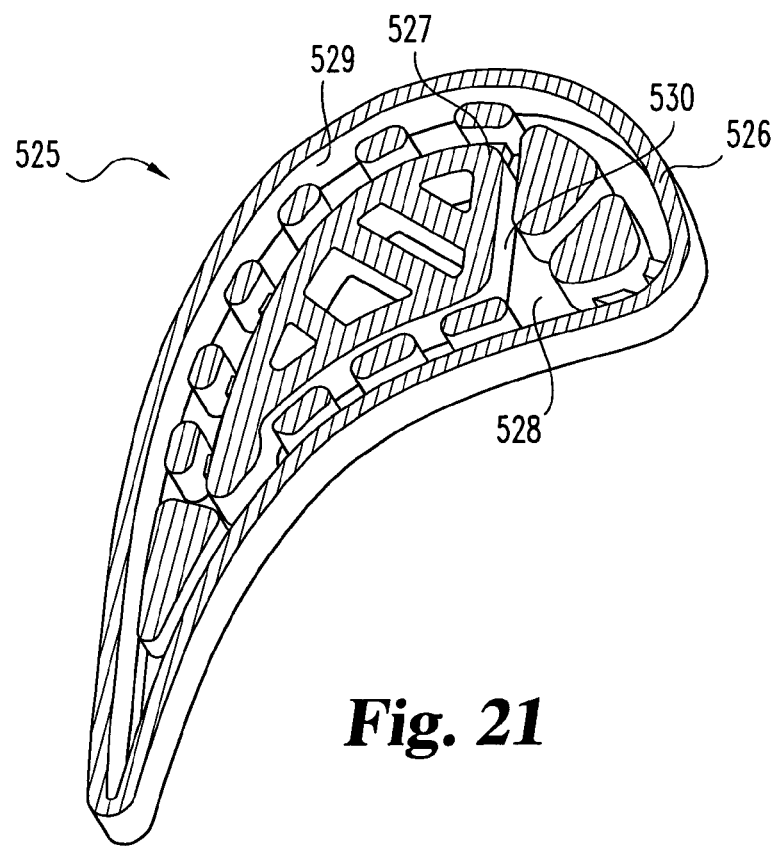
FIG. 21 is a perspective view of the casting mold of FIG. 20.

Referring to FIGS. 20 and 21, there is illustrated another embodiment of a green casting mold system. The casting mold 525 is substantially similar to the previously described casting mold system 45. More specifically, the casting mold system 525 has an integral ceramic shell 526 and ceramic core 527. The volume 528 between the core ceramic shell 526 and the core 527 defines the component to be formed from a molten metallic material. Preferably, the volume 528 includes no supporting structure extending therein to interfere with the receipt of molten metal. More specifically, in a more preferred embodiment the drawing of the cross-sections does not draw any structure within the volume 528. However, in another embodiment of the present invention the fabrication process produces supporting structure within the volume 528 that can be removed without damaging the ceramic shell 526 and/or the core 527. In a preferred form the inner wall surface 529 of the ceramic shell 526 and the outer surface 530 of the ceramic core 527 as formed are substantially smooth. The wall surface will be defined as either a stepped surface which is defined by a portion of a plurality of abutting layers, or a flat surface which is defined by a surface of a single layer. More specifically, the green state components have an as formed surface finish for a stepped surface within a range of about ten microns to about 30 microns, and an as formed surface finish for a flat surface within a range of about 0.5 microns to about 10 microns.

In one embodiment of the casting mold system 525 the core 527 is substantially hollow. A thin outer wall shell 540 has a plurality of spaced inner wall members 541 integrally formed therewith. It is contemplated herein that cores having a solid configuration and a substantially hollow configuration are within the contemplation of the present invention.

Figure 22:
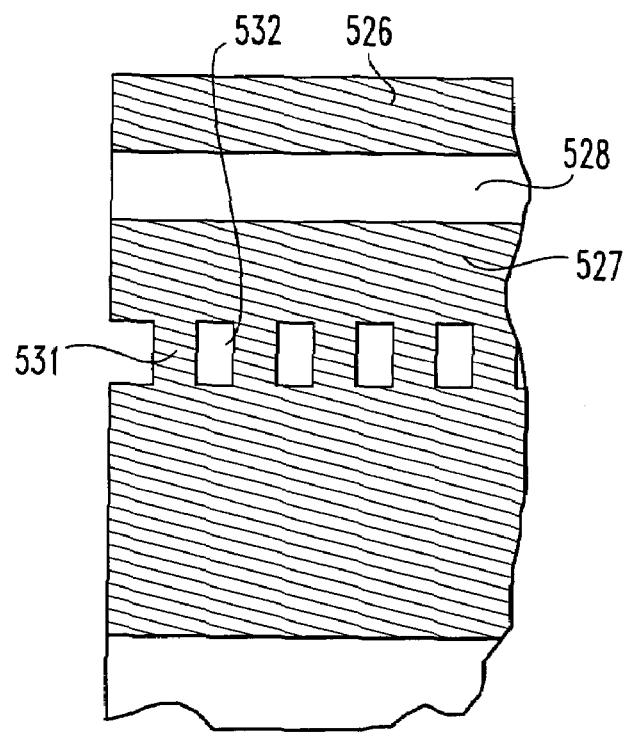
FIG. 22 is a sectional view taken along line 22-22 of the casting mold of FIG. 20
Figure 23:
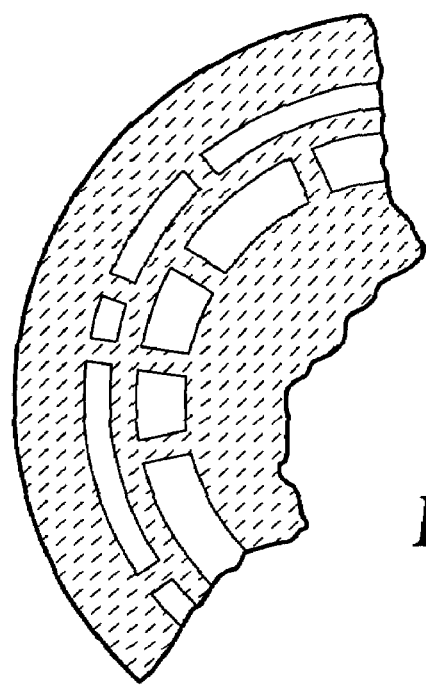
FIG. 23 is an illustrative sectional view of another embodiment of a casting mold of the present invention.

Referring to FIG. 22, there is illustrated a partial sectional view taken along line 22-22 of FIG. 20. The ceramic core 527 has a passageway 532 formed therein that is adapted for the receipt of molten metal. More specifically, there is a plurality of spaced passageways 532 formed in the ceramic core 527 for the receipt of molten metal. The passageways 532 allow the casting of details in the component. In a preferred embodiment each of the passageways 532 has an as formed width/diameter in the range of about 0.005 inches to about 0.030 inches, and more preferably defines a width/diameter less than about 0.020 inches, and most preferably defines a width/diameter of about 0.010. FIG. 23 is an illustration of another embodiment of an integral multi-wall ceramic casing mold system.

Figure 24:
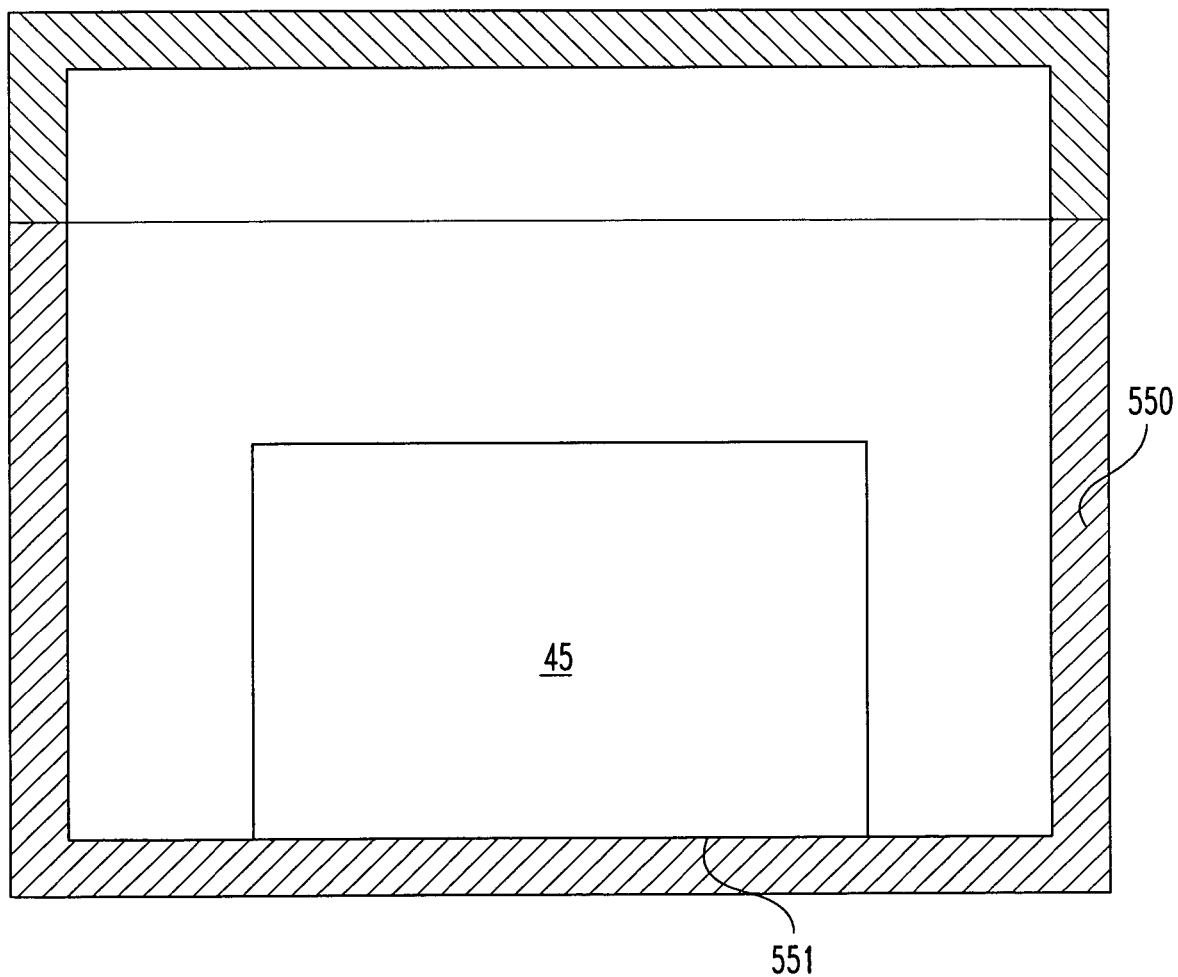
FIG. 24 is a diagrammatic representation of a casting mold within a furnace for sintering the green ceramic mold.

With reference to FIG. 24, there is schematically shown a casting mold system 45 positioned within a furnace 550. The furnace provides the heat required for substantially burning out the polymer binder from a green ceramic casting mold system and sintering the ceramic particles. In a preferred form the casting mold system is oriented within the furnace so as to minimize the number of individual layers resting on the surface 551 of the furnace. A firing schedule for a green ceramic mold system includes heating the mold within the furnace from a normal room temperature at a rate of about 0.1 degrees centigrade per minute to about 5.0 degrees centigrade per minute to a first temperature of about three hundred degrees centigrade to about five hundred degrees centigrade. Thereafter holding the maximum temperature for a time range of about zero hours to about four hours to burn out the polymer binder. After the heating portion the densified casting mold system is subjected to a sintering schedule. The sintering schedule increasing the temperature within the furnace from the first temperature at a rate of about 5.0 degrees per minute centigrade to about 10.0 degrees per minute centigrade to a second temperature within a range of about 1300 degrees centigrade to about 1600 degrees centigrade. The casting mold system is held at the second temperature for a time range of about zero hours to about four hours. The casting mold system is then cooled to room temperature at a rate of about 5.0 degrees centigrade per minute to about 10.0 degrees centigrade per minute. The casting mold system is preferably sintered to a density greater than about 70%, and more preferably the casting mold system is sintered to a density within a range of about 90-98%. Most preferably, the casting mold system is sintered to a substantially full density. In one embodiment the sintered ceramic casting mold system is about 99 wt % ceramic particles, and more preferably about 99 wt % alumina A preferred firing schedule for an alumina based green ceramic mold system includes heating the mold within the furnace from a normal room temperature at a rate of about one degree centigrade per minute to a first temperature of about 300 degrees centigrade and holding at the first temperature for about four hours. Thereafter increasing the temperature from the first temperature to a second temperature of about 500 degrees centigrade at a rate of about one degree centigrade per minute. Holding at the second temperature for about zero hours. Increasing the temperature at a rate of about ten degrees centigrade per minute from the second temperature to a third temperature of about 1550 degrees centigrade. Holding at the third temperature for about two hours. The casting mold system is then cooled from the third temperature to room temperature at a rate of about five degrees centigrade per minute.

A preferred firing schedule for a silica based green ceramic mold system includes heating the mold within the furnace from a normal room temperature at a rate of about one degree centigrade per minute to a first temperature of about 300 degrees centigrade and holding at the first temperature for about four hours. Thereafter increasing the temperature from the first temperature to a second temperature of about 500 degrees centigrade at a rate of about one degree centigrade per minute. Holding at the second temperature for about zero hours. Increasing the temperature at a rate of about ten degrees centigrade per minute from the second temperature to a third temperature of about 1500 degrees centigrade. Holding at the third temperature for about two hours. The casting mold system is then cooled from the third temperature to room temperature at a rate of about five degrees centigrade per minute.

The integral casting molds 45 and 45a are produced by different processes and while they do have different properties, they both form a ceramic shell for receiving molten metal therein. However, it is understood that in another form of the present invention the ceramics shell can receive other material for solidification besides molten material. While the forming of a ceramic mold by three-dimensional printing and selective laser activation have been discussed herein, the present casting inventions are not intended to be limited to these types of molds, unless specifically stated. For example, a mold produced with conventional techniques of cores and patterns which are shelled by dipping in a ceramic slurry, resin shell molds, or sand molds are also contemplated herein. Hereinafter, the term casting mold will be referred to generically as casting mold 45 and is intended to include all types of ceramic casting molds, unless specifically stated to the contrary.

Figure 25:
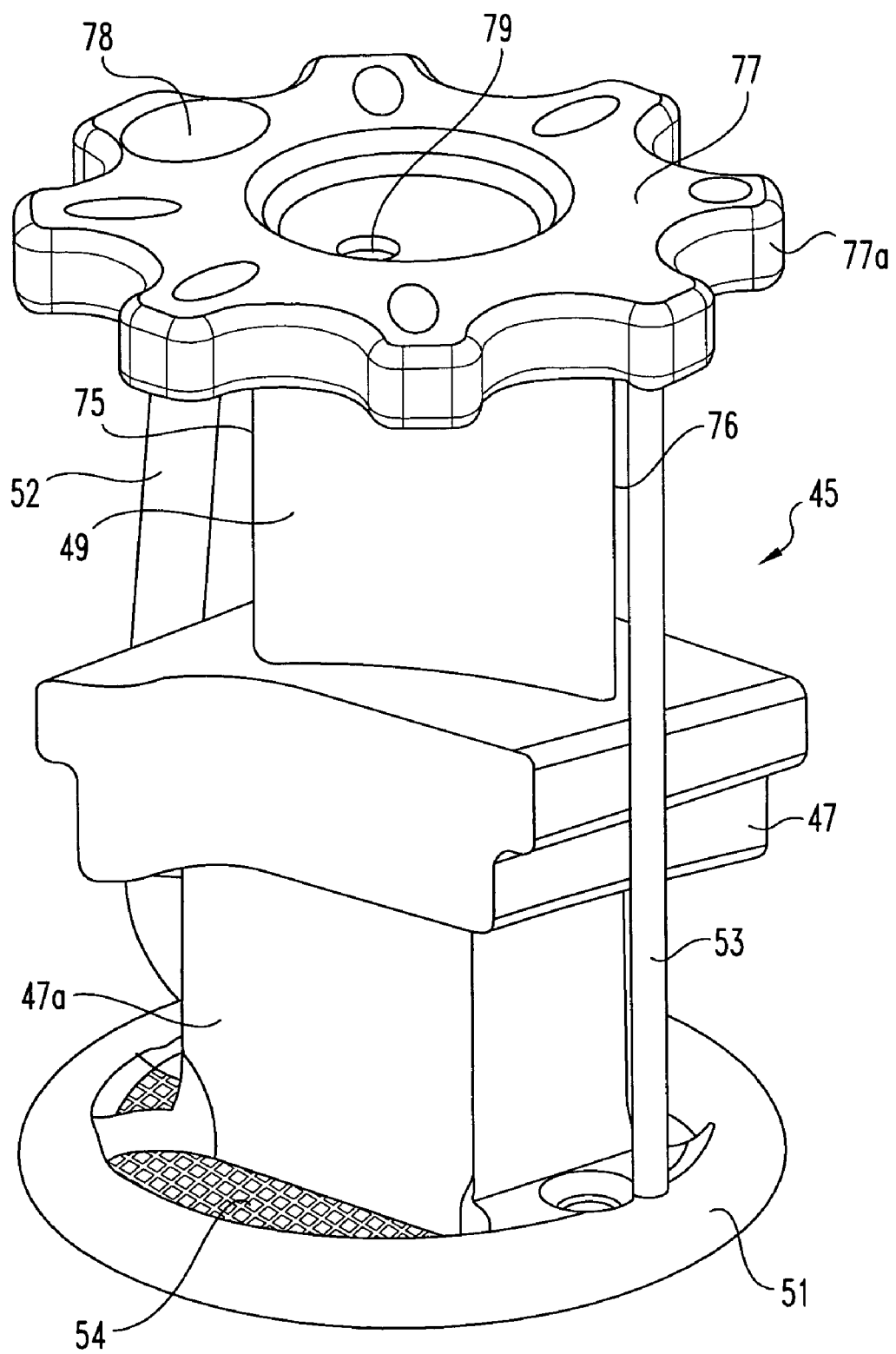
FIG. 25 is an illustration of a free form fabricated integral casting mold according to one embodiment of the present invention which further comprises a top member.

With reference to FIG. 25, there is illustrated one embodiment of the integral casting mold 45. The completed integral mold 45 has a base member 51, a top member 77, and a main body 47 extending therebetween. Support member 53 extends between the bottom member 51 and the top member 77, while the fill tube 52 extends from the fill inlet 78 to a bottom portion 47a of the main body 47 and is in fluid communication with the internal metal receiving cavity of the mold. Preferably the base member 51 is defined by a ring structure. A vent 79 is formed in the integral mold 45 and opens into the internal metal receiving cavity to allow gaseous material to enter and leave the mold, aid in material removal, and aid in casting fill. It is understood herein that in alternate embodiments the integral casting mold 45 may be of a different configuration and may not include features such as the base member and/or the top member.

In one embodiment, the top member 77 defines a toothed ring or disk structure disk contactable with the container 80. Preferably, the integral mold 45 has been designed to minimize the quantity of material needed to produce it, and therefore its thin shell causes it to resemble the contour of the product being cast therein. In the present example, the mold 45 resembles a gas turbine blade, however, other shapes are contemplated. Further, the integral mold could be formed such that its outer surface does not conform to the shape of the product/component being cast within the internal cavity.

In the designing and forming of the integral mold 45 there are many parameters to consider including: (1) the desired strength and stiffness of the mold; (2) the speed at which the mold can be created; (3) the ability for the cores within the mold to crush as the metal solidifies; (4) the rate of the heating/cooling during the casting; (5) the removal/leach speed of the cores; and, (6) restraint of the casting during cooling after solidification. The crushability of portions of the mold as the molten metal solidifies around it can be addressed by the variation in densities, structures and the porosity of the components. For example with reference to FIGS. 18 and 19 there is illustrated core structures 65 and 70 that have a porous structure 68 and a reinforcing web structure 74 that will partially collapse/give as molten metal solidifies therein.

Figure 26:
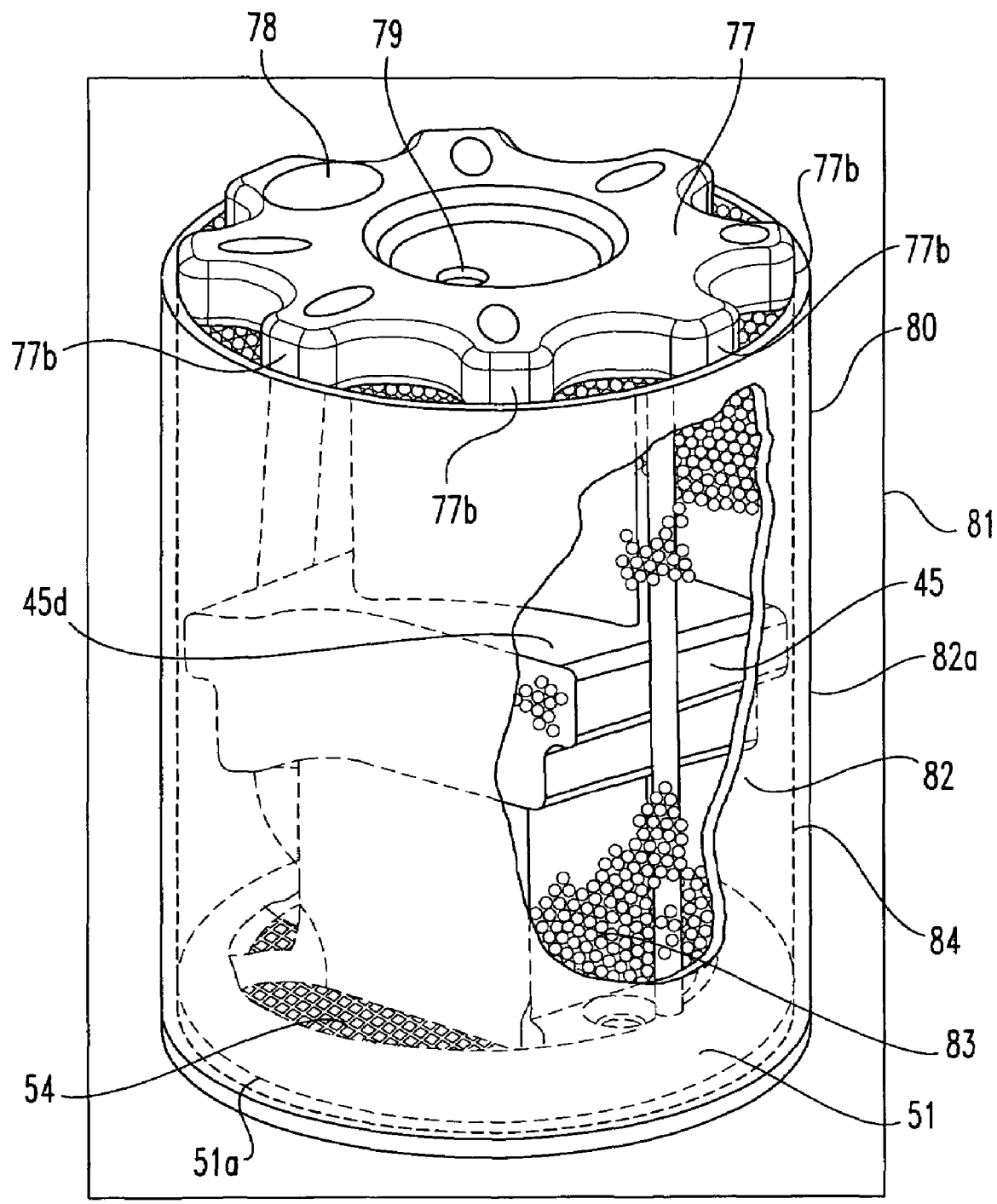
FIG. 26 is a partially fragmented view of a mold container with the integral casting mold of FIG. 25 positioned therein.

With reference to FIG. 26, there is illustrated a mold container 80 and integral mold 45 positioned in a furnace 81. While the mold container 80 has been illustrated with the integral mold 45 positioned therein, it is understood that other types of molds may also be positioned within the mold container 80. The mold container 80 is designed and constructed to contain the integral mold 45, during the casting process. An outer wall member 82 of the container 80 has an opening therethrough that is sized to provide an interference fit between an inner surface of the mold container and the outer surface 51a of the base member 51 and a portion of the outer surface 77b of the top member 77. In one embodiment, the mold container 80 is defined by a thick walled fibrous ceramic tube that is shrink fitted over the bottom member 51 and the top member 77. The term tube, as used herein, defines a hollow member and is not intended to be limited to a hollow cylindrical structure, unless specifically stated. The container in an alternate embodiment includes an integral bottom wall member that generally defines a cup shaped container. However, other shapes for the container are contemplated herein. Further, in an alternate embodiment the container and the mold are not in an interference fit.

In a preferred embodiment the mold container 80 is defined by an elongated cylindrical shaped tube. In one form the wall thickness for the outer wall member 82 is within a range of about 0.010 to about 1 inch, and more preferably is about 0.5 inches. However, other wall thickness are contemplated herein. The outer wall member 82 being formed of a ceramic material that has been selected for specific heat transfer requirements. In one embodiment, the member transfers the heat from its outer surface 82a quickly so as to facilitate handling, while in another embodiment the member has been designed to insulate the integral mold 45. Materials such as, but not limited to, porous ceramics, ceramic fibermatts, metals, and metals with thermal barrier coatings are contemplated herein for the outer wall member 82.

At least one supporting members 83 is positioned within the space between the inner surface 84 of the outer wall 82 and the outer surface 45a of the integral mold 45. The supporting member provides support for the thin walled integral mold 45 during the casting process. The reinforced mold container 80 allows the delivery of the molten metal at high pressures to a thin shell mold. In one embodiment molten metal pressures within the range of about three inches to about twenty-four inches of nickel are contemplated herein for use with the reinforced thin walled integral mold. However, other molten metal pressures are contemplated herein.

In a preferred embodiment, the supporting member 83 is defined by a plurality of supporting members, and more preferably is defined by a plurality of ceramic media members. In one embodiment, the plurality of supporting members having a size within the range of about 0.010 inches to about 0.100 inches and are defined as a spherical/ball. However, other sizes are contemplated herein. The plurality of supporting members fill the space within the mold container 80 and abut the outer surface 45d of the integral mold. It is understood that the shape of the plurality of supporting members includes, but is not limited to, tablet, spherical, or fibrous. Moreover, in an alternate embodiment of the present invention, the supporting member within the mold container can be defined by: a continuous ceramic material formed between the inner surface 84 of the outer wall 82 and the outer surface 45*d* of integral mold 45; a ceramic foam such as alumina, mullite, silica, zirconica, or zircon. The web structure 54 is designed and constructed to minimize the amount of material utilized to create a bottom wall member for preventing the passage of the plurality of support members 83 from the container 80. However, other structures such as but not limited to a solid wall are contemplated herein. The plurality of ceramic supporting media 83 are readily removable from the containers for reuse and/or recycling.

Figure 27:
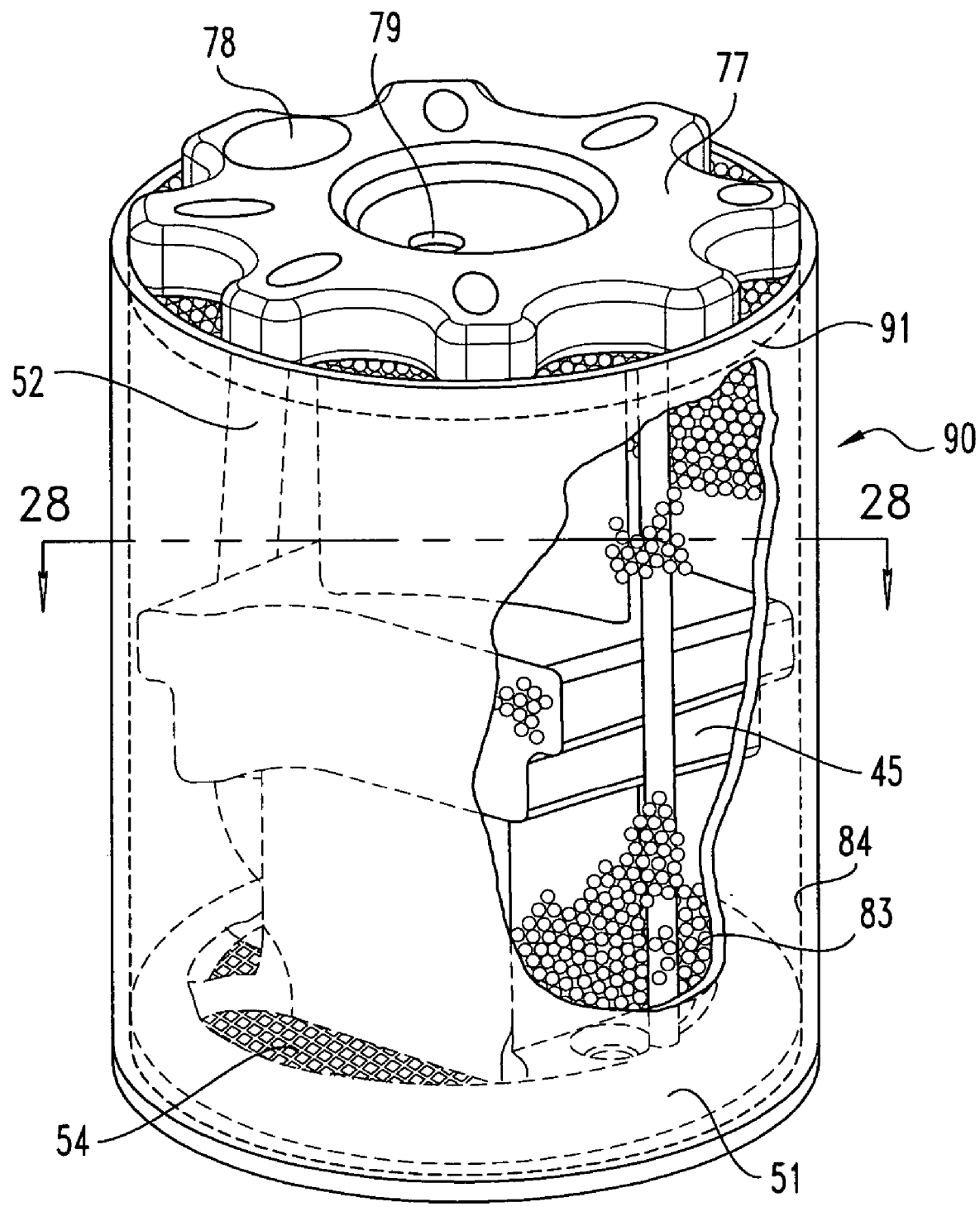
FIG. 27 is a partially fragmented view of an alternate embodiment of the mold container of FIG. 26 that further comprises a heating ring.

With reference to FIG. 27, there is illustrated the mold container 80 which further includes a supplemental mold heater 91. Supplemental mold heater 91 is controlled to add energy as needed during the solidification of the molten metal and growth of the crystal within the integral mold cavity. In one form the supplemental mold heater 91 is coupled to the inner surface 84 of the outer wall 82 of the mold container 80 and is positioned at the top portion of the mold container 80. However, other locations along the mold container are contemplated herein.

Figure 28:
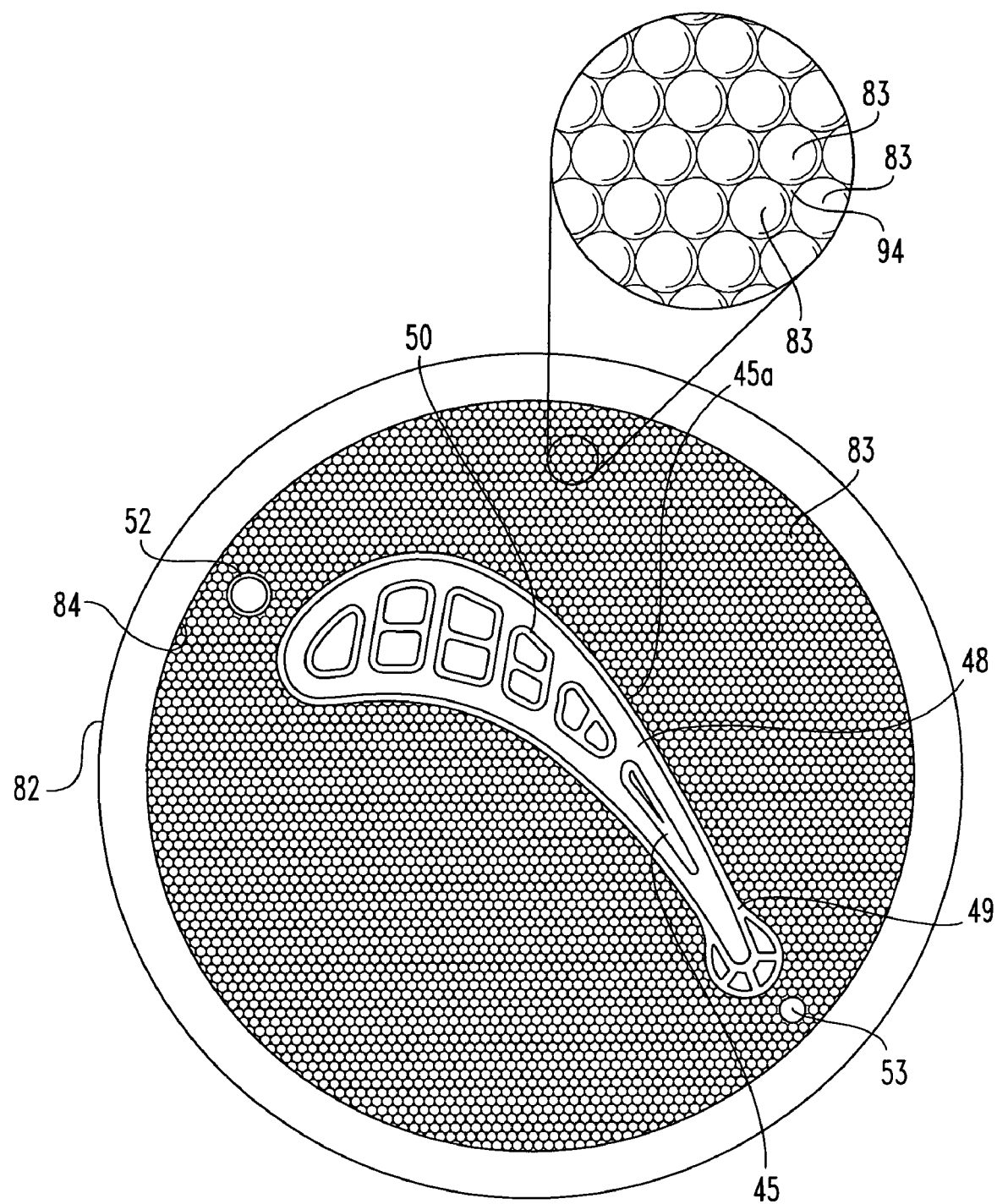
FIG. 28 is a cross sectional view of FIG. 27 taken along line 28-28.

With reference to FIG. 28, there is illustrated a cross sectional view of the mold container 80 with the integral mold 45 located therein. The cross section has been taken through line 28-28 of FIG. 27, which corresponds, to an airfoil-forming portion of the internal cavity for receiving a molten metal therein. The plurality of supporting members 83 abut the outer surface 45*d* in order to support the thin wall 49 during the pouring of molten metal within the cavity 48. The plurality of supporting members 83 have spaces 94 therebetween which serve as an insulator to prevent the transfer of heat from the integral mold 45 to the outer wall 82. Further, the plurality of supporting members 83 define a discontinuous heat transfer path to the outer wall 82 of the container. The plurality of members 83 function to retain the heat radiating from the integral mold 45 so as to help maintain a desired temperature for the integral mold 45.

Figure 29:
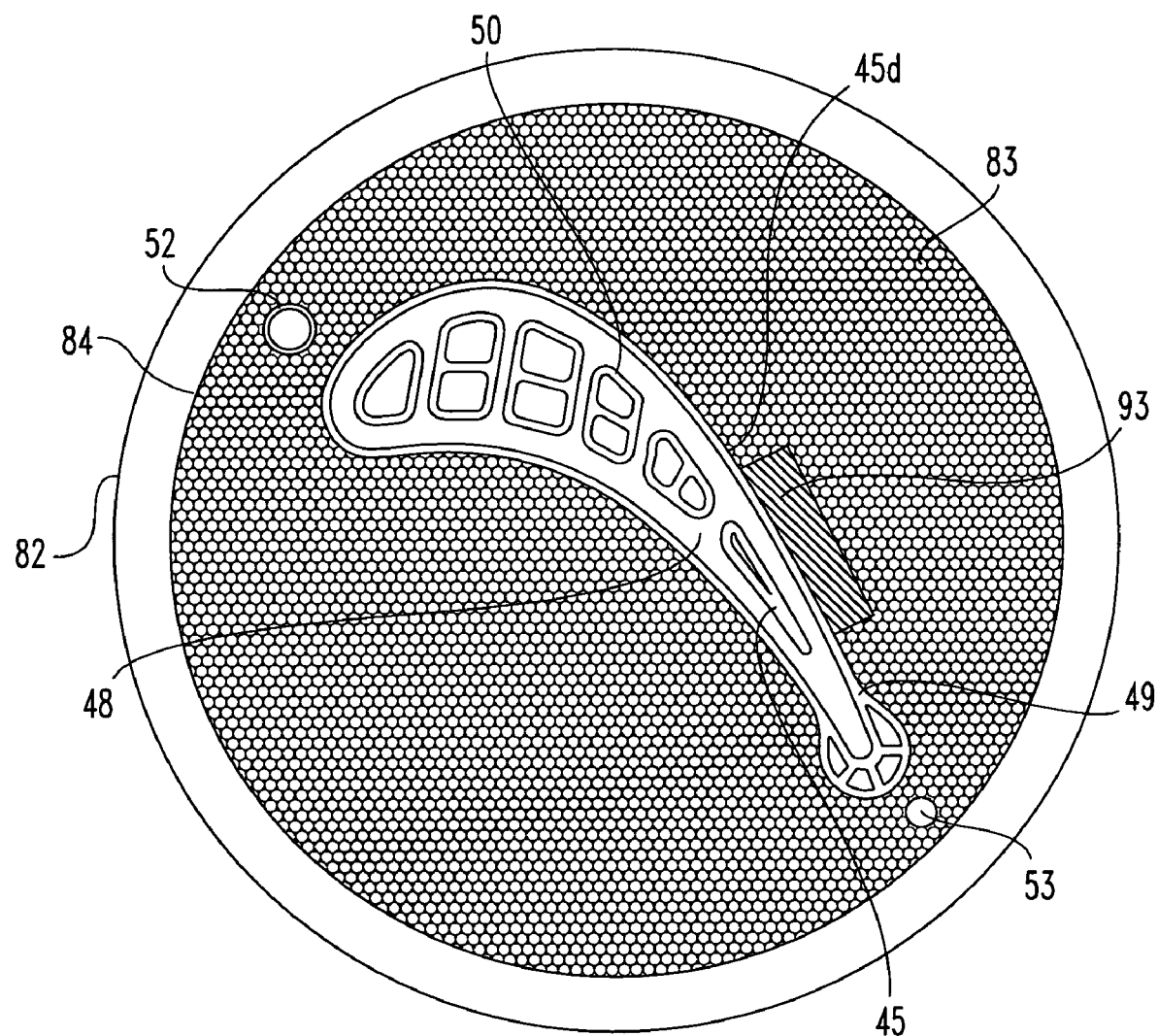
FIG. 29 is a cross sectional view of an alternate embodiment of the mold container of FIG. 27, which further includes a heater.

With reference to FIG. 29, there is illustrated the mold container 80 with the integral casting mold located therein. A localized mold heater 93 is positioned within the space defined between the outer wall 82 of the container 80 and the outer surface 45*a* of the mold 45 so as to heat a portion of the integral mold 45. The utilization of a localized mold heater 93 within the mold container can be adjacent or proximate any portion of the outer surface 45*a* of the mold 45. It is contemplated that the localized mold heater 93 can be continuous along a surface, or discontinuous along a surface or spaced from a surface as required by parameters related to the mold design. The depiction of the supplemental mold heater in FIG. 29 is not intended to be limiting therein.

Figure 30:
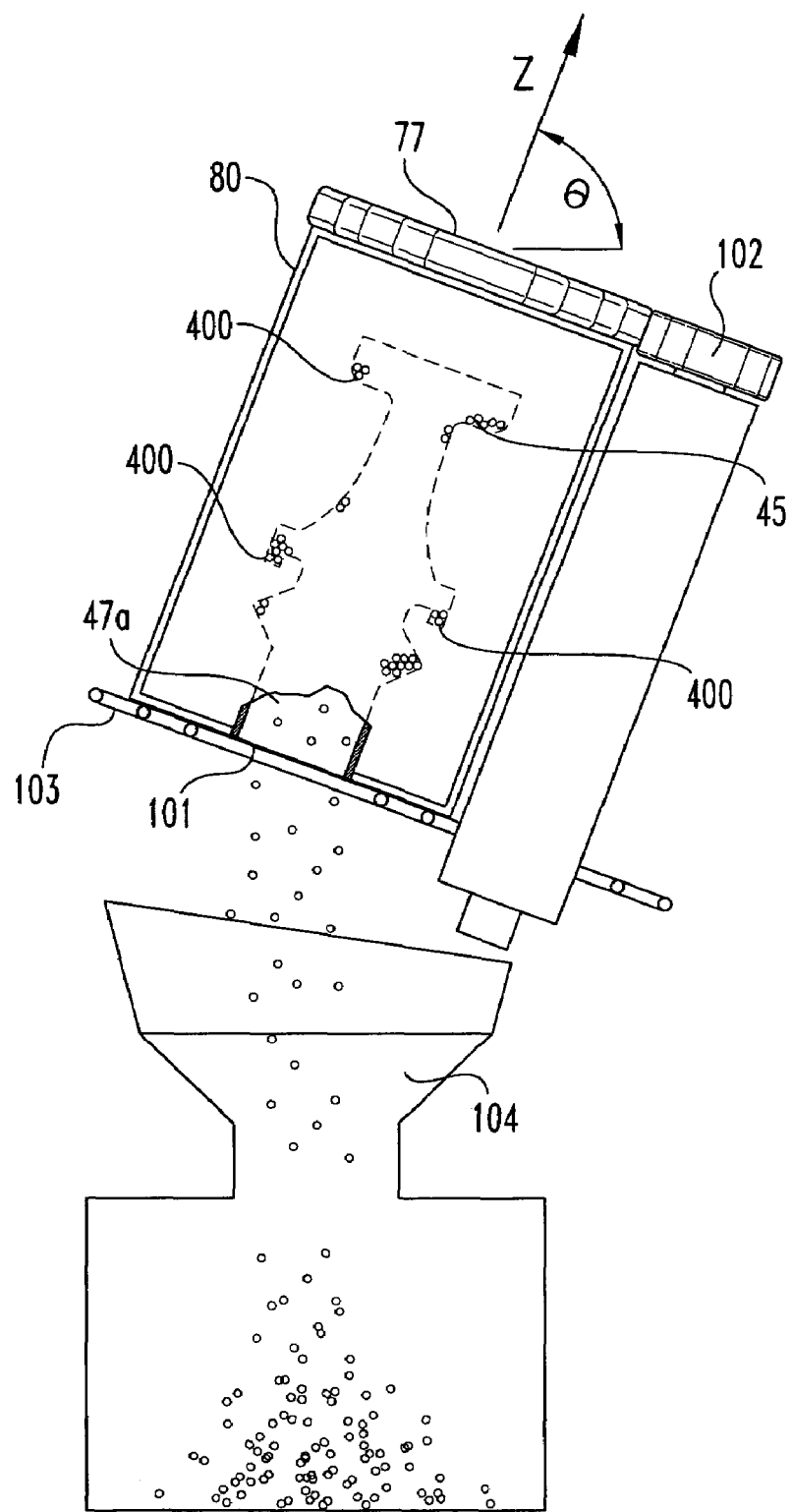
FIG. 30 is an illustration of a system for removing unbonded material from a casting mold.
Figure 31:
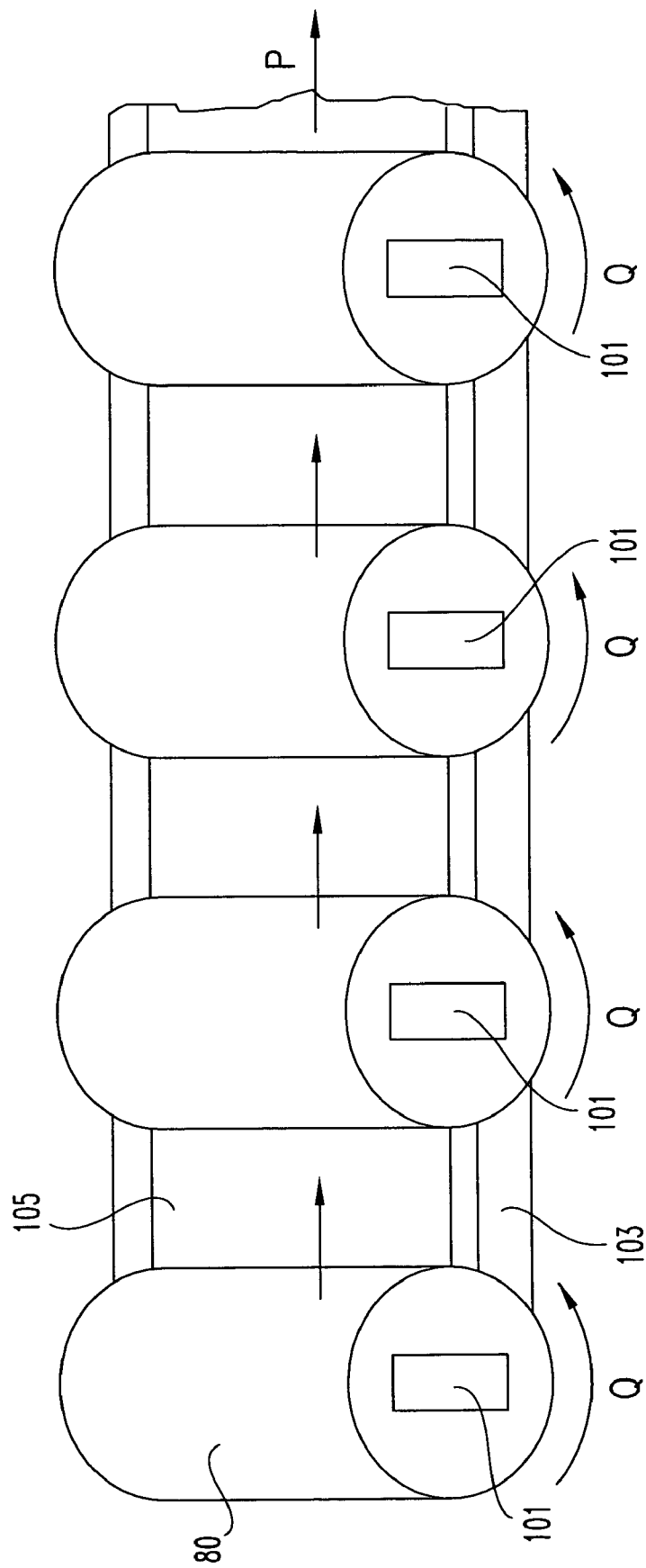
FIG. 31. is an illustrative view of one embodiment of the system of FIG. 30 for removing the unbonded material from the casting mold.

With reference to FIGS. 30 and 31, there is illustrated a method and apparatus for removing unbonded material 400 from within the internal cavity of the integral mold 45. While the process is illustrated with a free form fabricated mold having a plurality of layers of a material bonded together, it is also contemplated as being useful for other mold structures having unbonded particles located within a metal receiving cavity. The unbonded material relates to powders, particulate, and other material that is not bonded to the walls of the integral mold 45 within the cavity 48. In one form, the process for removing unbonded material from within a casting metal receiving cavity relates to a mold produced by the printing and binding of layers of powder to form a direct ceramic casting mold. In another embodiment the integral mold 45 has been heated to dry the unbonded materials within the cavity.

In another form, the process for removing unbonded material from within a casting metal receiving cavity is related to a mold produced by a selective laser activation technique to form a ceramic shell. The unjelled slurry may be dried and removed or removed in an undried state.

The mold container 80 with integral mold 45 is positioned at an inclination angle θ and rotated about an axis Z. In the preferred embodiment, the angle θ is an acute angle within the range of about 5 to about 90 degrees, and more preferably, the angle θ is about 15 degrees. However, in the alternate embodiment the angle θ is variable. Rotation and movement of the integral mold 45 causes the unbonded material 400 to be dislodged from the walls defining the internal cavity and passed through an exit aperture 101 that is in communication with the internal cavity, and into a bin 104. In an alternate embodiment the integral mold has a plug (not illustrated) put into the exit aperture 101 after the unbonded material 400 has been removed from the internal cavity. In a preferred embodiment, the exit aperture 101 is sized to receive a metallic starter seed utilized during the casting operation to facilitate a specific crystallographic structure and/or speed solidification.

In one form, the sprocket 77 of the integral mold 45 is engaged with a drive 102. The drive 102 is driven such that the container is revolved at speeds in the range of about 0.1 to 2 revolutions per minute, and more preferably rotates at a speed of about ⅓ revolutions per minute, however, other speeds are contemplated herein. The dwell time for which the integral mold is subjected to rotation is in the range of about 15 minutes to about 2 days and more preferably is about 2 hours. However, other dwell times are contemplated herein. The containers 80 pass along a container support 103 in the direction of arrow P as they are rotated about axis Z. A container spacer 105 is positioned between pairs of mold containers 80 so as to prevent contact between the containers. Further, the containers 80 may be inverted as necessary to facilitate removal of the material 400 from the internal cavity, and a fluid scrubbing can be introduced into the internal cavity to facilitate material removal. The introduction of fluids within the internal cavity can occur in the normal or inverted state.

The integral mold 45 is subjected to a thermal processing operation prior to the receipt of molten metal within its internal cavity. The integral mold 45 whether formed by the three-dimensional printing or the selective laser activation process, has a green state strength that is not sufficient for the casting process and therefore to increase it's strength it has been fired as previously discussed. In some mold constructions it is necessary to burn out polymers and other materials present in the green state mold. More specifically, in the case of the integral mold which is formed by the selective laser activation process, it is necessary to burn out the polymers within the green phase mold. The mold produced by the three-dimensional printing techniques generally do not require the bum out process as there are not significant materials to be removed from the green state integral mold 45. Lastly, the mold must be preheated to the appropriate temperature, which is chosen to facilitate the growth of the microstructure desired. In the case of a columnar grain structure the temperature desired to preheat the mold is about 2700 degrees Fahrenheit and in the case of a single crystal casting the temperature desired for the mold preheat is about 2800 degrees Fahrenheit.

In one form of the present invention, it is preferred to have an integrated thermal processing operation for the integral mold 45. The integrated thermal processing will include firing the green state mold 45, burning out the unwanted materials in the green state mold, and preheating the mold to the desired temperature necessary for casting the desired microstructure. The molds after the firing and sintering operation are then cooled, inspected, repaired as necessary and prepared for casting. Thereafter, the mold is elevated to the temperature desired for preheating the mold. In a more preferred form, each of these steps occur in the same furnace in a substantially continuous fashion. Elimination of thermal cycling of the mold will enhance the ability to cast hollow structures with intricate/delicate passages.

Figure 32:
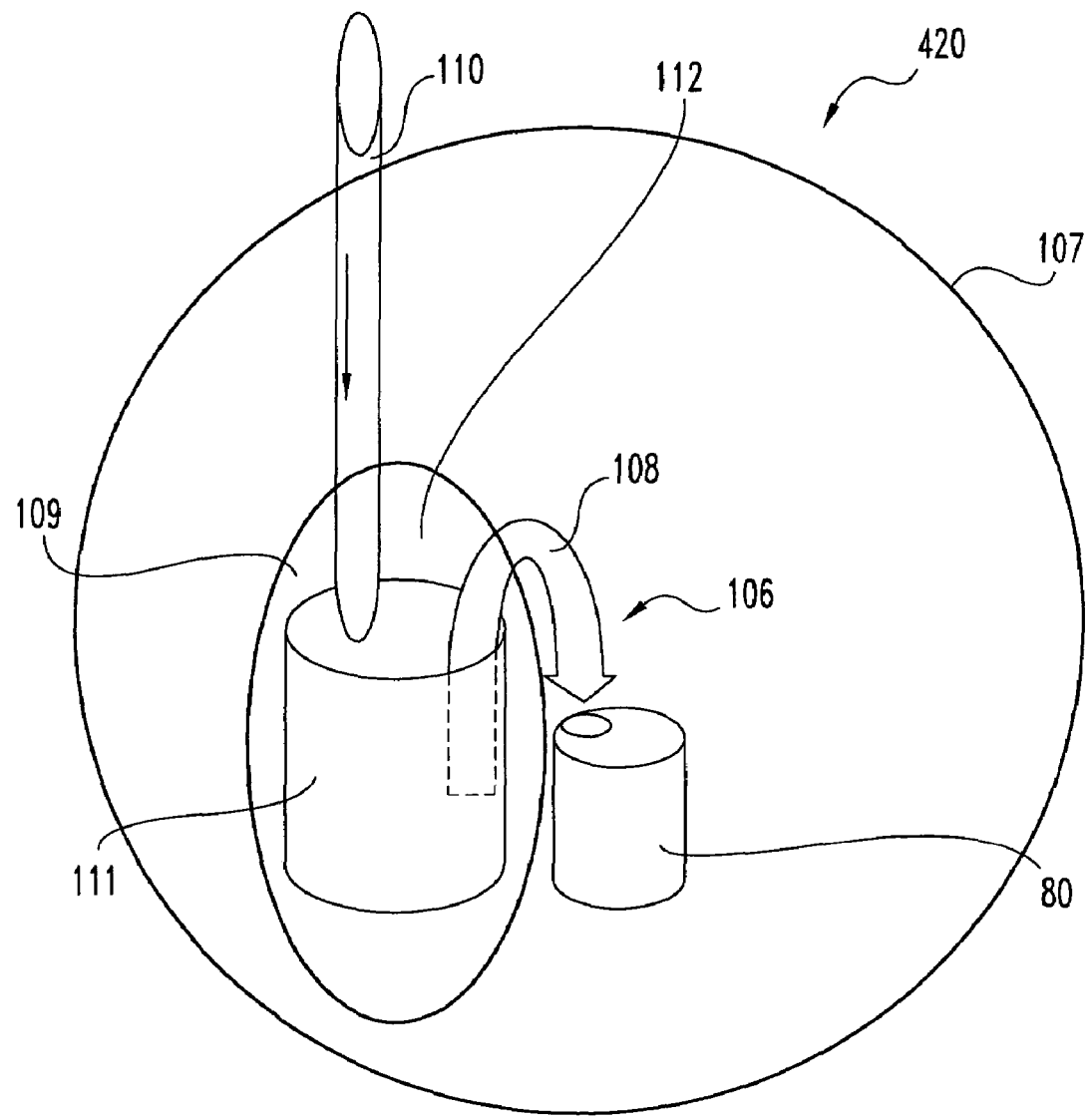
FIG. 32 is an illustrative view of one embodiment of a casting system of the present invention.

With reference to FIG. 32, there is depicted a functional representation of a casting apparatus 420 for delivering a charge of molten metal 108 to a casting mold, such as the mold container 80 with integral mold 45 therein. The present invention contemplates a casting apparatus that functions in a substantially continuous or a batch processing fashion. The casting mold utilized with the casting apparatus is not intended to be limited herein to a specific mold style or construction. The casting apparatus includes a precision molten metal delivery system 106 that is located within a furnace 107. In a preferred form of the present invention, the furnace 107 is defined by a dual chambered vacuum furnace. However, it is understood that other types of furnaces such as air melt or pressurized casting furnaces are contemplated herein. The precision molten metal delivery system for discharging a quantity of molten metal to the mold 80 is located within an environmentally controlled chamber 109. The molten metal delivery system 106 is fed molten metal from beneath the surface of the molten metal within a crucible 111. A supply of metal material 110 passes into the chamber 109 and is melted within the crucible 111. The supply of metal material within the crucible is heated to a super heated state, and for the alloys associated with casting turbine engine components the super heat is in the range of 350-400° Fahrenheit. However, it is understood that other super heat temperatures for these alloys and other types of metals is contemplated herein.

In one embodiment, the control chamber 109 is supplied with an inert gas 112 that forms a shield and/or membrane to slow surface vaporization of the molten metal within the crucible 111. Dispensing of the molten metal is controlled by a pressure differential between the molten metal delivery system 106 and the mold 80. In one embodiment, the discharge of molten metal is controlled by the application of a positive pressure to the surface of the molten metal, which in turn drives a quantity of molten metal from the crucible 111 into the mold 80. The mold 80 is positioned within a second chamber of the vacuum furnace and is at a lower pressure than the molten metal delivery system 106.

Figure 33:
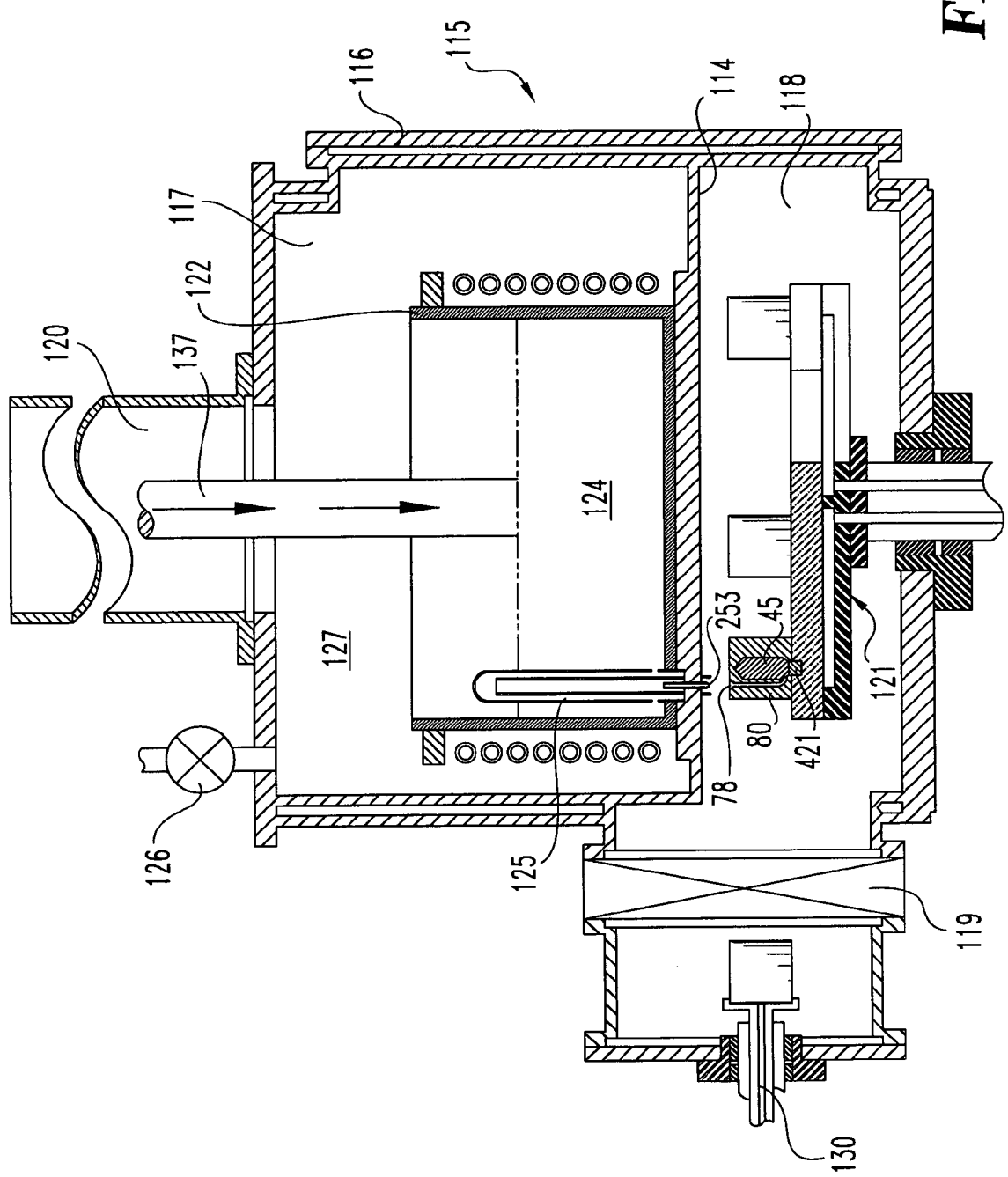
FIG. 33 is an illustrative sectional view of one embodiment of the casting apparatus for casting a component of the present invention.
Figure 34:
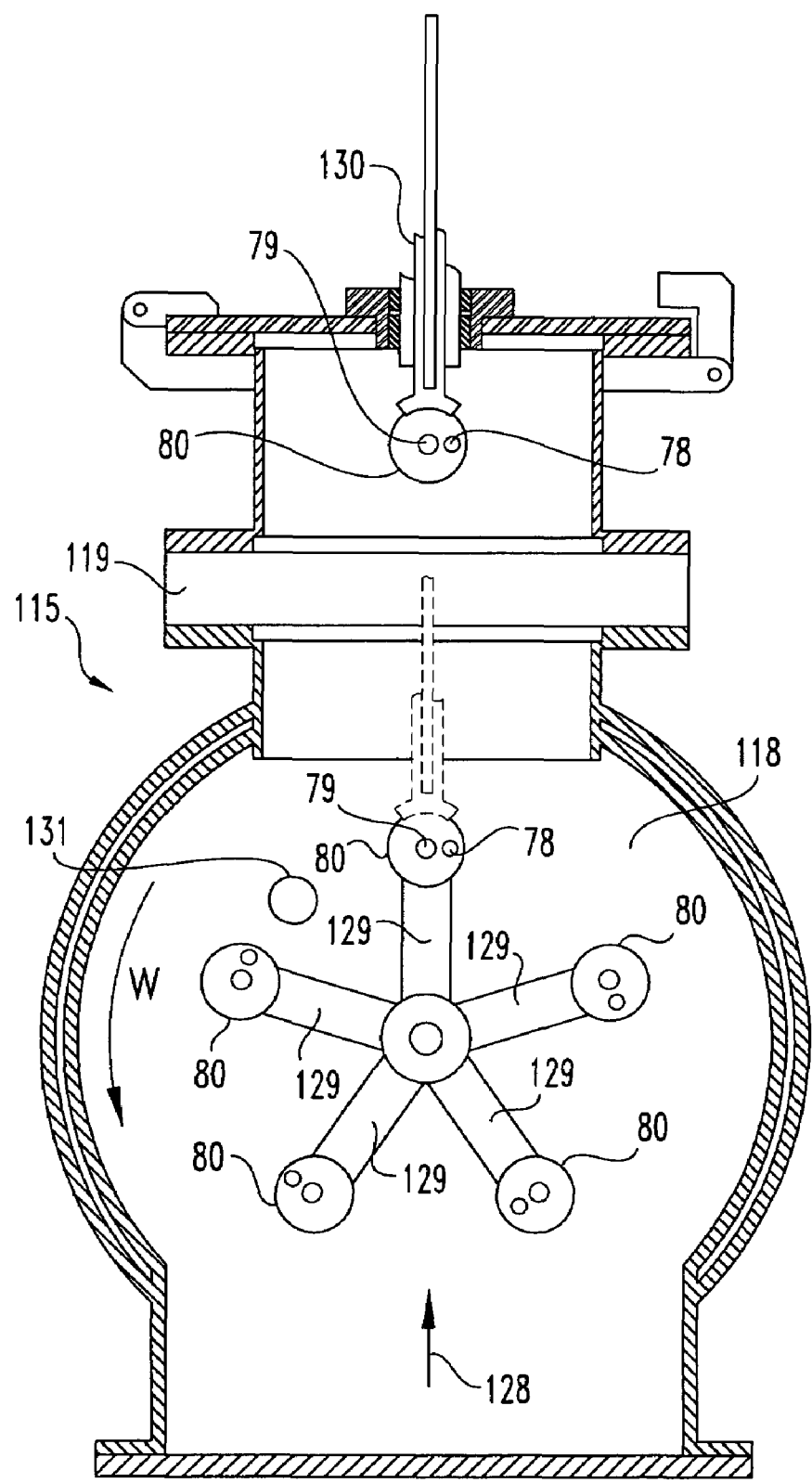
FIG. 34 is an illustrative plan view of the FIG. 33 casting apparatus.

With reference to FIGS. 33 and 34, there is illustrated one embodiment 115 of the casting apparatus of the present invention. The casting apparatus 115 includes a dual chambered vacuum furnace 116 with an upper chamber 117 and a lower chamber 118 separated by a wall 114. The creation of a pressure difference between the chambers is utilized to deliver the charge of molten metal to the mold. A mold entry port 119 allows for the introduction and removal of casting mold containers, such as 80, from the lower chamber 118. In one form of the present invention, the mold entry port 119 defines a fluid tight interlock that enables the maintenance of a vacuum environment within the lower chamber 118 as the mold container 80 is removed or inserted into the lower chamber. Positioned within the lower chamber is a rotatable fixture 121 for holding the molds 80 during the pouring and solidification of the molten metal. A starter seed 421 is positioned with the mold container 80 and coupled with the fixture 121. In a preferred form of the present invention, the fixture 121 includes a heat transfer apparatus in heat transfer communication with the starter seed 421 to withdraw energy from the starter seed so as to directionally solidify the molten metal within the mold 45.

A metal material feeder 120 allows for the introduction of unmelted metal material 137 into the melting crucible 122 located within upper chamber 117. In one form of the present invention, the unmelted metal material 137 is in bar form and is passed into the crucible without interrupting the operation of the casting apparatus 115. In the preferred embodiment, the melting crucible 122 defines a refractory crucible in which the metal material is inductively heated by an induction heater 123. It is understood that other forms of heaters, such as but not limited to levitation and resistant, are contemplated herein for melting and elevating the temperature of the metal material within the crucible 122. The crucible 122 is designed and constructed to hold a quantity of molten metal from, which is removed smaller charges of molten metal to fill the individual molds. The quantity of molten metal that the crucible can hold is preferably in the range of about 5-200 pounds, and more preferably is about 50 pounds. However, as discussed previously the crucible can have sufficient capacity for a continuous process or be sized for an individual single pour. In one embodiment, the crucible holding a reservoir of molten metal reduces temperature fluctuations related to the delivery of charges of molten metal and the introduction of unmelted metal material into the crucible for melting. The molten metal 124 within the melting crucible 122 passes into a molten metal dispensing system. In one embodiment, the molten metal dispensing system defines an apparatus for the precision pouring of molten metal through a nozzle 253 to a precision located input 78 of the fill tube 52. A more detailed description of the molten metal dispensing system 125 and alternate embodiments for dispensing molten metal from the crucible 122 will be discussed below.

In one embodiment of the present invention, the rotatable fixture 121 is liquid cooled and located within the lower chamber 118 of the vacuum furnace. The heat transfer system is coupled with each of the casting molds 45 and maintains a heat transfer pathway during the solidification of the molten metal. The rotatable fixture includes a plurality of mold container holders 129. In the embodiment of FIG. 34, the mold container holders 129 are spoke members, however, other structures are contemplated for holding the molds as they are filled with molten metal and solidified into the particular microstructure desired. The mold container 80 is rotated to a position 131 wherein the filler tubes inlet 78 is in alignment with the pouring nozzle 253.

Figure 35:
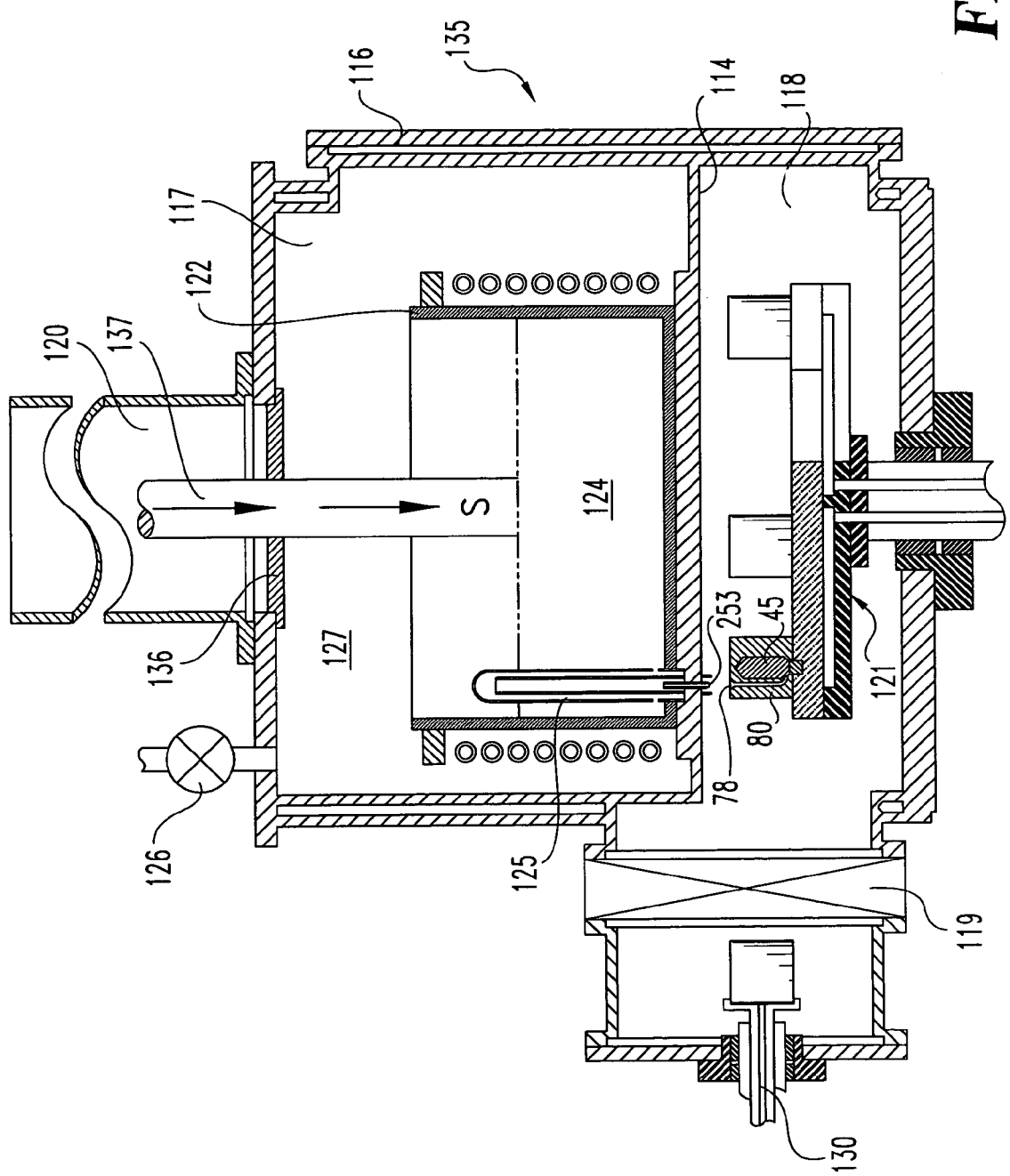
FIG. 35 is an illustrative sectional view of an alternate embodiment of the casting apparatus for casting a component of the present invention.

With reference to FIG. 35, there is illustrated an alternate embodiment 135 of the casting apparatus. The casting apparatus 135 is substantially similar to casting apparatus 115 and like features will be indicated by like feature numbers. The major distinction between the casting apparatus 135 and the casting apparatus 115 is the inclusion of a seal 136 for forming a fluid tight seal with the unmelted metal stock 137 as it moves into the upper chamber 117. In a preferred form, the seal 136 abuts an outer surface 137a of the unmelted metal stock 137. The advancement of the metal stock 137 into the upper chamber 117 in the direction of arrow S will cause an increased pressure acting on the molten alloy 124 in the crucible 122. The increasing of pressure and/or force on the molten metal 124 can be attributed to the advancement of the metal stock 137 into the molten metal 124 and/or by increasing the pressure of an inert gas 127 supplied through the valve 126. In a preferred form the inert gas is argon or helium and the pressure difference associated with the inert gas is 60 milli-torr.

Figure 36:
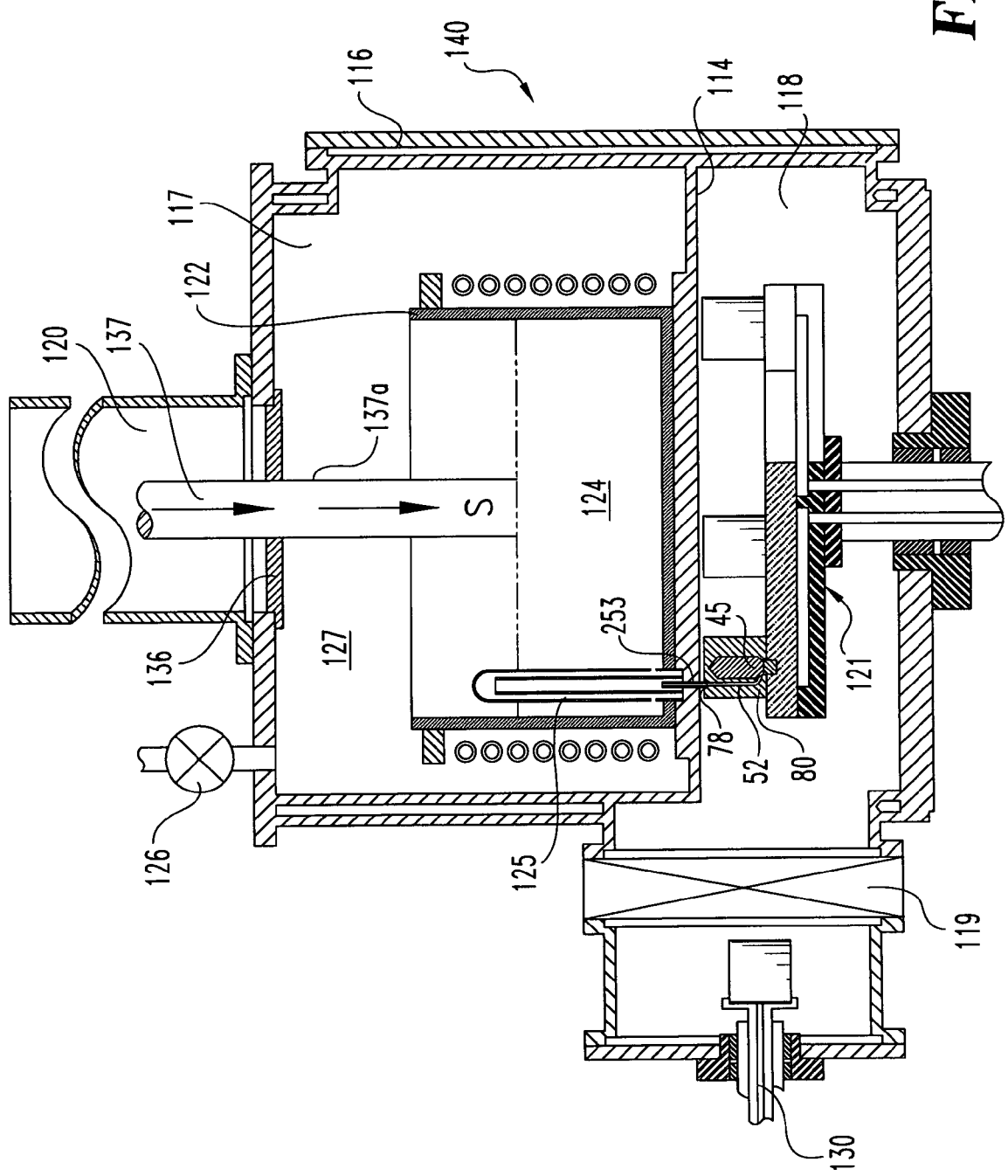
FIG. 36 is an illustrative sectional view of an alternate embodiment of the casting apparatus for casting a component of the present invention.

Referring to FIG. 36, there is illustrated another embodiment 140 of the casting apparatus of the present invention. The casting apparatus 140 is substantially identical to the casting apparatus 135 with like feature numbers indicating like features. The casting apparatus 140 provides for the positioning of nozzle 253 into the inlet 78 of the metal fill tube 52. The coupling of the nozzle to the fill tube enables increased head pressure to improve fill. Further, in one form the system is applicable to control molten metal pressure over time. Therefore, upon discharge of the molten metal from the nozzle there is a confined passageway that the molten alloy passes through to the fill tube 52. In order to effectuate the mating of the nozzle 253 with the inlet 78 of the mold container 80, the rotatable fixture 121 is moveable vertically. The fixture 121 is lowered to receive the mold container 80 from the mold changer 130 and then raised to position the mold container in a seating relationship when it is desired to pour the charge of molten metal into the mold.

Figure 37:
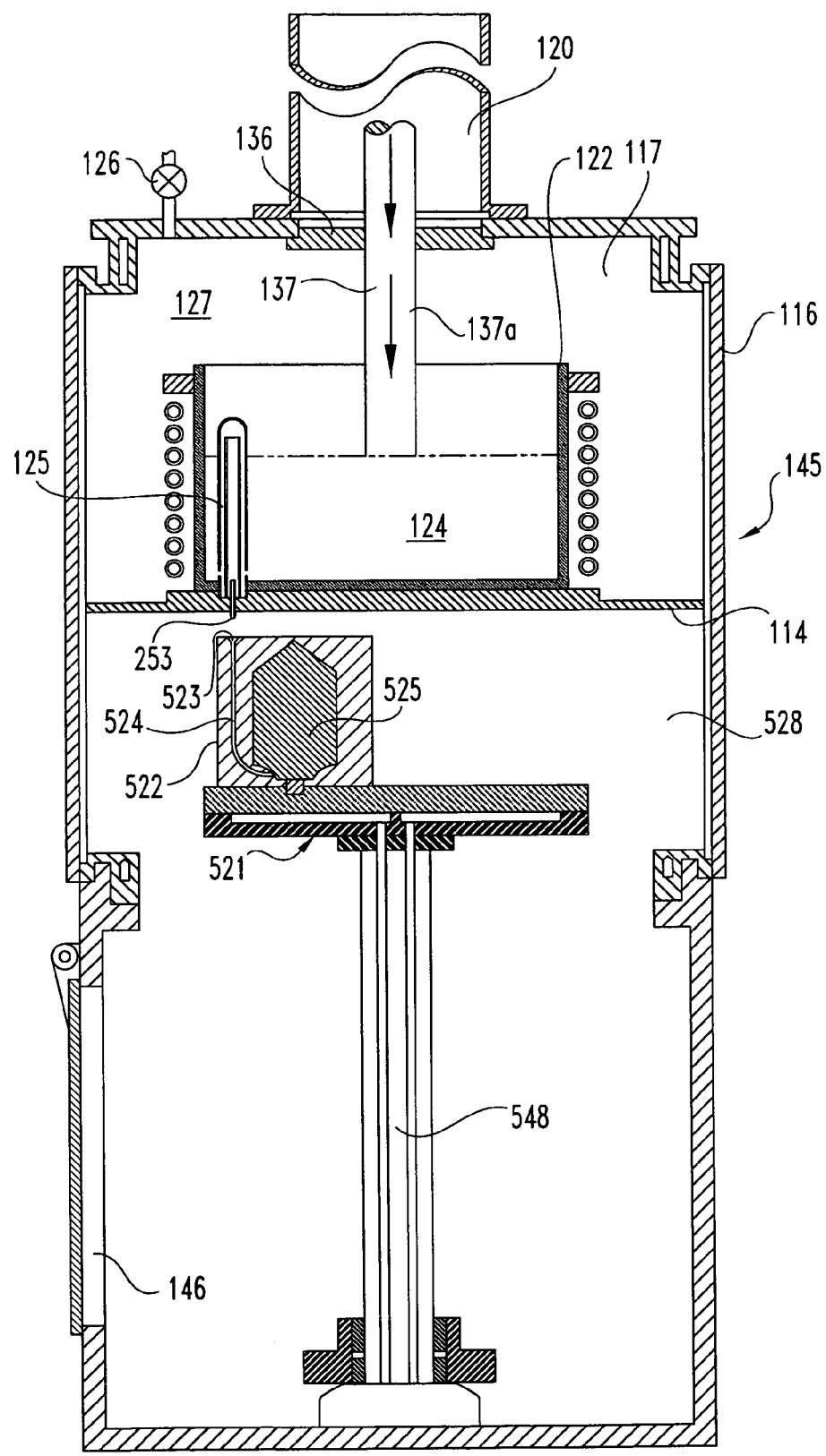
FIG. 37 is an illustrative sectional view of an alternate embodiment of the casting apparatus for casting a component of the present invention.

Referring to FIG. 37, there is illustrated a casting apparatus 145 that is substantially similar to the prior casting apparatuses of FIGS. 33-36, with the notable difference being the capability of casting apparatus 145 to handle larger casting molds. Casting apparatus 145 allows for the introduction of a larger casting mold 525 through a doorway 146 adjoining the lower chamber 528. In one embodiment, the molten metal 124 is delivered from a molten metal dispensing system into the inlet 523 of the mold cavity 525. Thereafter, the mold 522 is withdrawn from the pour position with chamber 528 by an elevator 548.

Figure 38:
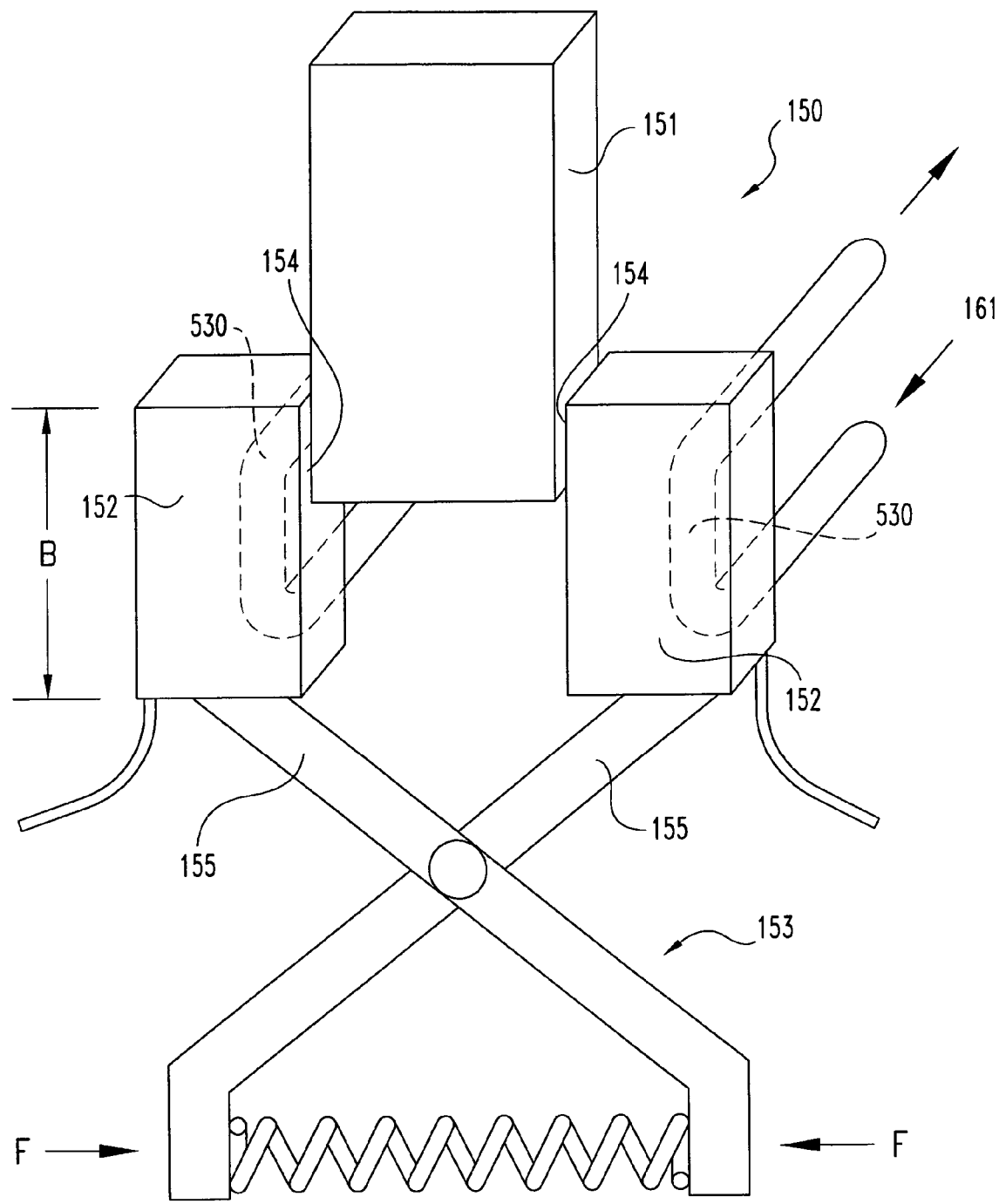
FIG. 38 is an illustrative perspective view of one embodiment of the heat transfer apparatus for transferring energy with a starter seed.

With reference to FIG. 38, there is illustrated one embodiment of a heat transfer apparatus 150 for causing heat transfer with a metallic starter seed 151. In a preferred form the thermal gradient across the seed is varied over time. More particularly, in one embodiment the thermal gradient is low during nucleation and substantially higher during the growth of the crystal. The thermal gradient in one form is greater than about 550° F./inch at the liquid to solid interface. In one embodiment the starter seed 151 has a length 'B' within a range of about 0.25 inches to about 3.00 inches, however, other starter seeds lengths are contemplated herein. Heat transfer apparatus 150 has a pair of jaws 152 that are normally mechanically biased to place a surface 154 of the jaws in an abutting thermally conductive arrangement with the body of the starter seed 151. The jaws 152 maintain a heat transfer path with the starter seed 151 as the molten metal solidifies. A mechanical actuation structure 153 has a pair of moveable arms 155 that are normally spring biased towards a closed position so that the surfaces 154 are maintained in contact with the starter seed 151. The starter seed 151 is readily decoupled from the heat transfer apparatus 150 by applying a mechanical force F to the ends of the arms 154 and 155.

Each of the pair of jaws 152 has an internal cooling passageway 530 therein for receiving a quantity of heat transfer media 161 therethrough to change the temperature of the starter seed 151. While the heat transfer apparatus 150 utilizes an active cooling system the present disclosure also contemplates a passive cooling system. Preferably, the heat transfer media 161 is a coolant/sink for withdrawing energy/heat from the metallic starter seed 151. The heat is passed by conduction from the molten metal solidifying within the mold cavity to the starter seed. Thereafter the passage of cooling media through the jaws 152 causes heat transfer through the starter seed to cause a thermal gradient and directional solidification of the molten metal within the mold cavity. Further, many types of cooling media may be used. The simplest type being solids whose heat capacity and/or phase changes make them attractive, such as but not limited to copper. A fluid, such as water and/or argon may also define the cooling media. Further, heat transfer cooling media with higher heat transfer capacity or heat transfer include liquid metals like aluminum, tin, or mercury.

Figure 39:
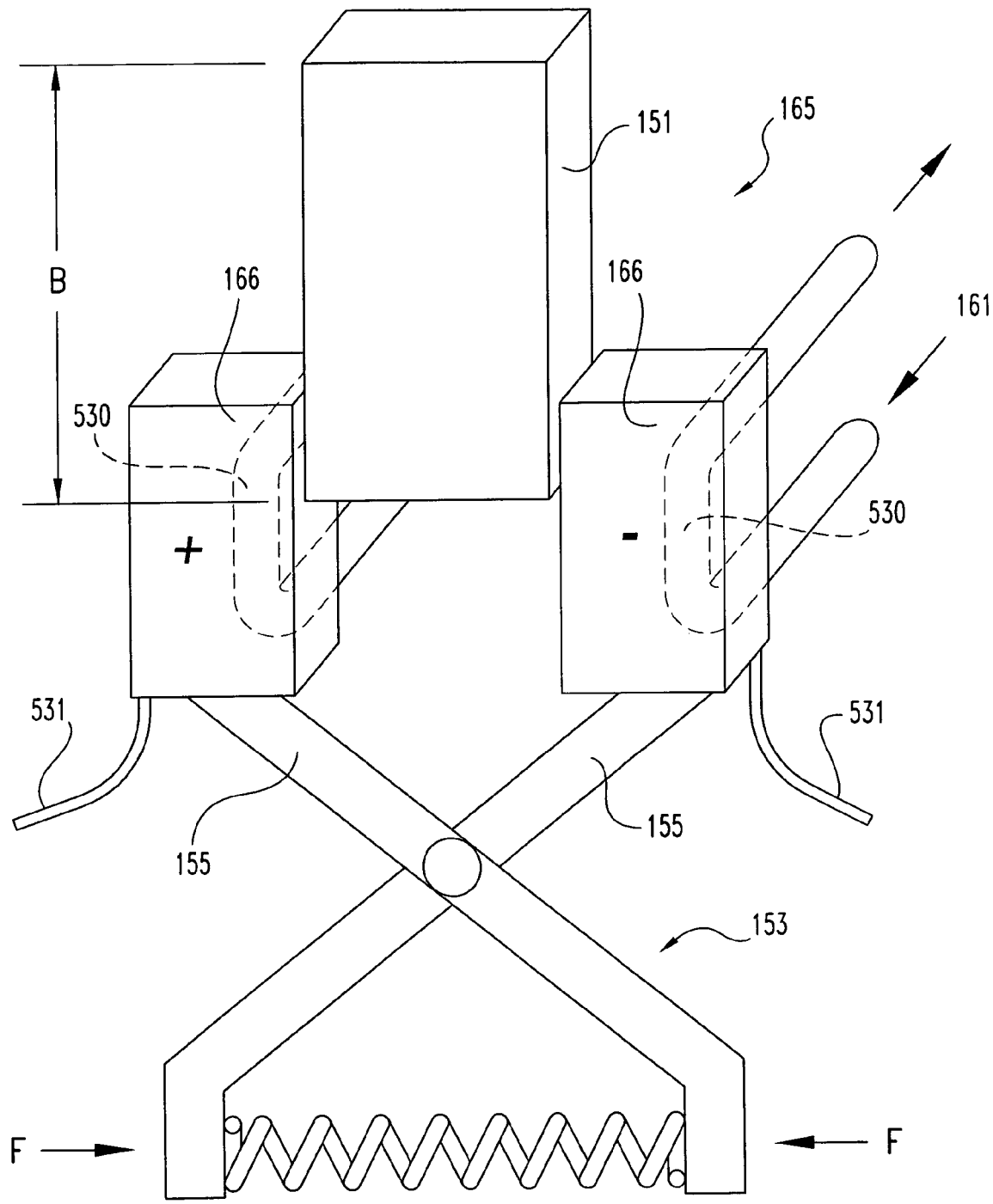
FIG. 39 is an illustrative perspective view of the heat transfer apparatus of FIG. 38, which further comprises an electrical means for heating the starter seed.

Referring to FIG. 39, there is illustrated an alternate embodiment 165 of the heat transfer apparatus of the present invention. In a preferred form the thermal gradient across the seed is varied over time. More particularly, in one embodiment the thermal gradient is low during nucleation and substantially higher during growth of the crystal. The thermal gradient in one form is greater than about 550° F./inch at the liquid to solid interface. The heat transfer apparatus 165 is substantially similar to heat transfer apparatus 150 with a distinction being the capability to locally heat the metallic starter seed 151 through the pair of jaws 166. Further, in one embodiment the starter seed can be locally heated and cooled at the same time. The ability to heat is utilized to adjust the heat flux at the seed and molten metal interface. Since the heat transfer apparatus 150 and the heat transfer apparatus 165 are substantially similar like features will be given the same feature number. In a preferred embodiment of the heat transfer apparatus 165, the jaws 166 are connected to a source of electrical power by leads 531 and the passage of current through the jaws 166 causes the resistant heating of the metallic starter seed 151. The ability to locally heat the metallic starter seed 151 is desirable to control the crystal structure growth from the starter seed 151.

Figure 40:
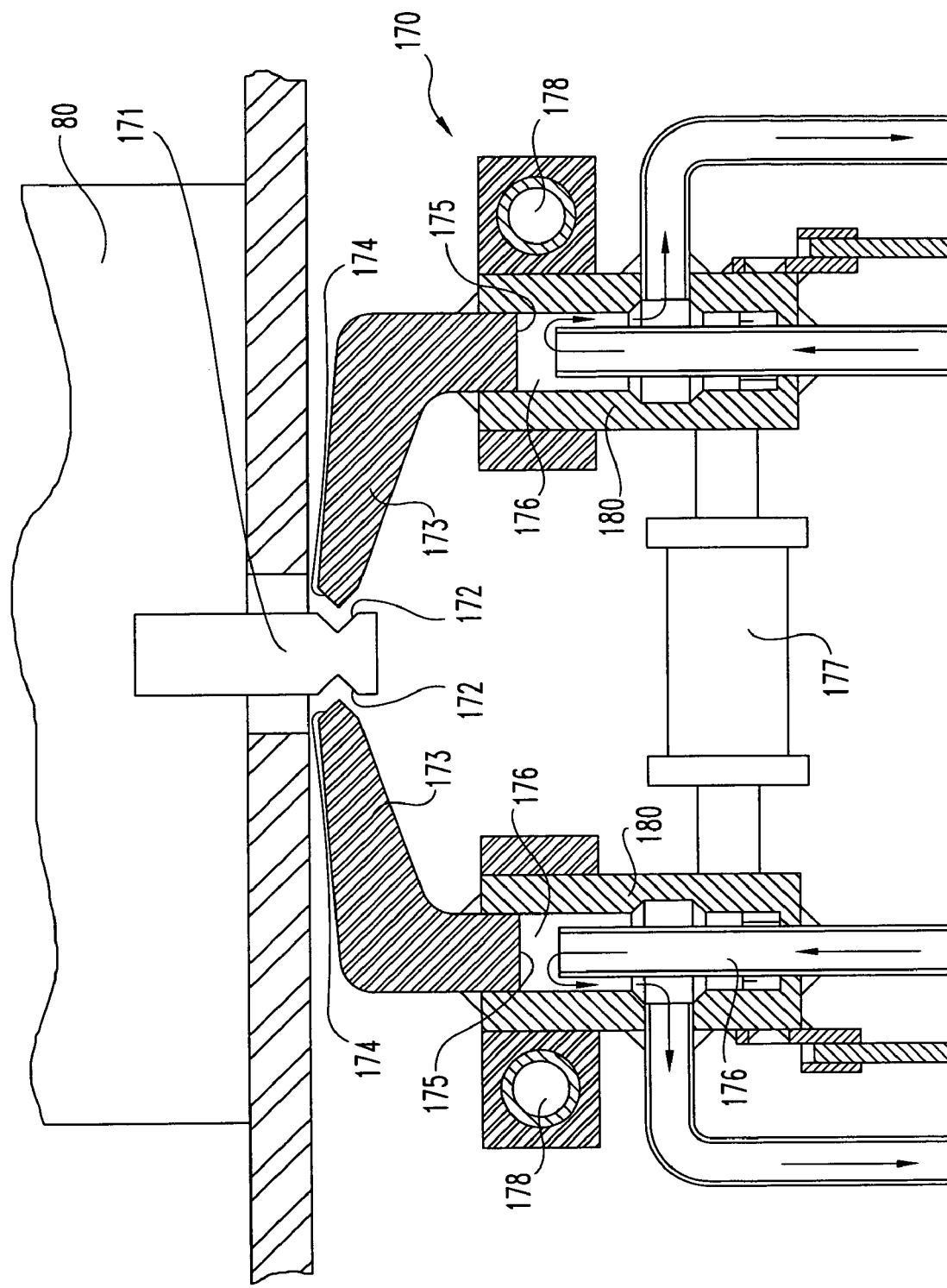
FIG. 40 is an illustrative sectional view of an alternate embodiment of a heat transfer apparatus for transferring energy with a starter seed located within a mold container and the apparatus is in an open position.
Figure 41:
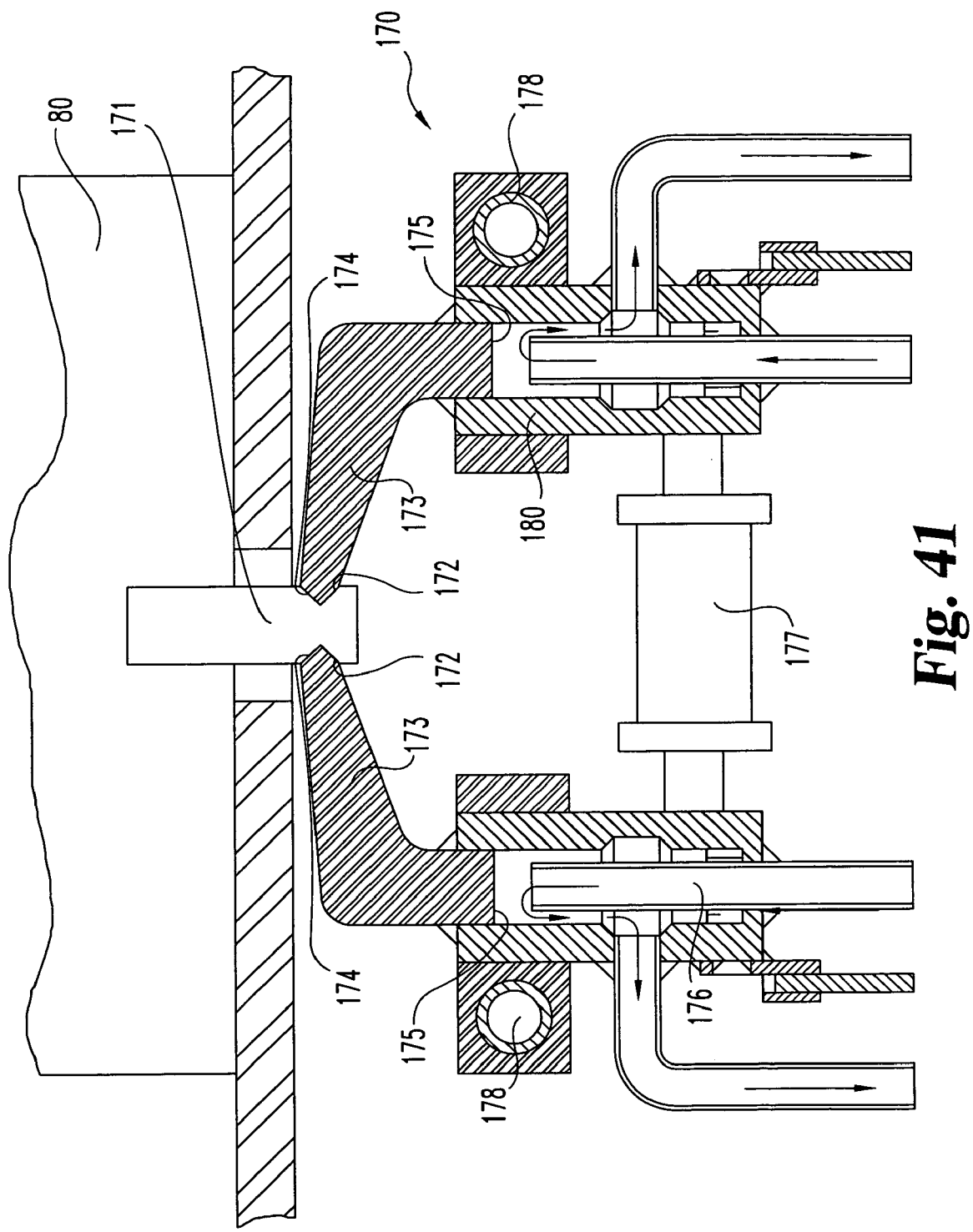
FIG. 41 is an illustrative sectional view of the heat transfer device of FIG. 40 in a closed position.

With reference to FIGS. 40 and 41, there is illustrated another embodiment 170 of a heat transfer apparatus for transferring heat with a metallic starter seed 171. In a preferred form the thermal gradient across the seed is varied over time. More particularly, in one embodiment the thermal gradient is low during nucleation and substantially higher gradient during growth of the crystal. The thermal gradient in one form is greater than about 550° F./inch. Starter seed 171 is substantially similar to the metallic starter seed 151 and additionally includes a pair of precision locating features 172. The metallic starter seed 171 is located within an opening in the mold container 80 and is placed in communication with the metal receiving cavity such that upon pouring molten metal therein a portion of the metallic starter seed 171 receives molten metal thereagainst and is partially melted. The precision locating features 172 are designed and constructed to receive a contacting end 174 of each of a pair of jaws 173. A heat removal end 175 of each of the jaws 173 is positioned within a housing 180. The housing 180 has a passageway 176 therein for the passage of a cooling media. The passage of the cooling media through the housing 180 and across the heat removal ends 175 of the jaws is depicted diagrammatically by arrows. In one embodiment, a local heater 178 is coupled to the mechanical housing 180. Heater 178 is in a thermally conductive heat transfer relationship with the pair of jaws 173 so as to impart energy to the starter seed 171 through the contacting ends 174 of the jaws. The local heater 178 is controlled to adjust the heat flux at the interface between the molten metal and the metallic starter seed. A mechanical actuator 177 is utilized to open the heat transfer apparatus jaws 173 from the position shown in FIG. 40 and then close the pair of jaws 173 to the position shown in FIG. 41. The actuator 177 is preferably a hydraulic actuator, however, other actuators having the properties necessary to function in a casting environment are contemplated herein.

Figure 42:
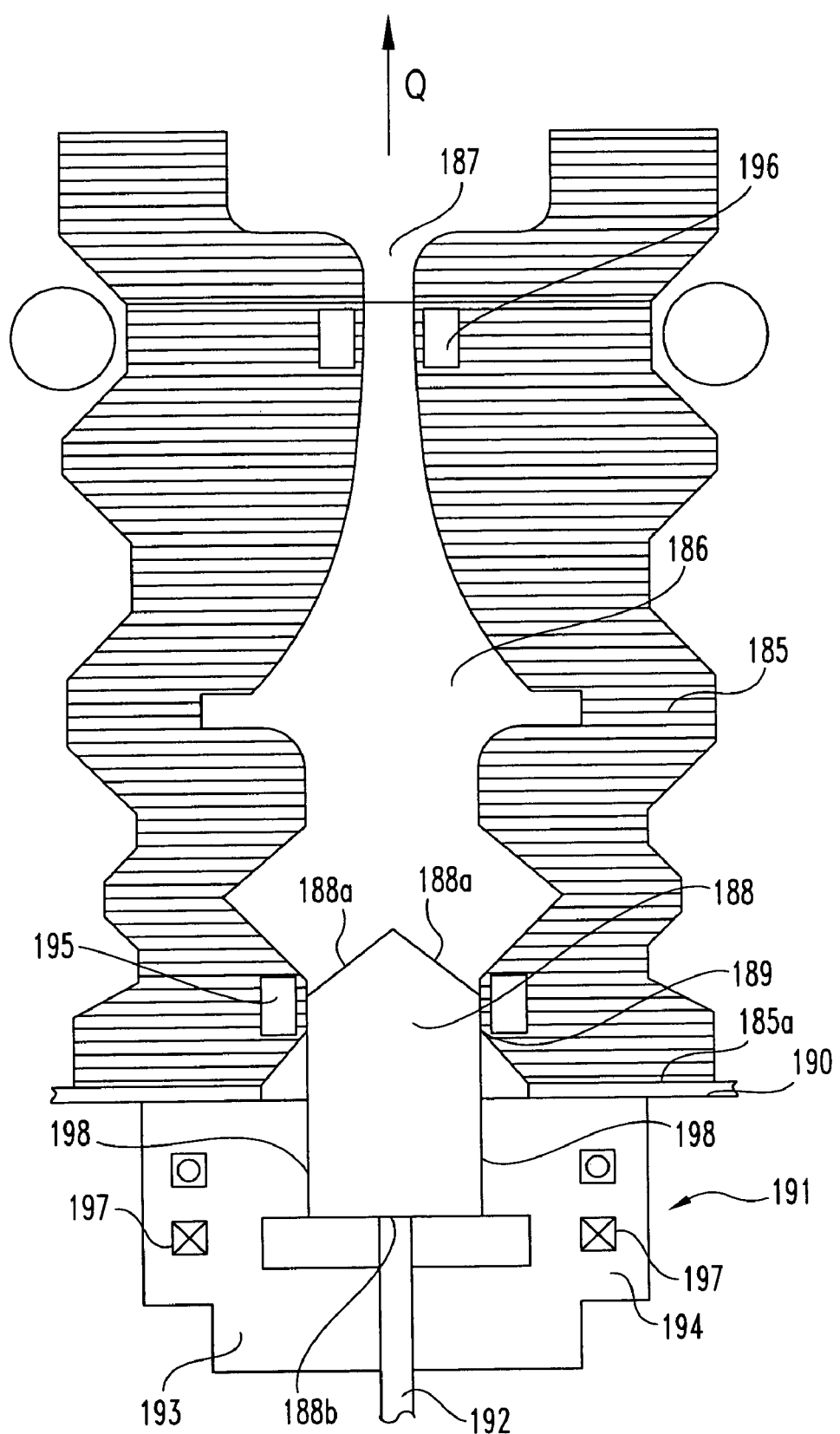
FIG. 42 is an illustrative sectional view of an alternate embodiment of a heat transfer apparatus for transferring energy with a starter seed within a casting mold.

With reference to FIG. 42, there is illustrated a mold 185 having an internal cavity 186 for the receipt of molten metal. The mold 186 has a vent end 187 for the passage of gaseous material to and from the internal cavity 186 and starter seed receiving inlet 189 for receiving and snugly engaging a metallic starter seed 188. The metallic starter seed 188 is positioned to receive molten metal on a surface 188a. The metallic starter seed is not intended to be limited to the seed shape shown in FIG. 42 as other seed shapes are contemplated herein. Located within the mold 185 is a starter seed auxiliary heater 195 and a supplemental mold heater 196. An insulator 190 is positioned between a lower surface 185a of the mold 185 and a heat transfer apparatus 191 to minimize heat transfer from the casting mold 185. In a preferred form the thermal gradient across the seed is varied over time. More particularly, in one embodiment the thermal gradient is low during nucleation and substantially higher during growth of the crystal. The thermal gradient in one form is greater than about 550° F./inch at the liquid to solid interface.

The heat transfer apparatus 191 includes a pair of arms 193 and 194 that are moveable into a position to abut and maintain contact with a surface 198 of the starter seed 188. The abutting relationship of the heat transfer apparatus 191 and the starter seed 199 is maintainable until the arms 193 and 194 are positively released from the starter seed 188. A precision locating member 192 contacts a bottom surface 188b of the starter seed 188 so as to precisely locate the vertical height of the melt surfaces 188a within the molten metal receiving cavity 186. A cooling media passageway 197 is formed in each of the pair of arms 193 and 194 for the passage of cooling media therethrough. The molten metal within the cavity 185 transfers heat to the starter seed 188 which in turn transfers the heat through the surfaces 198 to the chilled pair of arms 193 and 194. The cooling media flowing through the passageways 197 removes the heat from the arms 193 and 194. Thus a temperature gradient is created through the starter seed 188 to cause directional solidification of the molten metal within the cavity 186.

Figure 43:
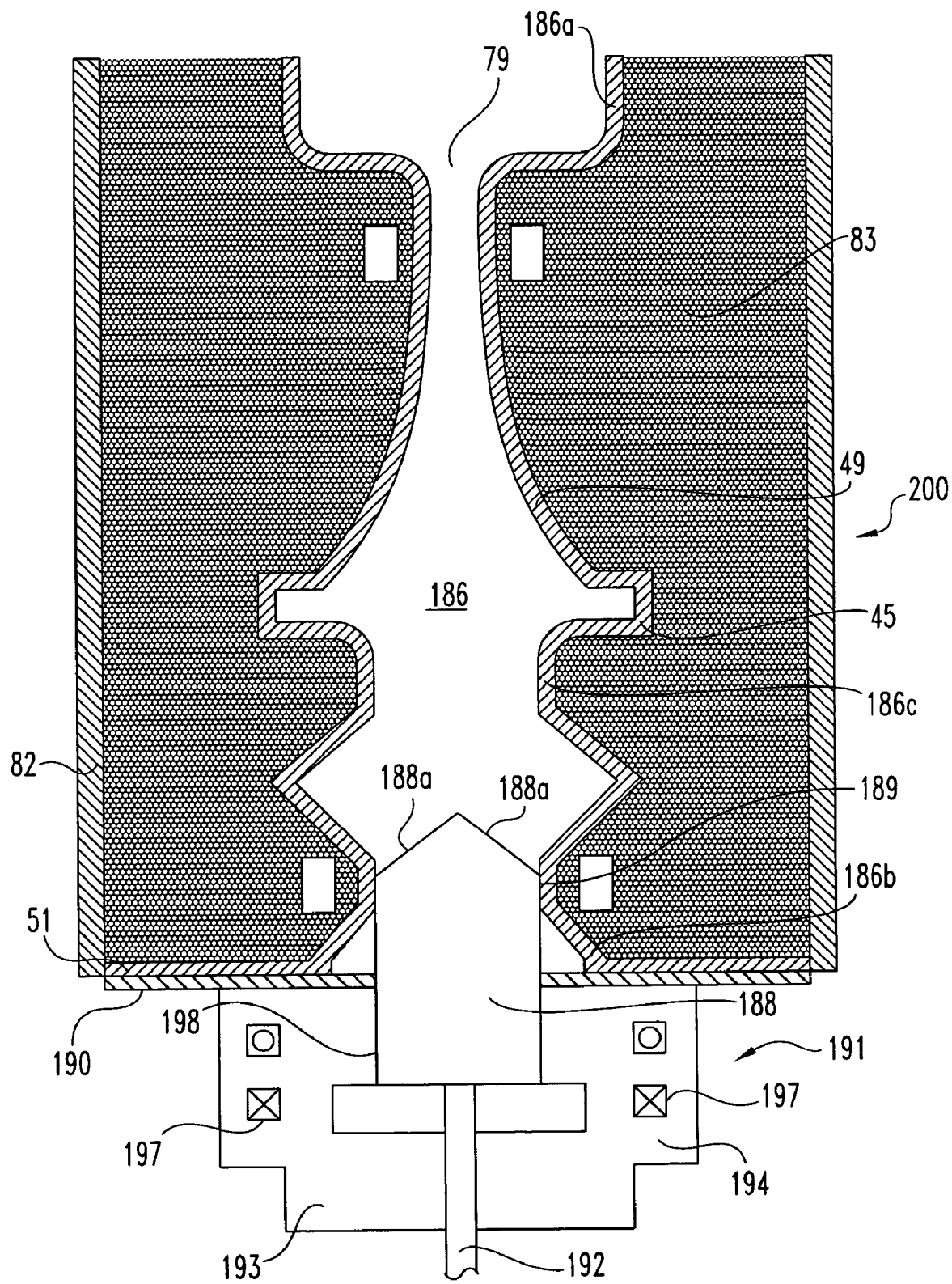
FIG. 43 is an illustrative sectional view of an alternate embodiment of the heat transfer apparatus for transferring energy with a starter seed located within a casting.

With reference to FIG. 43, there is illustrated a mold container 200 coupled with the heat transfer apparatus 191. The mold container 200 is substantially similar to mold container 80 and substantially identical features will be indicated by like feature numbers. The thin wall integral mold 45 has an internal cavity 186 with a top portion 186a, a bottom portion 186b, and a side portion 186c. Positioned proximate the top portion 186a is a vent 79 for allowing the passage of hot gaseous material to and from the cavity 186. The starter seed receiving inlet 189 is formed in the bottom portion 186b, and the side portion 186c is insulated to minimize heat transfer from the side wall 49 of the mold. In a preferred form the thermal gradient across the seed is varied over time. More particularly, in one embodiment the thermal gradient is low during nucleation and substantially higher during growth of the crystal. The thermal gradient in one form is greater than about 550° F./inch at the liquid to solid interface. The shape of the molten metal receiving cavity 186 is purely illustrative and is not intended to be limiting to the present invention.

Figure 44:
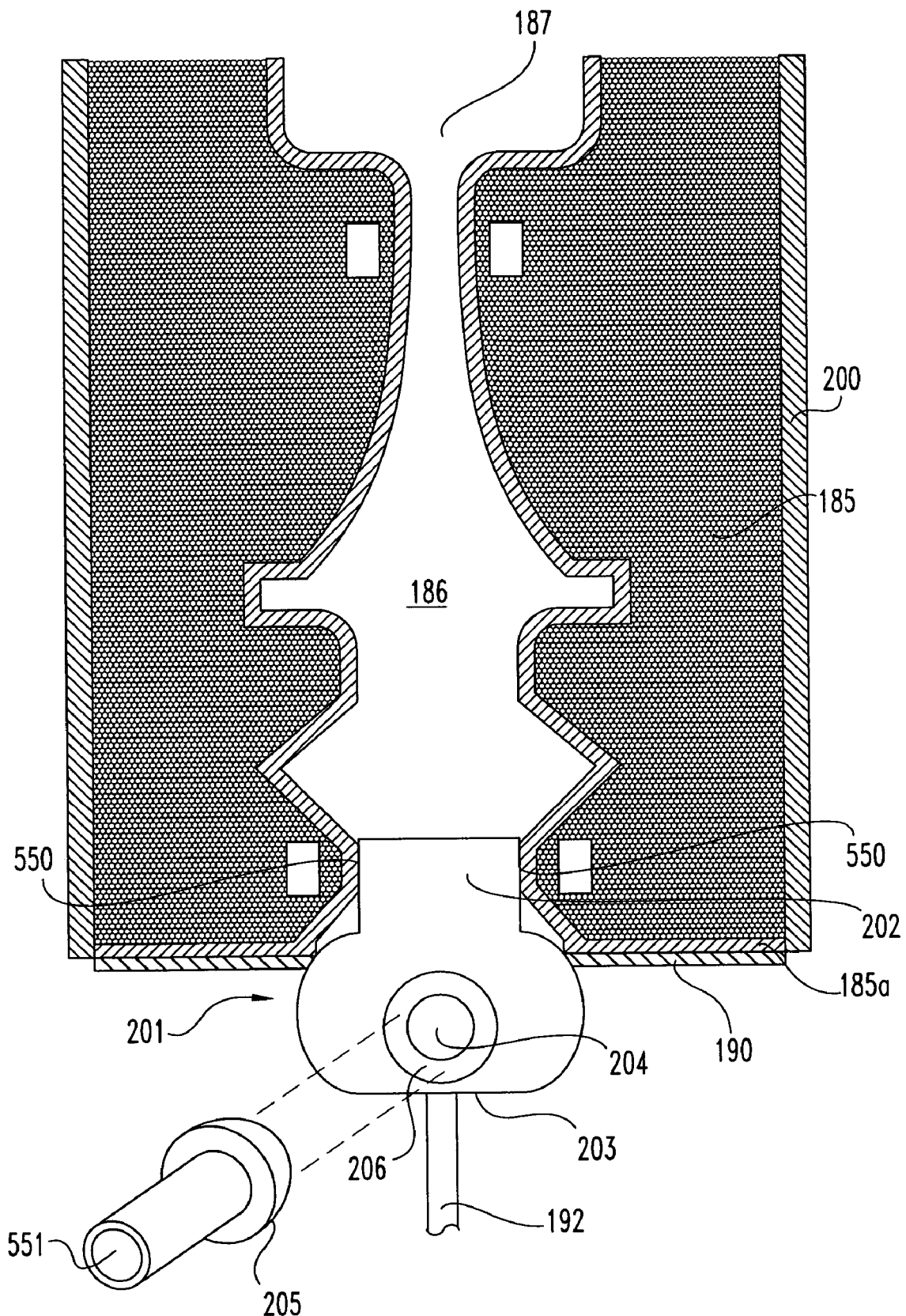
FIG. 44 is an illustrative sectional view of an alternate embodiment of a heat transfer apparatus for removing heat from a casting mold.

Referring to FIG. 44, there is illustrated an alternate embodiment 201 of a heat transfer apparatus for withdrawing heat through a starter seed positioned within a casting mold. In a preferred form the thermal gradient across the seed is varied over time. More particularly, in one embodiment the thermal gradient is low during nucleation and substantially higher during growth of the crystal. The thermal gradient in one form is greater than about 550° F./inch. In one embodiment, the integral heat transfer apparatus 201 has a starter seed portion 202, a precision locating surface 203, and a passageway 204 therethrough. The starter seed portion 202 is received within and abuts a surface 550 of the thin ceramic shell of the mold. The vertical position of the starter seed portion 202 is fixed by the precision locating member 192 which abuts the precision locating surface 203. The passageway 204 is formed through the heat transfer apparatus 201 and is designed for the passage of a heat transfer media. More particularly, the passageway is designed to be coupled with a pair of couplers 205 (only one illustrated) that are firmly engageable and alignable with a bearing surface 206 formed on the heat transfer apparatus. With the pair of couplers 205 connected with the heat transfer apparatus 201 and aligned with the passageway 204, a flow of heat transfer media can pass through a passageway 551 within the coupler 205 and into the passageway 204 of the heat transfer apparatus 201.

The bearing surface 206 and a corresponding surface on each of the couplers 205 creates a substantially fluid tight seal to prevent the leakage of the cooling media around the joint. Further, in one embodiment, the bearing surface 206 defines an electrical contact such that upon the pair of couplers 205 being mated with the heat transfer apparatus 201 a circuit is completed and current can be passed through the heat transfer apparatus 201 to create a heater for heating the seed portion 202. The heat transfer apparatus 201 allows for the localized heating of the starter seed portion 202 and the withdrawal of energy from the molten metal solidifying in the mold on the starter seed portion 202.

Figure 45:
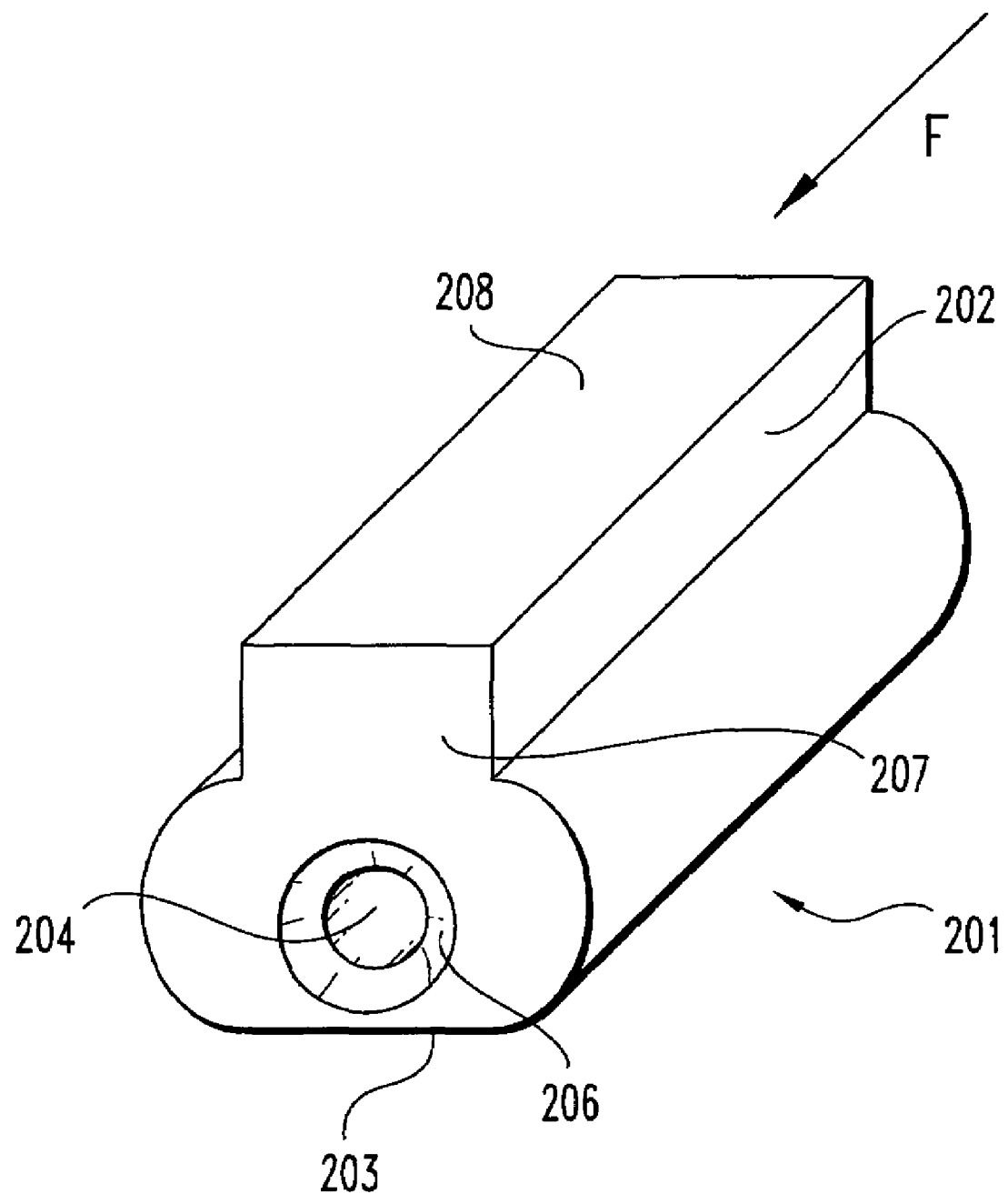
FIG. 45 is a perspective view of the heat transfer apparatus of FIG. 44.

With reference to FIG. 45, there is illustrated a perspective view of one embodiment of the energy transfer apparatus 201 removed from its abutting relationship with the thin ceramic shell of the mold. In one form, the energy transfer apparatus 201 has an integral main body 207, which includes the starter seed portion 202. The starter seed portion is positionable within the seed receiving portion of a casting mold such that molten metal can flow across the melt surface 208 in the direction of arrow F. However, the present invention is not limited to an integral system and including an assembled system having a variety of geometry's and flow paths.

Figure 46A:
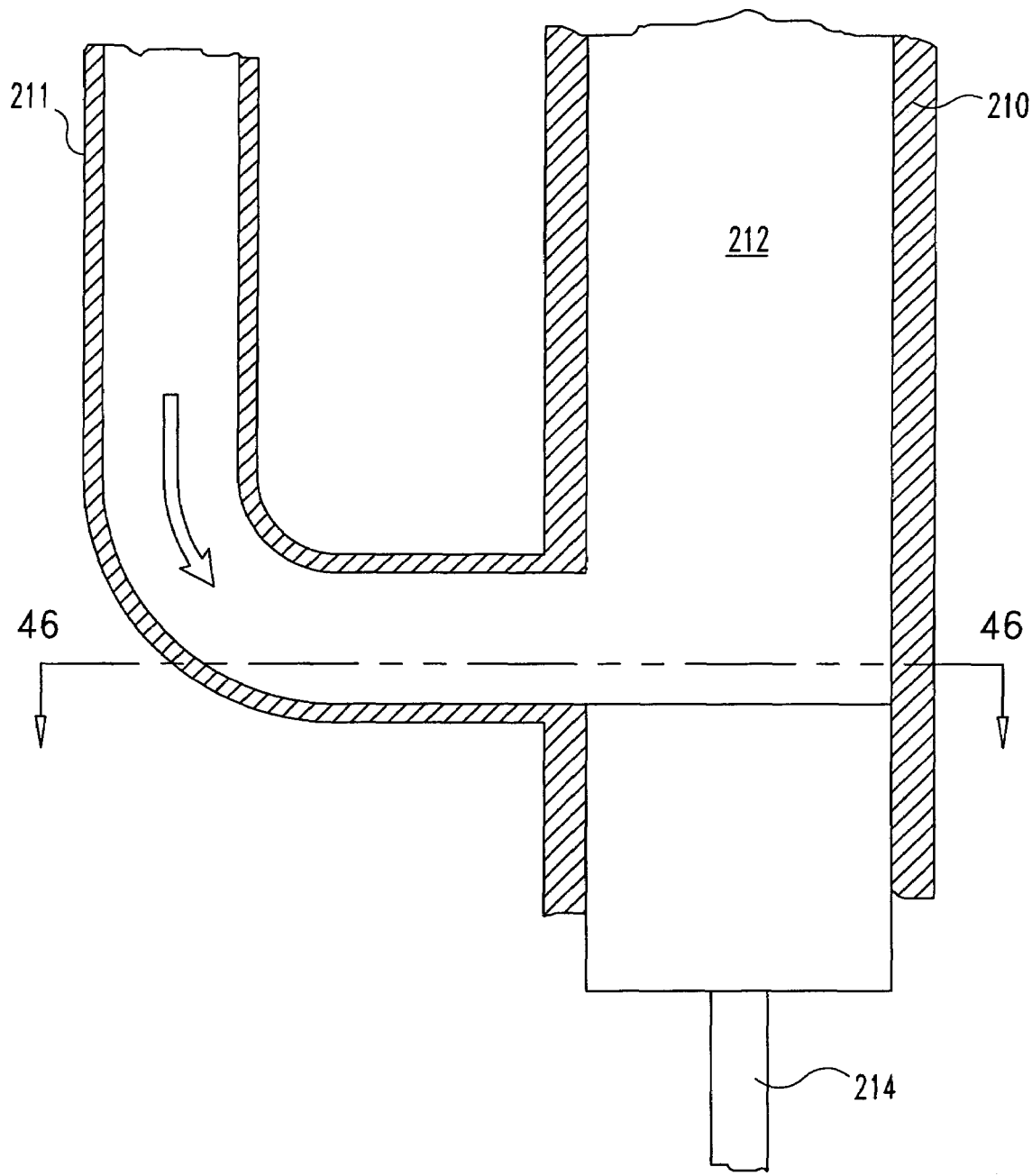
FIG. 46A is an illustrative view of a portion of a casting mold having a metallic starter seed therein.
Figure 46B:
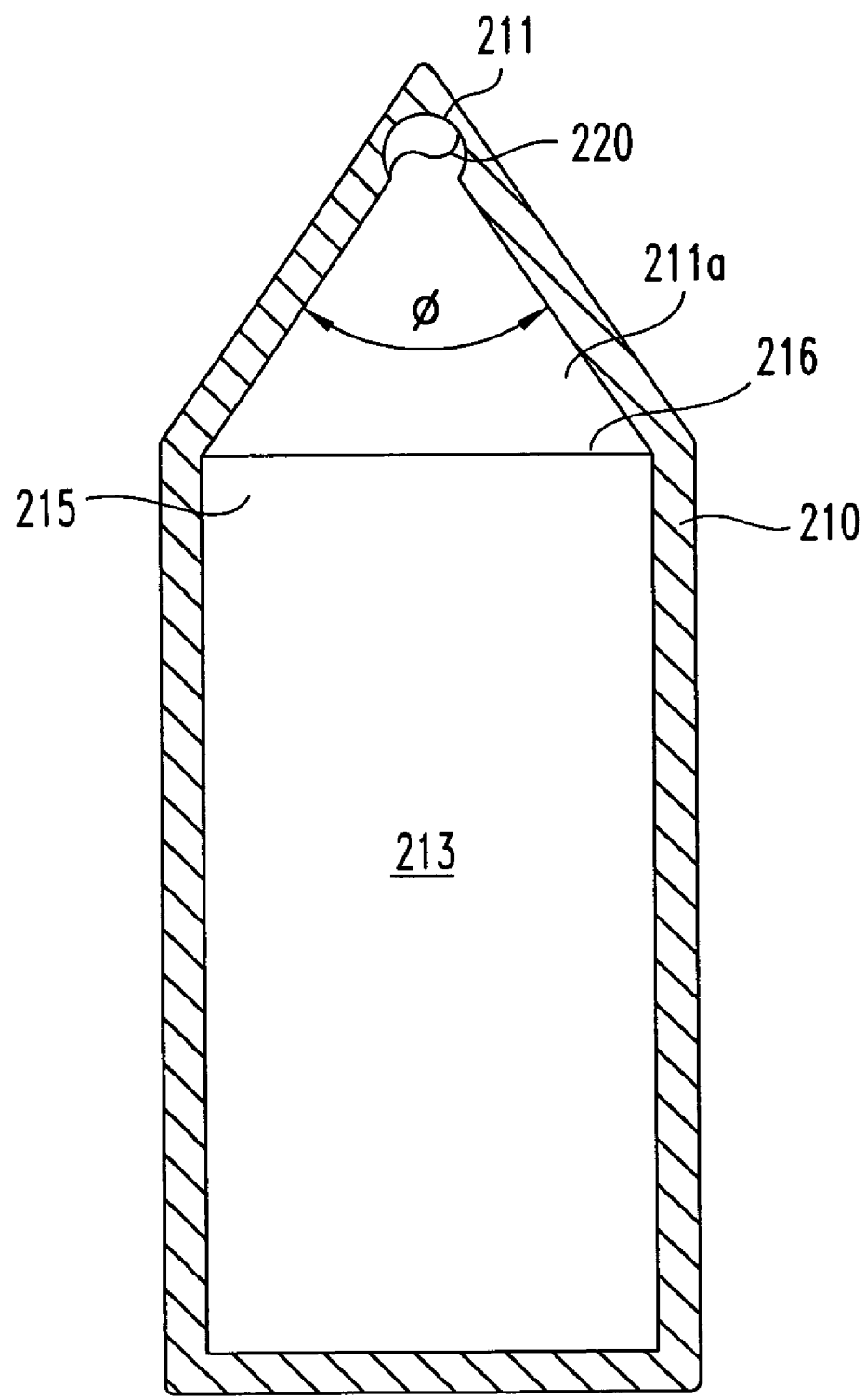
FIG. 46B is an illustrative sectional view taken along lines 46-46 of FIG. 46A.

With reference to FIGS. 46A and 46B, there is illustrated a portion of a casting mold 210. In a preferred form, the casting mold 210 is formed by selective laser activation or three dimensional printing, however, the mold is not intended to be limited herein to a mold made by these processes and can be produced by other processes known to one of ordinary skill in the art. The casting mold 210 includes a pour tube 211 that provides a passageway for the delivery of molten metal to the cavity 212 within the integral casting mold 210. In one embodiment, a starter seed 213 is positioned within the casting mold 210 and is located by a locating member 214 so as to place the initial melting surface 215a of the starter seed 213 at a predetermined position relative to the discharge portion 216 of a diffuser 211a. The diffuser 211a provides for the full coverage with molten metal of the initial melting surface 215a of the starter seed. The walls of the diffuser portion 211a open at an angle φ, which is preferably within the range of 15-45 degrees. The diffuser portion 211a slowing the movement of the molten metal across the starter seed to increase the energy transferred to the starter seed 213 during an initial melt of a portion of the starter seed body. In one embodiment, the elevation of the initial melting surface 215 and configuration of the diffuser portion 211a are selected to maximize the amount of heat removed from the molten metal and transferred to the starter seed 213 in order to melt a portion of the seed.

In one embodiment of the present invention a meltable member 220 is positionable within the casting mold 210 such that the flow of molten metal melts the member 220 and delivers the material comprising the meltable member along with the molten metal into the mold cavity 212. The meltable member 220 is positioned within a portion of the pour tube 211. However, the placement of the meltable member 220 may be in other places such as the diffuser 211a. In a preferred form, the member 220 is a wire or mesh that does not substantially impede the flow of molten metal through the fill tube 211 and is readily melted by the heat of the molten metal. The meltable member 220 is melted and mixes with the molten alloy and imparts properties to the cast component such as, but not limited to improved ductility and/or oxidation resistance. In one form the meltable member 220 is formed of a reactive metal such as, but not limited to a rare earth elements.

Figure 47C:
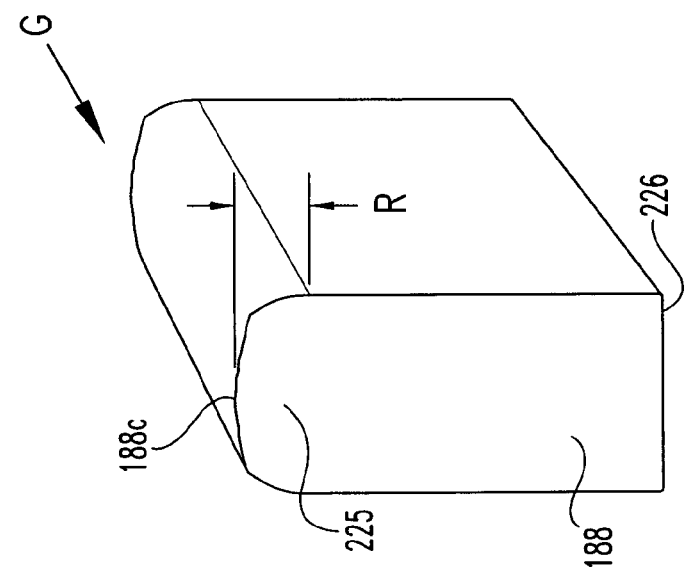
FIG. 47C is an illustrative perspective view of the metallic starter seed of FIG. 47B after an additional quantity of molten metal has passed thereover.
Figure 47B:
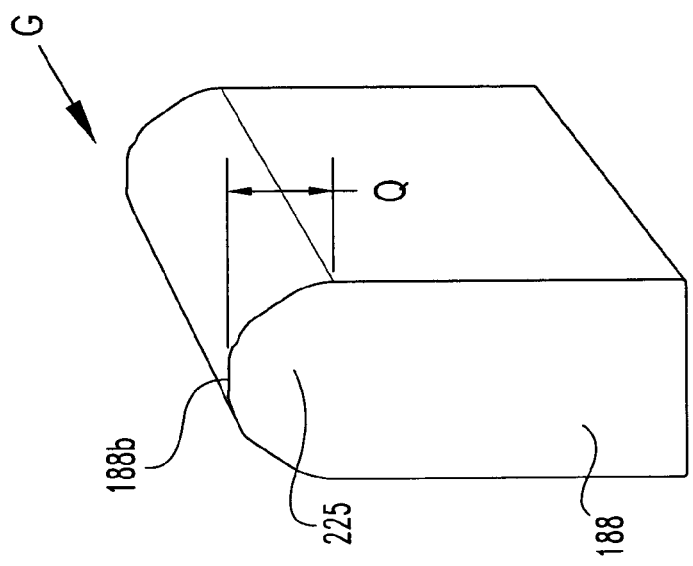
FIG. 47B is an illustrative perspective view of the metallic starter seed of FIG. 47A after a quantity of molten metal has passed thereover.
Figure 47A:
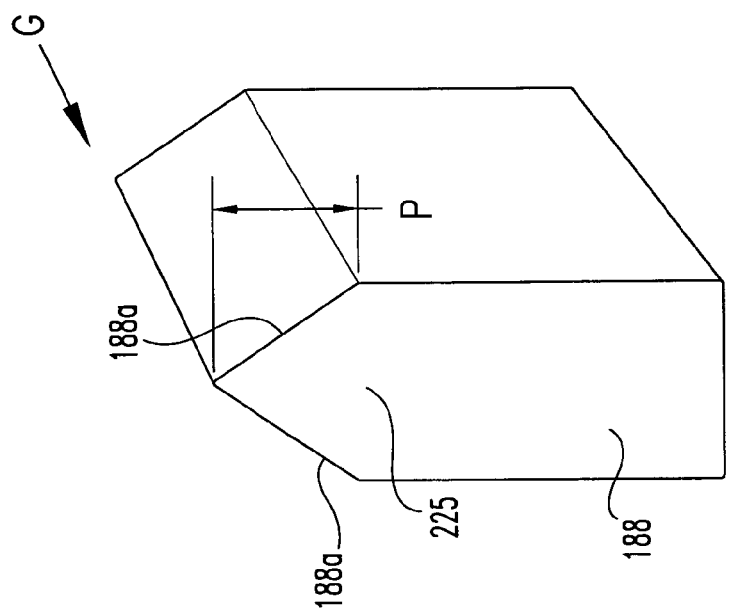
FIG. 47A is an illustrative perspective view of one embodiment of a metallic starter seed.

With references to FIGS. 47A-47C, there is illustrated the melt back of a portion of a starter seed 188 as molten metal flows in the direction of arrow G across the melt surface 188a. The starter seed 188 is a metallic member having a melt end and a base end that is contactable with a heat transfer device to transfer heat to and/or from the member. A melt acceleration portion 225 is formed at the melt end and has an initial height of material indicated by P. With reference to FIG. 47A, there is shown the melt portion in an unmelted state and it has a cross sectional area less than the cross sectional area of the base end. After a period of time in which the molten metal has flowed across surface 188a, the melt portion 225 has been partially melted back. Surface 188b (FIG. 47B) indicates the profile of the melt portion 225 after having molten metal passed thereon for a period of time, and its height is indicated by Q. Moving to FIG. 47C, the process of melting continues as additional molten metal flows across the melt portion 225 and the profile is represented by 188C, and has a height indicated by R. As the melting of the melt portion 225 continues, the surface area of the melt portion from which heat transfer from the solidifying metal occurs begins to approach the same size as the surface area of the base 226 of the starter seed 188. When the melt back of the seed is completed in one embodiment the melt portion has a cross sectional area substantially equal to the base end so as not to restrict heat transfer from the molten metal to the starter seed.

Figure 48:
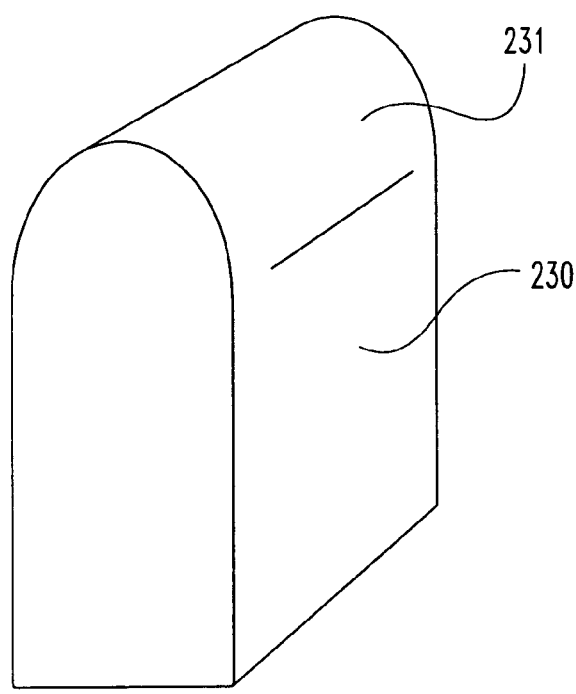
FIG. 48 is an illustrative view of an alternate embodiment of a starter seed of the present invention.
Figure 49:
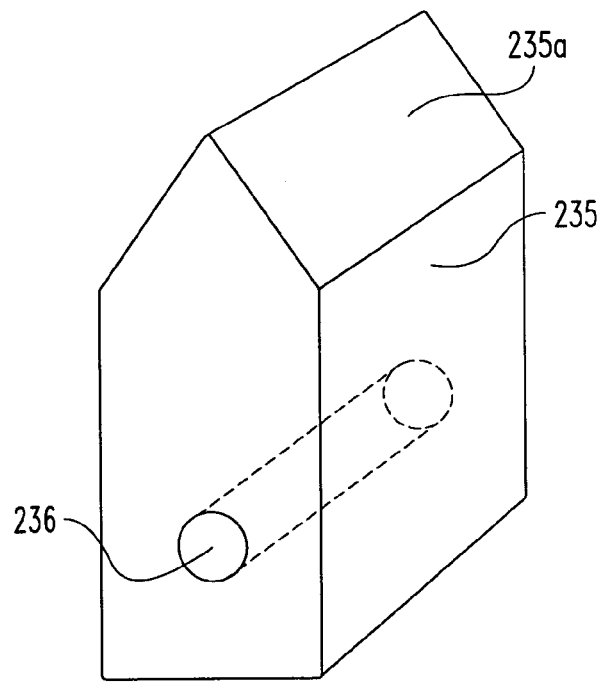
FIG. 49 is an illustrative view of a starter seed of the present invention including a passage therethrough.

With reference to FIGS. 48 and 49, there are illustrated other embodiments of starter seeds contemplated herein. Starter seed 230 has a melt acceleration portion 231 that is semi-circular in cross section, however, other geometric shapes such as but not limited to a grooved surface and/or a knurled surface are contemplated herein. The starter seed 235 has a melt portion 235a and a passageway 236 formed therein for the passage of a heat transfer media. It is understood herein that the starter seed can have other geometric shapes and may not have a melt acceleration portion 235a, while still having a passageway for the flow of a heat transfer material. In an alternate embodiment there is contemplated a plurality of internal passageways to form a more intricate cooling passageway.

Figure 50:
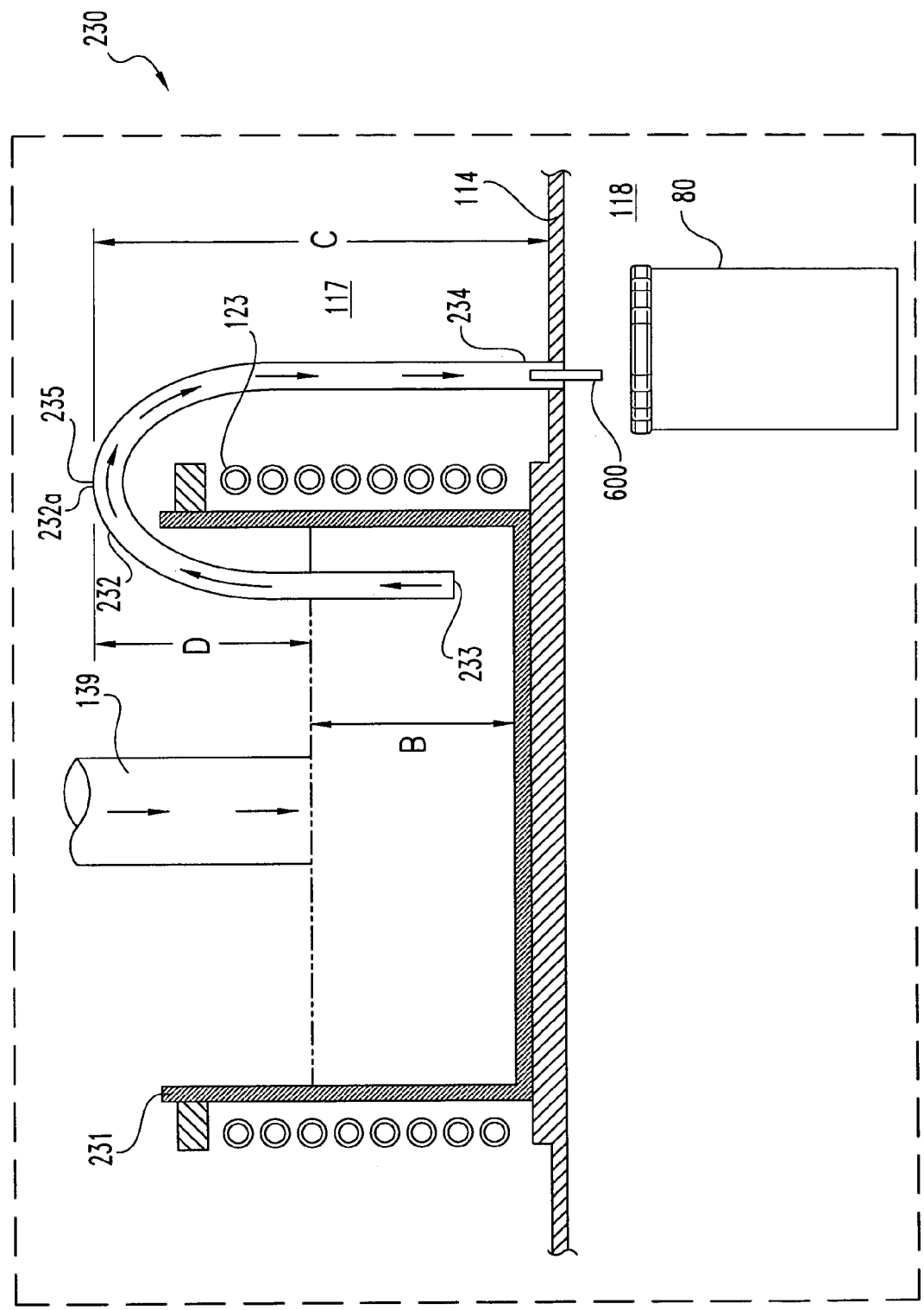
FIG. 50 is an illustrative sectional view of an alternative embodiment of the molten metal delivery system located within a casting apparatus.

With reference to FIG. 50, there is illustrated another embodiment 230 of the apparatus for dispensing molten metal from a casting apparatus, such as casting apparatus 115. The melting crucible 231 is substantially identical to the melting crucible 122 except that the molten metal does not pass through an aperture in the bottom wall member. A molten metal delivery passageway 232 has an input end 233 and a discharge end 234. Input end 233 is fed molten metal from beneath the surface of the molten metal and the passageway 232 is filled to the height of the column of molten metal within the crucible 231. The discharge of the molten metal from the delivery passageway 232 into the mold container 80 is controlled by the difference in pressure between the chamber 117 and chamber 118.

The molten metal delivery passageway 232 includes a positive molten metal flow control feature. In one embodiment the portion 232a of the passageway 232 functions as a flow control means. Upon the application of sufficient pressure to the molten metal within the crucible the passageway 232 is filled with molten metal. Upon releasing the applied pressure molten metal will return to the crucible and be maintained at a height within the passageway substantially equal to the height of the molten metal within the crucible. In one form, the delivery of molten metal from portion 232a and out nozzle 600 will have a predetermined pressure and velocity controlled by the height "C" plus the pressure difference between chamber 117 and chamber 118. The activation energy necessary to fill the passageway 232 is indicated by "D".

In a preferred form of the apparatus the discharge of molten metal is controlled by the application of pressure to the molten metal within the crucible 231. As discussed previously, the pressure applied to the molten metal can be created by advancing the metal stock 137 into the molten metal and/or by applying pressure to the surface of the molten metal with an inert gas. Upon the increase in pressure on the surface of the molten metal, additional molten metal is forced through the input end 233 and up through the delivery passageway 232 to the output end 234. At the output end 234 the molten metal passes through a nozzle 600 to the mold container inlet. Upon release of the pressure on the molten metal, the molten metal beyond point 235 is delivered, and the remaining molten metal within the passageway remains there and/or is returned to the crucible 231. Therefore, the delivery of molten metal to the mold container 80 is controlled by the difference in pressure between chamber 117 and 118. In an alternate embodiment, the passage of molten metal to the mold container 80 could be effectuated by lowering the pressure around the container instead of raising the pressure on the molten metal.

Figure 51:
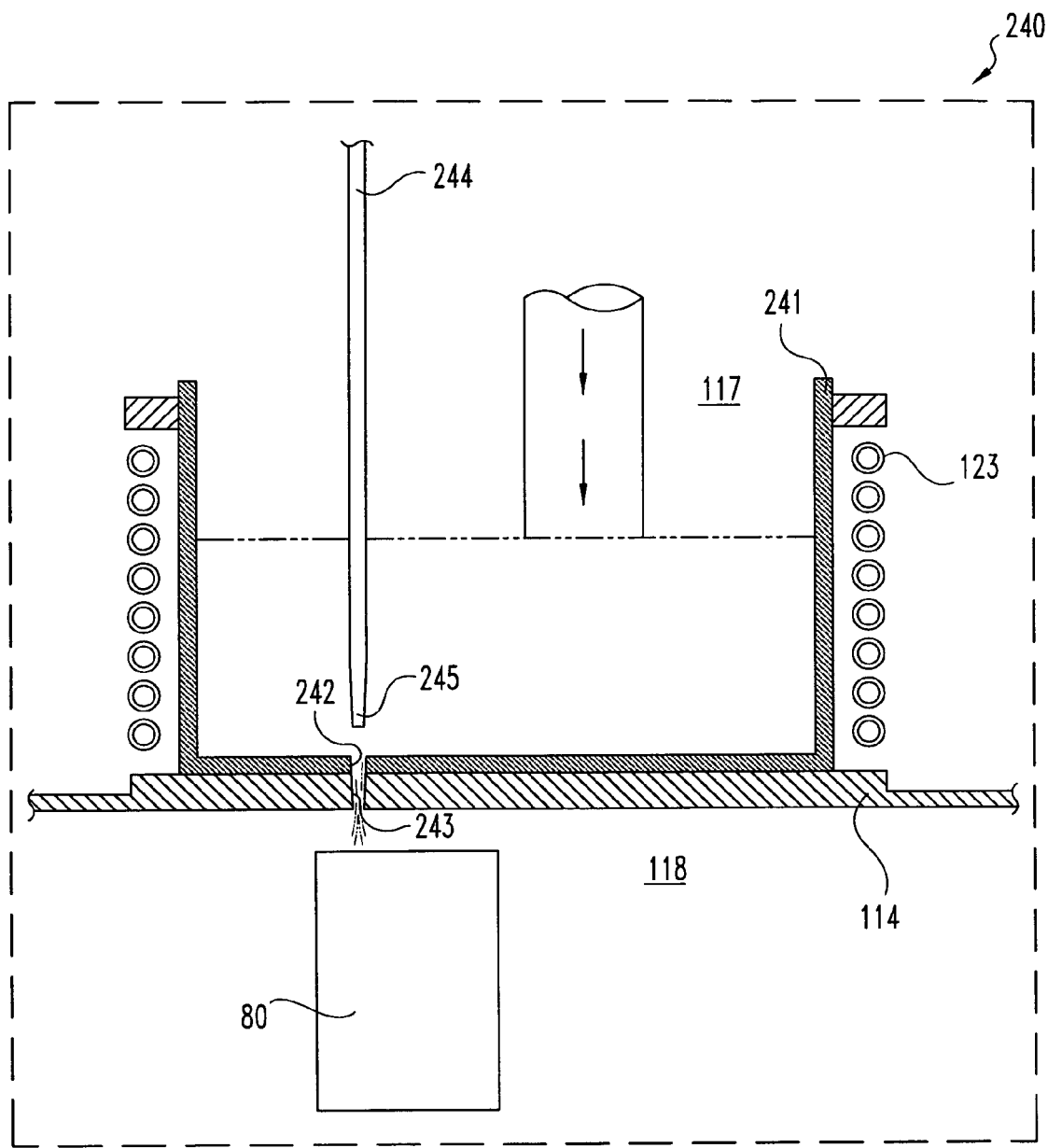
FIG. 51 is an illustrative sectional view of an alternate embodiment of the molten metal delivery system located within a casting apparatus.

With reference to FIG. 51, there is illustrated an alternate embodiment 240 of the molten metal dispensing system for dispensing molten metal from a casting apparatus, such as casting apparatus 115. More particularly, the molten metal dispensing system 240 is located within the upper chamber 117 and the mold 80 is located within the lower chamber 118. Crucible 241 is substantially similar to the crucible 122 and is heated by the heater 123 to melt the metal material stock. A crucible discharge aperture 242 is formed in the crucible and aligned with a passageway 243 through the wall member 114. A stopper rod 244 is disposed within the upper chamber 117 and moveable between a position wherein a sealing surface 245 engages the wall of the crucible around aperture 242 to prevent the passage of molten metal therethrough, and another position wherein the sealing surface 245 is removed from the abutting relationship with the walls around the aperture 242. Gravitational forces will allow the passage of the molten metal into the mold 80 upon the removal of the stopper rod sealing surface 245 from it's sealing position.

Figure 52:
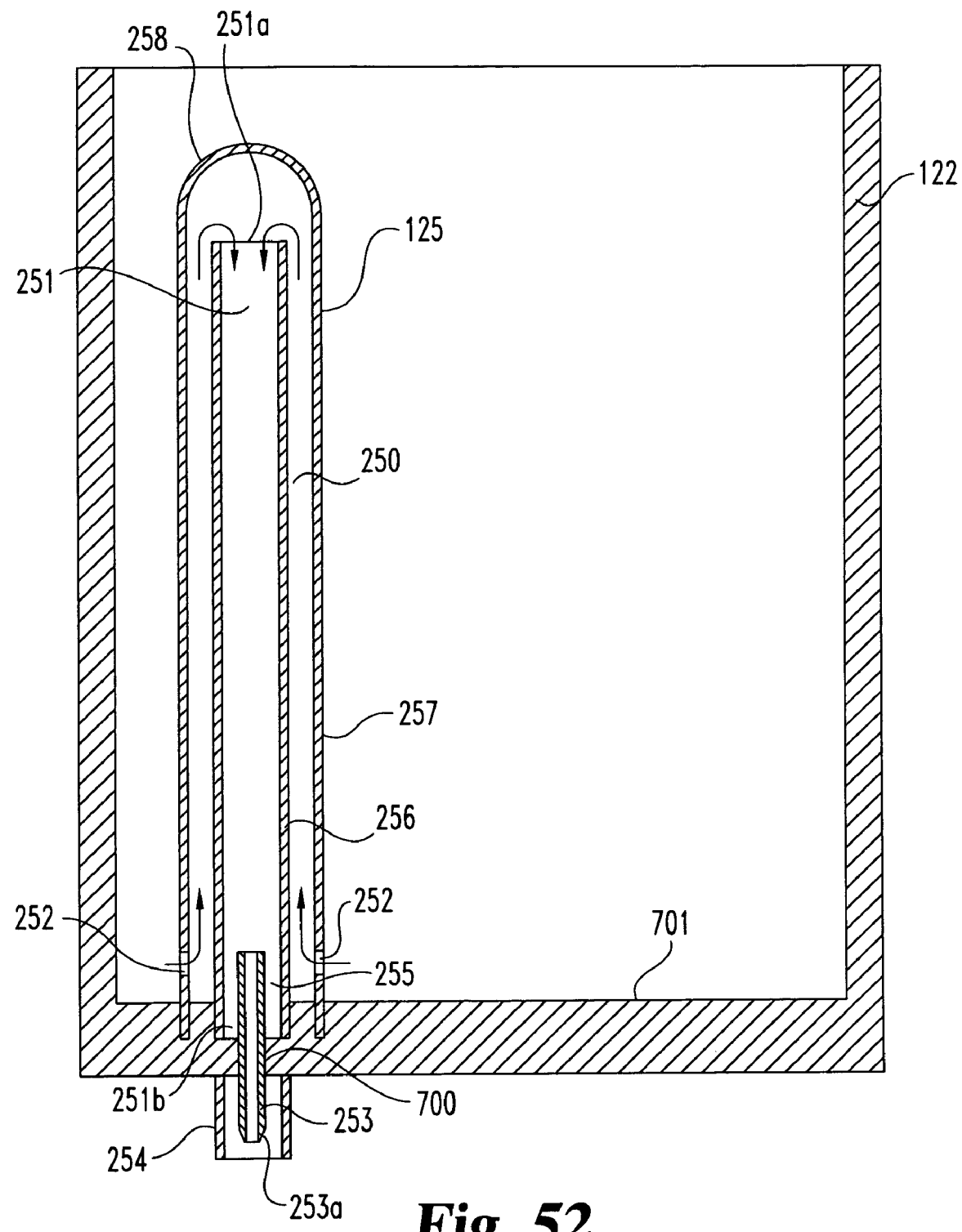
FIG. 52 is an enlarged view of the molten metal delivery system of FIG. 33.

With reference to FIG. 52, there is illustrated an enlarged view of the crucible 122 with the molten metal dispensing system 125 located therein. The crucible 122 having an aperture 700. The molten metal dispensing system 125 includes an outer passageway 250 and an inner passageway 251 that are in fluid communication with each other and the crucible 122. A plurality of filling apertures 252 allow the molten metal within the crucible 122 to flow into the outer passageway 250 of the system 125. Upon the outer passageway 250 being filled with molten metal, the molten metal can overflow into an inlet end 251a of the inner passageway 251. The inner passageway 251 has an outlet end 251b through which the molten metal flows to a nozzle 253. A portion 255 of the inner passageway 251 around the nozzle 253 allows the accumulation of molten metal which is used to maintain the temperature of the nozzle 253 close to that of the crucible of molten metal.

In one embodiment, a heat shield and/or heater 254 is spaced from and positioned around the nozzle 253 to mechanically guard the nozzle and reduce heat loss therefrom. The nozzle 253 passes through the aperture 700 in the crucible and has a discharge aperture designed to provide a concentrated stream of molten metal. In one form the stream of molten metal is discharged substantially vertical, however in alternate embodiments the stream is discharged in other relative directions. In one embodiment the discharge aperture has a diameter of about 0.125 inches, however, other sizes are contemplated herein. Further, the nozzle is self cleaning in that it purges itself every time the discharge of molten metal is completed. More specifically, in one embodiment the nozzle 253 has a pointed end 253a.

The structure of the molten metal dispensing system 125 preferably includes an outer member 257 having the plurality of inlet fill holes 252 formed therethrough with an inner member 256 spaced therefrom. The inner member 256 and the outer member 257 are preferably formed of alumina or other suitable ceramics, and the outer member includes four equally spaced inlet fill holes 252, however other numbers and spacing of inlet holes is contemplated herein. The inner and outer members being coupled to the base of the crucible 122. More preferably, the dispensing system 125 defines a first upstanding outer tube 257 that is closed at one end and a second upstanding inner tube 256 spaced inwardly therefrom. The inner tube 256 and outer tube 257 are coupled to the bottom wall member 701 of the crucible 122 and positioned around the aperture 700. In a preferred embodiment the inner tube 256 defines a metering cavity for holding a predetermined volume of molten metal therein.

Figure 52A:
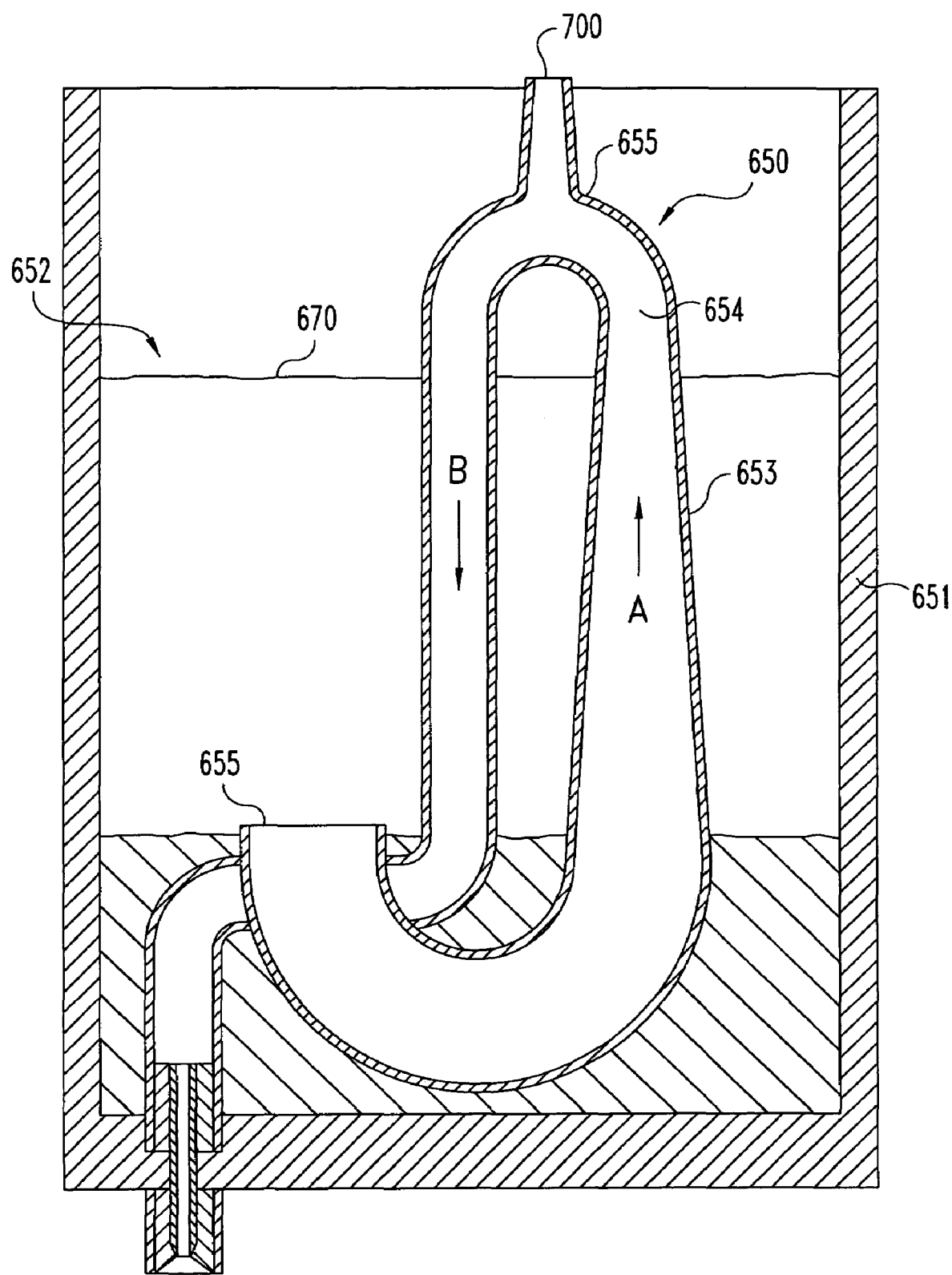
FIG. 52a is an illustrative view of an alternate embodiment of a molten metal delivery system.
Figure 53A:
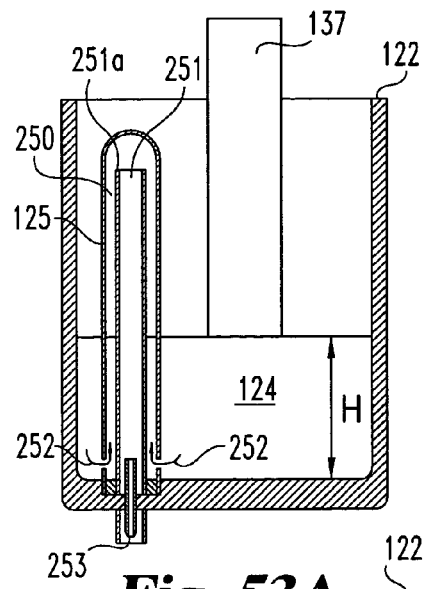
FIG. 53A is an illustration of the molten metal delivery system of FIG. 52 in a first stage.
Figure 53B:
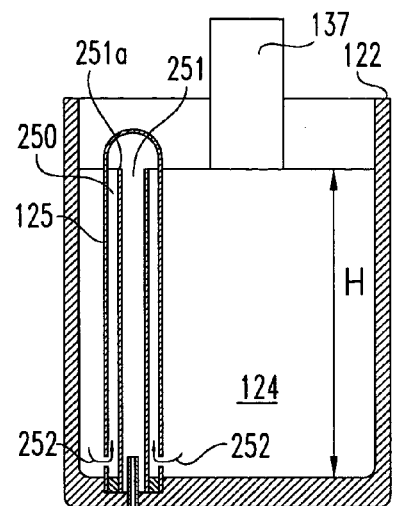
FIG. 53B is an illustration of the molten metal delivery system of FIG. 52 in a second stage.
Figure 53C:
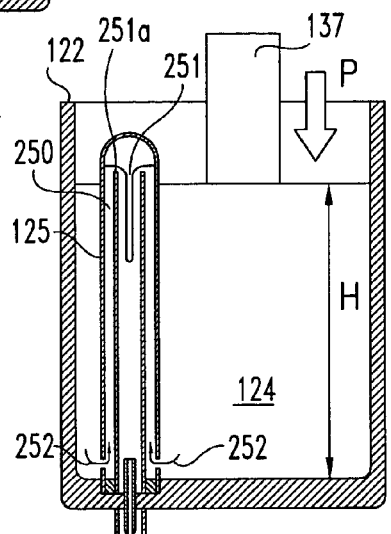
FIG. 53C is an illustration of the molten metal delivery system of FIG. 52 in a third stage.
Figure 53D:
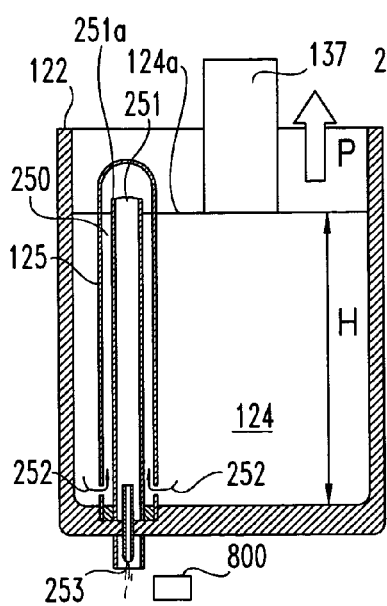
FIG. 53D is an illustration of the molten metal delivery system of FIG. 52 in a fourth stage.
Figure 53E:
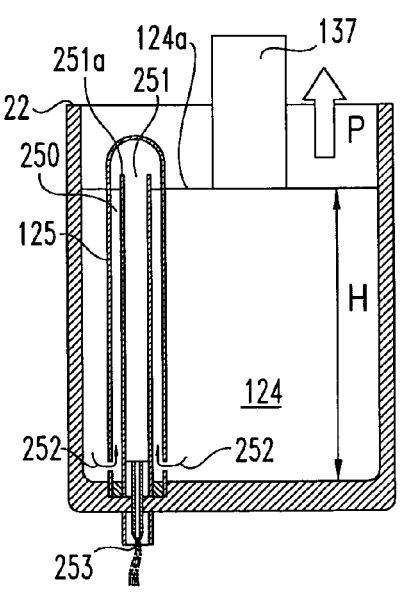
FIG. 53E is an illustration of the molten metal delivery system of FIG. 52 in a fifth stage.

With reference to FIG. 52a, there is illustrated an alternate embodiment of the molten metal dispensing system. The molten metal dispensing system 650 is positioned within a mechanical housing/crucible 651. The mechanical housing has an interior volume 652 adapted to receive molten metal therein. The molten metal dispensing system includes a member 653 having a passageway 654 formed therein. At one end of the passageway 654 is a molten metal inlet 655 and at the other end is a molten metal outlet. In an alternate embodiment only a portion of the molten metal dispensing system is located within the interior volume where molten metal is located. An inflection portion 655 is defined within the passageway 654. The molten metal enters the passageway 654 and flows through the passageway to the height of the molten metal within the housing 651. Upon the application of a pressure to the molten metal within the mechanical housing the molten metal is driven to the inflection portion 655, and continues through the passageway 654 to the molten metal outlet and is discharged. In one form the molten metal flows in a first direction indicated by arrow A to the inflection portion 655 and from the inflection portion 655 in a second direction as indicated by arrow B. The molten metal inlet 655 is located beneath the surface 670 of the molten metal within the interior volume. In one embodiment the molten metal dispensing system is integrally formed.

In a preferred form of the molten metal dispensing system 650 the passageways have substantially upstanding portions that meet with the inflection portion to form a substantially U shape passageway. Further, it is preferred that the inflection portion is above the molten metal height within the mechanical housing/crucible 651. In one form a portion of the passageway varies in cross-sectional area between the molten metal inlet and the molten metal outlet. In a more preferred form at least a portion of the passageway tapers prior to the inflection portion, and more preferably defines a passageway having a frustum-conical shape. In one embodiment the passageway 654 has a vent 700 disposed in fluid communication therewith. However in an alternate embodiment the passageway does not have the vent 700 connected therewith. The vent has utilization for venting the passageway and allowing the purging of the passageway with a pressurized fluid. The present invention contemplates other geometric shapes and sizes for the components of the molten metal dispensing system.

With reference to FIGS. 53A-53E, there is illustrated the process of dispensing molten metal from one embodiment of the molten metal dispensing system 125. As the unmelted metal material 137 is advanced into the crucible 122 the material is melted and forms a quantity of molten metal 124. The molten metal 124 flows through the plurality of filling apertures 252 into the outer passageway 250 of the system 125. The continued advancement of the unmelted metal stock 137 into the crucible and the subsequent melting thereof raises the height H of the molten metal within the crucible 122 to the height of the inlet end 251a of the inner passageway 251. In order to fill the inner passageway/metering chamber 251 with molten metal it is necessary to apply an additional force to the molten metal 124 within the chamber.

The additional force can be applied by the continued advancement of the unmelted metal material 137 into the quantity of melted metal within the crucible. A second method for increasing the pressure on the molten metal 124 within the crucible is to introduce a pressurized inert gas against the surface of the molten alloy. The additional pressure on the molten metal will cause the continued flow of molten metal through the filling apertures 252. Subsequent overflowing of the molten metal from the outer passageway 250 to the inlet end 251a of the inner passageway. The filling of the inner passageway is a relatively quick process as the filling apertures 252 have been sized to allow an inflow of material that is significantly greater than the nozzle 253 can discharge from the inner passageway. Upon the inner passageway 251 being substantially filled with molten metal, the pressure applied to the surface 124a is removed such that the inner passageway 251 no longer receives molten metal from the outer passageway 250 and the inner passageway discharges its charge of molten metal through the nozzle 253 in a concentrated stream.

In one embodiment of the molten metal dispensing system, a sensor 800 (FIG. 53D) is positioned proximate the nozzle 253 to detect the initial flow of molten metal from the nozzle. Upon the detection of the initial flow of molten metal from the nozzle 253, the sensor will send a signal to have the additional pressure removed from the surface 124a of the molten metal. In one embodiment the signal is sent to a controller that controls the application of pressure to the molten metal. The early indication of a slight molten metal discharge from the nozzle 253 is substantially contemporaneous with the completion of filling of the inner passageway 251 due to the difference in the total size of the filling apertures 252 and the nozzle aperture. In one embodiment, the material inflow through filing apertures 252 is significantly greater than the material outflow through the nozzle aperture.

Figure 54:
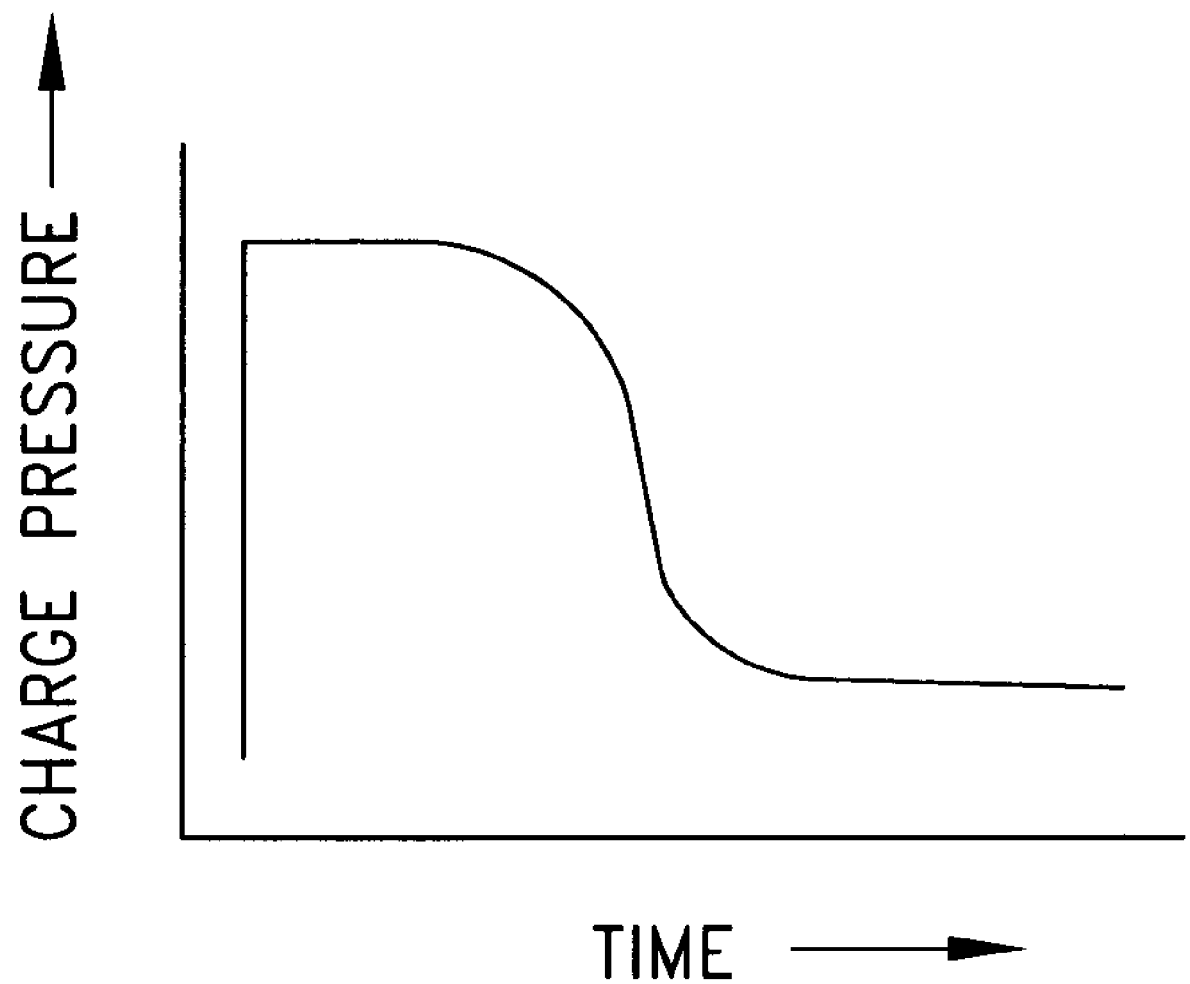
FIG. 54 is a graphic illustration of the process of varying charge pressure with time.

With reference to FIG. 54, there is an illustration of the pressure of the molten metal as a function of time. In one embodiment illustrated in FIG. 36 the nozzle 253 is coupled in fluid communication to the inlet 78 of the fill tube 52. Flow of molten metal can then be initiated by either increasing the pressure in chamber 117 or reducing the pressure in chamber 118. The reduction in pressure in 118 can function to: vacuum the internal mold cavity and thereby remove loose material like residual powder; and/or reduce the mold gases level to protect reactive elements like aluminum, titanium, and halfnium. Further, the increase in pressure in chamber 117 would aid in the fill of details in the mold cavity. The higher pressures within chamber 117 can be used to suppress reactions among many materials as well as reduce shrinkage from solidification.

Figure 55:
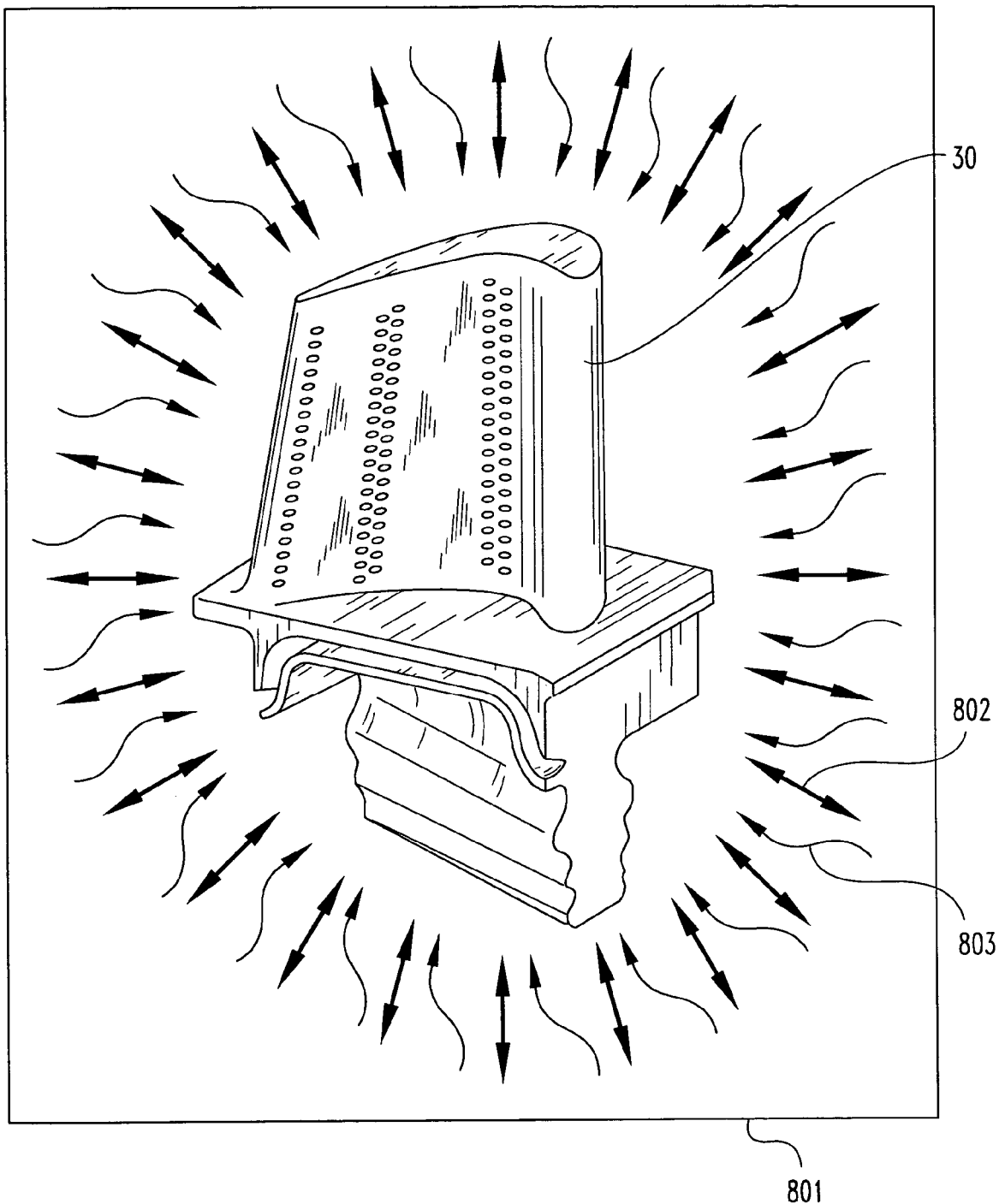
FIG. 55 is an illustrative view of the gas turbine engine blade of FIG. 2 within a pressure and temperature environment.

With reference to FIG. 55, there is illustrated a gas turbine engine blade 30 positioned within furnace 801 for having post casting operations performed thereon. The post casting processing operations for a single crystal and/or columnar grain casting include: a hot isostatic pressing operation; a homogenizing operation; and, a quench operation. The hot isostatic pressing operation involves placing the component 30 within the furnace 801 and subjecting the component to high temperature and pressure so as to remove porosity from the cast structure. In one embodiment, the hot isostatic processing taking place at a temperature of about 2375 to 2400 degrees Fahrenheit and at a pressure of about 30,000 lbs. per square inch. The pressure is preferably supplied by an inert gas, such as argon. With reference to FIG. 55, the pressure is indicated by arrows 802 and the temperature is indicated by arrows 803.

Subsequent to the hot isostatic pressing operation, the component is subjected to a homogenizing operation that causes diffusion between the elements that may have separated during the solidification process and is designed to raise the incipient melting point of the cast structure. The homogenizing cycle is concluded by subjecting the component to a quenching step and subsequent tempering operations.

In one embodiment of the present invention, the three post casting operations are combined into a sequential process within the furnace 801. The hot isostatic pressing operation is performed within the furnace 801 by raising the temperature and pressure within the furnace 801 for a period of time so as to reduce the porosity in the casting. Thereafter, the temperature within the furnace 801 is raised to a value within about 25 degrees Fahrenheit of the incipient melting point of the material forming the component 30. Preferably the temperature within the furnace 801 is raised to within 5° Fahrenheit of the melting point of the material for a period of time. After the completion of the homogenizing operation, the quenching operation is undertaken by the high pressure transfer of a cold inert gas into the furnace 801. The aging of the cast component can continue under vacuum or pressure as desired.

A preferred form of the casting operation allows the growth of a single crystal at a rate up to about 100 inches per hour and more preferably at a rate of about 60 inches per hour. However, other growth rates are contemplated herein. The ability to grow the crystal at these rates minimizes the segregation of elements in the alloy that occur during slower solidification processes. Due to the decrease in segregation of the elements in the alloy, the homogenizing cycle of the post casting operation can be accomplished in about 24 hours, and more preferably is accomplished in about 2 hours. The utilization of a high thermal gradient and a relatively short starter seed lead to faster processing; lower shrinkage, which gives improved fatigue properties; and lower segregation, which facilitates higher stress rupture strength.

Figure 56:
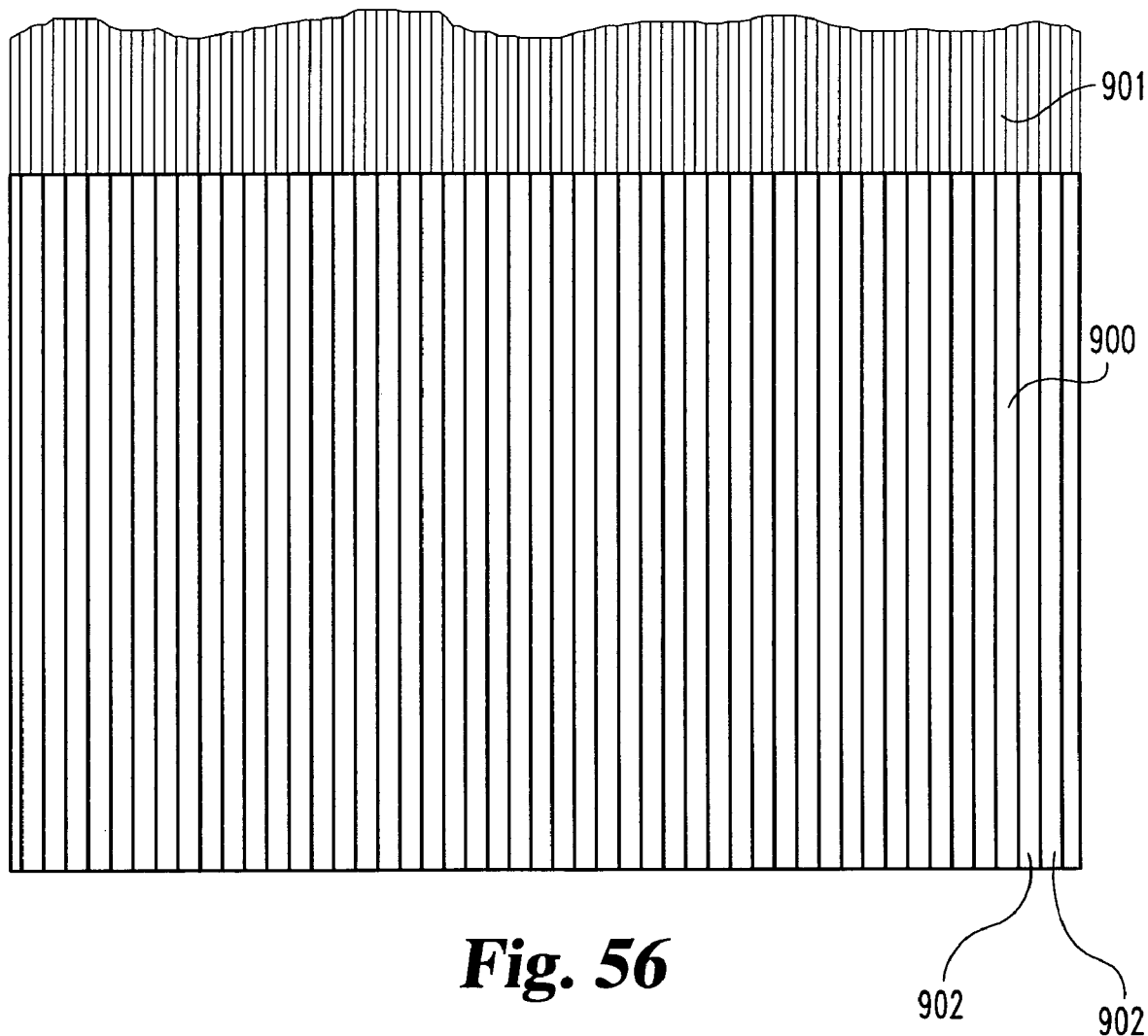
FIG. 56 is an illustrative view of a directionally solidified starter crystal with a molten metal solidifying thereon to form a directional solidified multi-crystal product.

With reference to FIG. 56, there is illustrated a metallic columnar grain starter seed 900. The starter seed 900 is designed to grow a directionally solidified columnar grain component 901. The starter seed 900 has very fine grains 902 that are desired to be replicated in the cast component. This strictly oriented crystallographic structure of the metallic starter seed 900 is used to impart this structure to the cast component.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. An apparatus for pouring a molten metal, comprising:
   a crucible having a bottom wall member with an aperture formed therethrough;
   an upstanding first tube positioned within said crucible and having a first end located around said aperture and coupled to said bottom wall member and another second end that is closed, said first tube having at least one entrance for allowing the passage of molten metal from said crucible to said first tube;
   an upstanding second tube located within said first tube and having one end coupled to said bottom wall member and in fluid communication with said aperture and another end defining an inlet from said first tube, said second tube has a first cavity adapted for receiving a volume of molten metal therein; and
   a passageway extending along said second tube for the passage of the molten metal from said at least one entrance to said inlet.

2. The apparatus of claim 1, which further includes a nozzle in fluid communication with said aperture, said nozzle adapted to deliver a substantially vertical stream of molten metal.

3. The apparatus of claim 1:
   which further includes a nozzle coupled with said aperture and in fluid communication with said first cavity of the second tube, said nozzle has an inlet adapted to receive molten metal and an outlet adapted to discharge molten metal; and
   which further includes a mechanical housing having a first chamber at a first pressure and a second chamber at a second pressure, and wherein said crucible is located within said first chamber and said outlet of the nozzle is located within said second chamber.

4. The apparatus of claim 3, which further includes pressure differential means for creating a pressure differential between said first chamber and said second chamber, wherein upon said pressure differential means causing said first pressure to be greater than said second pressure the molten metal within said crucible flows through said at least one entrance and into said passageway along said second tube.

5. The apparatus of claim 4, wherein said pressure differential means includes a supply of pressurized gas in fluid communication with said first chamber, and wherein said supply of pressurized gas is controlled to increase said first pressure in said first chamber.

6. The apparatus of claim 4, wherein said pressure differential means includes a quantity of unmelted metal stock extending into said first chamber, and wherein said unmelted metal stock is advanced into the molten metal within said crucible to increase said first pressure.

7. The apparatus of claim 4, wherein said pressure differential means includes a vacuum in fluid communication with said second chamber, said vacuum being operable to reduce said second pressure.

8. The apparatus of claim 3, wherein a difference in size between said outlet and said at least one entrance allows the volumetric flow rate of molten metal through said at least one entrance to be substantially greater than the volumetric flow rate of molten metal through said outlet.

9. The apparatus of claim 8, wherein said at least one entrance defines a plurality of entrances.

10. The apparatus of claim 3, wherein said nozzle has an upstanding portion that extends into said second tube, and wherein a second cavity is defined between said second tube and said upstanding portion of said nozzle, wherein said second cavity is adapted to receive molten metal and heat said upstanding portion of said nozzle.

11. The apparatus of claim 1, wherein said first cavity defines a metering cavity holding a predetermined volume of molten metal.

12. The apparatus of claim 4, which further includes a sensor positioned proximate said outlet, said sensor detects an initial flow of molten metal from said outlet and communicates with said pressure differential means to stop creating a pressure differential between said first chamber and said second chamber.

13. The apparatus of claim of claim 3, wherein said nozzle and said first tube and said second tube are parallel to one another, and wherein said at least one entrance is located adjacent said first end of the first tube.

14. An apparatus, comprising:
a mechanical housing;
a crucible adapted to receive a metal material therein, said crucible positioned within said housing;
a heater positioned adjacent said crucible for heating the crucible and melting the metal received within said crucible; and
a pressure controlled precision pour assembly positioned within said crucible, said pour assembly has an outer cavity with at least one entrance for the passage of melted metal material from said crucible to said outer cavity and an exit for the passage of melted metal material to an inner metering cavity, and wherein said pour assembly has a first state wherein said inner metering cavity receives melted metal material from said outer cavity until said inner metering cavity is full and a second state wherein the flow of melted metal material to said inner cavity is stopped and the melted metal material within said inner metering cavity is discharged.

15. The apparatus of claim 14, wherein said crucible includes a discharge opening, and wherein in said second state the melted metal material within said inner metering cavity flows through said discharge opening.

16. The apparatus of claim 15, which further includes a nozzle coupled to said crucible and in fluid communication with said discharge opening.

17. The apparatus of claim 16:
wherein said mechanical housing has a first chamber and a second chamber, and wherein said crucible is located within said first chamber; and
said second state discharges molten metal when the pressure in said second chamber is greater than the pressure within said first chamber.

18. The apparatus of claim 16:
wherein said crucible has a bottom wall member, and wherein said discharge opening is formed in said bottom wall member;
wherein said pressure controlled precision pour assembly includes an outer upstanding tube coupled to said bottom wall member and positioned around said discharge opening;
wherein said pressure controlled precision pour assembly includes an inner upstanding tube coupled to said bottom wall member and positioned around said discharge opening,
wherein said inner upstanding tube is positioned within said outer upstanding tube, and said outer cavity is located between said tubes, and wherein said inner metering cavity is positioned within said inner tube.

19. The apparatus of 18, wherein a difference in area between said nozzle outlet and said at least one entrance allows the volumetric flow rate of molten metal through said at least one entrance to be substantially greater than the volumetric flow rate of molten metal through said outlet.

20. An apparatus for dispensing a molten metal, comprising:
a mechanical housing having a first chamber with a first pressure and a second chamber with a second pressure;
a crucible positioned within said first chamber of the mechanical housing and adapted to receive a stock of unmelted metal material therein;
a heater positioned adjacent said crucible and adapted for heating the crucible and at least a portion of the unmelted metal material therein to a molten metal state, wherein said crucible holds the volume of molten metal melted by the heater therein;
a tube having a first end and a second end with a flow communication passageway therebetween, said first end positioned beneath a surface of the volume of molten metal within said crucible and a second end positioned in fluid communication with said second chamber and defining a discharge aperture; and
a pressure differential device within said first chamber and acting on the volume of molten metal to increase the pressure thereof and cause molten metal to flow through said passageway and out of said second end, said pressure differential device is defined by at least a portion of the unmelted metal material.

21. The apparatus of claim 20, wherein said pressure differential device defines a consumable member that is replenished by additional unmelted metal material.

22. The apparatus of claim 21, wherein said first chamber has an aperture therein adapted for the passage of the stock of unmelted metal material, and a substantially fluid tight seal is formed around the stock.

23. An apparatus for pouring a molten metal, comprising:
a mechanical housing with a bottom wall member and an interior volume adapted to hold a molten metal; and
a molten metal delivery member having a first molten metal inlet end adapted to receive molten metal from below the surface of the molten metal within the interior volume and a second molten metal outlet end with a passageway therebetween, at least a portion of said delivery member positioned within said mechanical housing, said passageway has a first passageway portion and a second passageway portion and a inflection portion wherein the direction of molten metal flow changes, in a first discharge mode a first direction of molten metal flow within said first passageway portion is from said molten metal inlet to said inflection portion and from said inflection portion through said second passageway portion in a second direction to said outlet.

24. The apparatus of claim 23, wherein said first passageway portion and said second passageway portion and said inflection portion define a substantially U shape.

25. The apparatus of claim 23, wherein said inflection portion is above the surface of the molten metal within said interior volume.

26. The apparatus of claim 25, wherein the pressure of the molten metal within the inflection portion is greater than the pressure at either of said molten metal inlet or said molten metal outlet.

27. The apparatus of claim 26, wherein said molten metal delivery member is integrally formed.

28. The apparatus of claim 23, wherein said second passageway portion defines a metering cavity.

29. The apparatus of claim 23 wherein the cross-sectional area of said passageway varies between said first inlet end and said second outlet end.

30. The apparatus of claim 29, wherein said first passageway portion tapers prior to said inflection portion.

31. The apparatus of claim 29, wherein said first passageway has a substantially frustum-conical shape part prior to said inflection portion.

* * * * *